(12) United States Patent
Hasebe et al.

(10) Patent No.: US 9,230,938 B2
(45) Date of Patent: Jan. 5, 2016

(54) METHOD OF MANUFACTURING SEMICONDUCTOR DEVICE

(71) Applicant: Renesas Electronics Corporation, Kawasaki-shi, Kanagawa (JP)

(72) Inventors: Akio Hasebe, Kanagawa (JP); Naohiro Makihira, Kanagawa (JP); Bunji Yasumura, Kanagawa (JP); Mitsuyuki Kubo, Kanagawa (JP); Fumikazu Takei, Kanagawa (JP); Yoshinori Deguchi, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/583,693

(22) Filed: Dec. 27, 2014

(65) Prior Publication Data

US 2015/0111317 A1    Apr. 23, 2015

Related U.S. Application Data

(63) Continuation of application No. 14/133,614, filed on Dec. 18, 2013, now Pat. No. 8,945,953.

(30) Foreign Application Priority Data

Dec. 21, 2012    (JP) .................................. 2012-279253

(51) Int. Cl.
  *H01L 21/66* (2006.01)
  *H01L 23/00* (2006.01)
  (Continued)

(52) U.S. Cl.
  CPC ............ *H01L 24/89* (2013.01); *H01L 21/6835* (2013.01); *H01L 21/6836* (2013.01); *H01L 21/76898* (2013.01); *H01L 21/78* (2013.01); *H01L 22/14* (2013.01); *H01L 23/481* (2013.01); *H01L 23/5226* (2013.01);
  (Continued)

(58) Field of Classification Search
  CPC ....... H01L 22/10; H01L 22/14; H01L 23/481; H01L 23/49816; H01L 25/0657
  USPC ........... 438/11, 14, 15, 17, 18, 458, 459, 460, 438/464
  See application file for complete search history.

(56) References Cited

U.S. PATENT DOCUMENTS 6,762,117 B2    7/2004   Lam et al.
7,425,767 B2    9/2008   Lin
(Continued)

FOREIGN PATENT DOCUMENTS

JP    01-207671 A    8/1989
JP    02-010168 A    1/1990
(Continued)

*Primary Examiner* — Kevin M Picardat
(74) *Attorney, Agent, or Firm* — Miles & Stockbridge P.C.

(57) ABSTRACT

Provided is a method of manufacturing a semiconductor device including a step of testing every one of through-electrodes. A second probe test is conducted to check an electrical coupling state between a plurality of copper post bumps formed on the side of the surface of a wafer and electrically coupled to a metal layer and a plurality of bumps formed on the side of the back surface of the wafer and electrically coupled to the metal layer (also another metal layer) via a plurality of through-electrodes by probing to each of the bumps on the side of the back surface while short-circuiting between the copper post bumps (electrodes). By this test, conduction between the bumps (electrodes) on the back surface side is checked.

10 Claims, 41 Drawing Sheets

(51) Int. Cl.
*H01L 25/065* (2006.01)
*H01L 23/48* (2006.01)
*H01L 23/522* (2006.01)
*H01L 21/683* (2006.01)
*H01L 21/768* (2006.01)
*H01L 21/78* (2006.01)
H01L 25/18 (2006.01)
H01L 23/498 (2006.01)
H01L 23/50 (2006.01)

(52) U.S. Cl.
CPC .......... *H01L 24/09* (2013.01); *H01L 25/0657* (2013.01); *H01L 23/49816* (2013.01); *H01L 23/50* (2013.01); *H01L 24/05* (2013.01); *H01L 24/11* (2013.01); *H01L 24/13* (2013.01); *H01L 24/16* (2013.01); *H01L 24/17* (2013.01); *H01L 24/81* (2013.01); *H01L 25/18* (2013.01); *H01L 2221/6834* (2013.01); *H01L 2221/68327* (2013.01); *H01L 2221/68368* (2013.01); *H01L 2224/0401* (2013.01); *H01L 2224/05025* (2013.01); *H01L 2224/05568* (2013.01); *H01L 2224/05624* (2013.01); *H01L 2224/08235* (2013.01); *H01L 2224/1146* (2013.01); *H01L 2224/131* (2013.01); *H01L 2224/13023* (2013.01); *H01L 2224/13025* (2013.01); *H01L 2224/13144* (2013.01); *H01L 2224/13147* (2013.01); *H01L 2224/16146* (2013.01); *H01L 2224/16148* (2013.01); *H01L 2224/16227* (2013.01); *H01L 2224/17181* (2013.01); *H01L 2224/73204* (2013.01); *H01L 2224/8036* (2013.01); *H01L 2224/8085* (2013.01); *H01L 2224/81801* (2013.01); *H01L 2225/06513* (2013.01); *H01L 2225/06517* (2013.01); *H01L 2225/06541* (2013.01); *H01L 2924/15311* (2013.01)

(56) References Cited

U.S. PATENT DOCUMENTS

| | | | |
|---|---|---|---|
| 7,534,629 | B2 | 5/2009 | Shoji et al. |
| 8,558,391 | B2 | 10/2013 | Koide et al. |
| 8,945,953 | B2 * | 2/2015 | Hasebe .................. H01L 22/14 438/15 |

FOREIGN PATENT DOCUMENTS

| | | |
|---|---|---|
| JP | 05-206383 A | 8/1993 |
| JP | 2004-053292 A | 2/2004 |

* cited by examiner

S148
TAPE ATTACHMENT (cont.)

S149
BG TAPE DETACHMENT (cont.)

(cont.)

METHOD OF MANUFACTURING SEMICONDUCTOR DEVICE

CROSS-REFERENCE TO RELATED APPLICATIONS

The disclosure of Japanese Patent Application No. 2012-279253 filed on Dec. 21, 2012 including the specification, drawings and abstract is incorporated herein by reference in its entirety.

BACKGROUND

The present invention relates to a manufacturing technology of a semiconductor device, for example, technology effective when applied to a semiconductor device having a semiconductor chip with a through-electrode.

There is disclosed, for example, in Japanese Patent Laid-Open No. 2004-53292 (Patent Document 1) a method of making a conduction test of an interposer substrate by forming, on the same surface of an insulating base material, an electrode to be coupled to the substrate and a common measuring electrode and making a test on the same surface.

There is also disclosed, for example, in Japanese Patent Laid-Open No. Hei 2(1990)-10168 (Patent Document 2) a method of making a coupling test of a print wiring board by bringing a test board having a number of pins provided thereon in a projecting manner into contact with the surface of the printed wiring board, selecting, from the pins inserted in corresponding through-hole vias of the printed wiring board, predetermined pins, and conducting a coupling test between the predetermined pins and a common electrode on the back surface of the printed circuit board.

There is further disclosed, for example, in Japanese Patent Laid-Open No. Hei 5(1993)-206383 a method of testing various electrical properties of a semiconductor wafer having thereon ICs in predetermined arrangement by forming an electrode pad at the periphery of the surface of the IC in a section surrounded with a dicing line and at the same time forming a test pad corresponding to the electrode pad in a region outside the above-mentioned section, and bringing a test pin into contact with the test pad.

There is further disclosed, for example, in Japanese Patent Laid-Open No. Hei 1(1989)-207671 (Patent Document 4) a technology of optically testing the conduction of a printed wiring board in a conduction test apparatus of a printed wiring board by applying a drive voltage between a measuring electrode at a position corresponding to a wiring pattern on the printed wiring board and a common transparent electrode and thereby causing an optical change in a voltage applied position of an electroptical indicator cell.

PRIOR ART DOCUMENTS

Patent Documents

[Patent Document 1] Japanese Patent Laid-Open No. 2004-53292
[Patent Document 2] Japanese Patent Laid-Open No. Hei 2(1990)-10168
[Patent Document 3] Japanese Patent Laid-Open No. Hei 5(1993-206383)
[Patent Document 4] Japanese Patent Laid-Open No. Hei 1(1989)-207671

SUMMARY

With the technology trend toward miniaturized and high-density packaging of semiconductor devices (semiconductor packages), development of three dimensional packaging technologies for obtaining a three-dimensional SIP (system in package) structure has been conducted briskly. Three-dimensional packaging technologies include a TSV (Through Silicon Via, which will hereinafter be also called "through-electrode") technology of making a through-hole in a chip in wafer form, filling the through-hole with a conductive member, and forming an electrode on the surface and back surface of the chip. The TSV technology is effective for stacking a number of chips by using a COC (chip on chip) technology.

For example, in an SIP structure obtained by stacking a memory chip on a logic chip having through-electrodes (TSV), the pad pitch of I/O of the memory chip is, for example, as narrow as Min 40 μm and the pitch between the through-electrodes of the logic chip corresponding thereto is an equal level.

In a test for detecting failures such as short-circuiting or disconnection in a through-electrode formation process, whether the through-electrodes thus formed are defective or non-defective is often determined by conducting probing to terminals provided on the surface and back surface of a logic chip. With a decrease in the thickness of semiconductor devices, the logic chip is very thin, for example, about 50 μm and in addition, through-electrodes are arranged with a narrow pitch as described above. It is therefore very difficult to conduct probing to terminals provided on the surface and back surface of the chip (logic chip) in consideration of the damage given to the chip at the time of probing or handling of the chip.

With regard to power source/GND pins (through-electrodes), two or more pins are often electrically coupled to each other inside a chip and in this case, it is difficult to determine whether defective or non-defective. This means that in an open/short test of power source/GND pins, even if power source pins are electrically coupled to each other or GND pins are electrically coupled to each other in the chip, defective pins (defective through-electrodes) cannot be identified because two or more pins are electrically coupled to each other.

An object of the embodiments disclosed herein is to provide a technology capable of testing all the pins (all the through-electrodes) definitely in the manufacture of a semiconductor device.

The other object and novel features will be apparent by the description herein and accompanying drawings.

The outline of a typical embodiment disclosed herein will next be described briefly.

A method of manufacturing a semiconductor device according to a typical embodiment includes a step of checking conduction between a plurality of first electrodes formed on the side of one of the surfaces of a semiconductor substrate and electrically coupled to a circuit layer and a plurality of second electrodes formed on the surface opposite to the surface of the first electrodes and electrically coupled to the circuit layer via a plurality of through-electrodes, while short-circuiting between the first electrodes.

An advantage available by the typical embodiment disclosed herein will next be described briefly.

In the manufacture of semiconductor devices, the invention makes it possible to test all the pins (all the through-electrodes).

DETAILED DESCRIPTION

In the below-described embodiments, a repeated description of the same or similar portions will be omitted in principle unless particularly necessary.

In the below-described embodiments, a description will be made after divided into a plurality of sections or embodiments if necessary for convenience sake. They are not independent from each other, but in a relation such that one is a modification example, detailed description, a complementary description, or the like of a part or whole of the other one unless otherwise particularly specified.

In the below-described embodiments, when a reference is made to the number of elements (including the number, value, amount, range, and the like), the number is not limited to a specific number but may be more than or less than the specific number, unless otherwise specifically indicated or principally apparent that the number is limited to the specific number.

Further, in the below-described embodiments, it is needless to say that the constituents (including constituent steps and the like) are not always essential unless otherwise specifically indicated or principally apparent that they are essential.

In the below-described embodiments, with regard to any constituents or the like, the term "made of A", "comprised of A", "has A", "contains A", or the like does not exclude constituents other than A unless otherwise specifically indicated that the constituting component is only A. Similarly, in the below-described embodiments, when a reference is made to the shape, positional relationship, or the like of the constituents, that substantially approximate or similar to it is also embraced unless otherwise specifically indicated or principally apparent that it is not. This also applies to the above-mentioned value, range, or the like.

The embodiments will next be described specifically based on drawings. In all the drawings for describing the embodiments, members having the same function will be identified by the same symbols and overlapping descriptions will be omitted. Even plan views may be sometimes hatched to facilitate understanding of them.

First Embodiment

Figure 1:
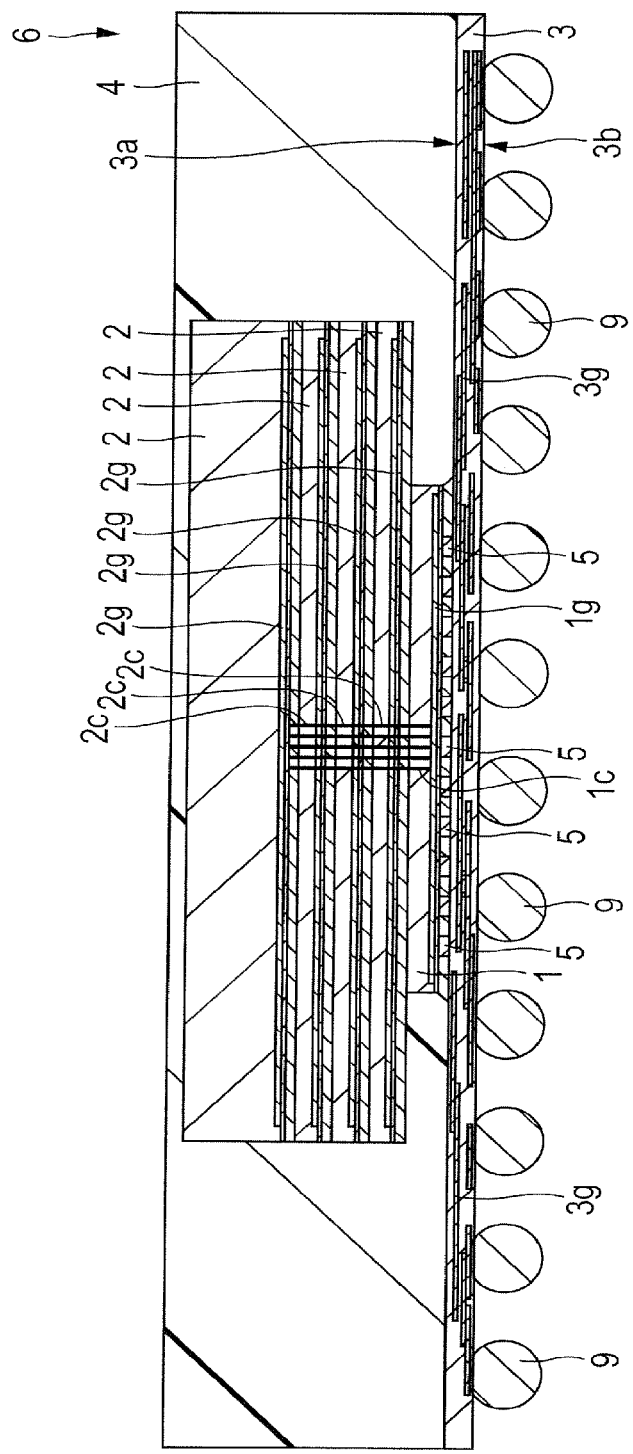
FIG. 1 is a cross-sectional view showing one example of the structure of a semiconductor device according to First Embodiment.
Figure 2:
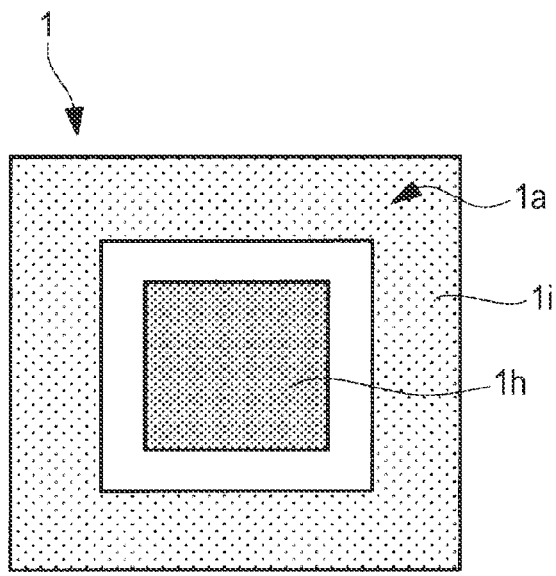
FIG. 2 is a plan view showing one example of an electrode area section of the element surface of a logic chip mounted on the semiconductor device of FIG. 1.
Figure 3:
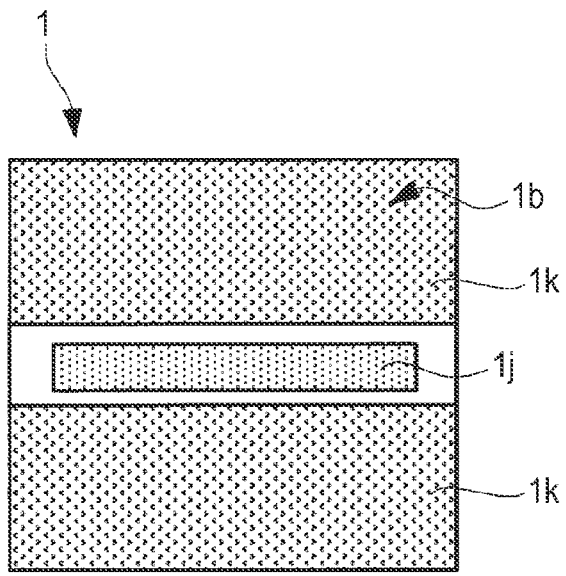
FIG. 3 is a back surface view showing one example of an electrode area section of the back surface of the logic chip shown in FIG. 2.
Figure 4:
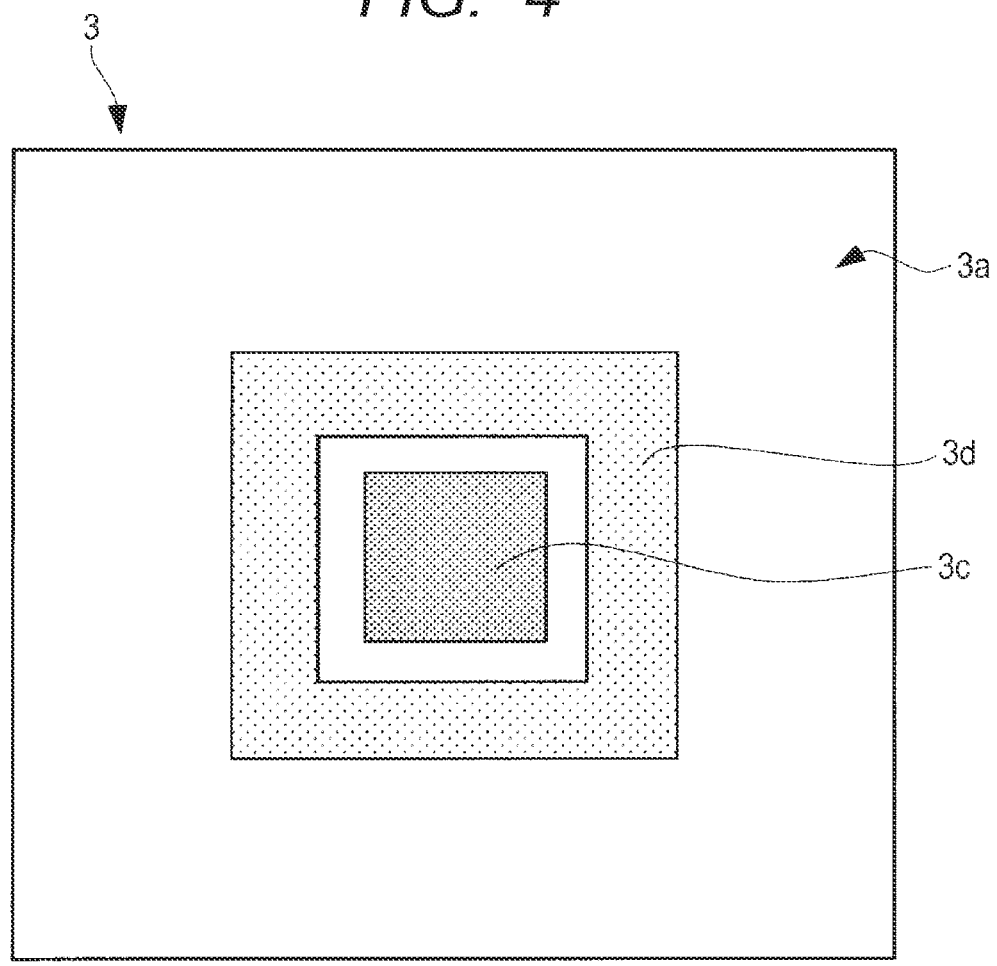
FIG. 4 is a plan view showing one example of an electrode area section of a chip mounted surface of a package substrate to be mounted on the semiconductor device shown in FIG. 1.
Figure 5:
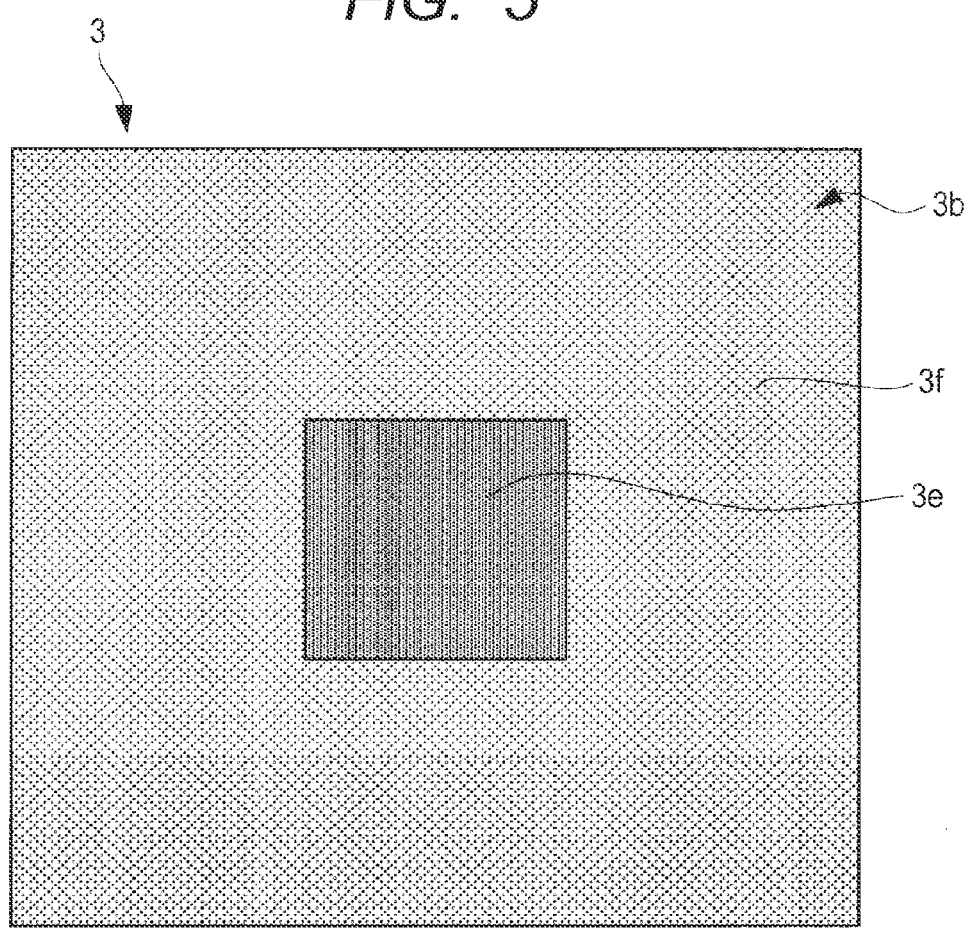
FIG. 5 is a back surface view showing one example of an electrode area section of a ball mounted surface of the package substrate shown in FIG. 4.

FIG. 1 is a cross-sectional view showing one example of the structure of a semiconductor device according to First Embodiment; FIG. 2 is a plan view showing one example of an electrode area section of the element surface of a logic chip to be mounted on the semiconductor device of FIG. 1; FIG. 3 is a back surface view showing one example of an electrode area section of the back surface of the logic chip shown in FIG. 2; FIG. 4 is a plan view showing one example of an electrode area section of a chip mounted surface of a package substrate to be mounted on the semiconductor device shown in FIG. 1; and FIG. 5 is a back surface view showing one example of an electrode area section of a ball mounted surface of the package substrate shown in FIG. 4.

The semiconductor device according to First Embodiment is, as shown in FIG. 1, a BGA (ball grid array) 6 having a package substrate 3 (wiring substrate) with wirings formed thereon. The package substrate 3 has, on the upper surface (surface, first main surface) 3a thereof, a stack of a plurality of semiconductor chips and, on the lower surface (back surface, second main surface) 3b, a plurality of ball electrodes 9 in lattice form which will serve as external coupling terminals. The ball electrodes 9 are solder balls.

Of the semiconductor chips stacked on the wiring substrate, the semiconductor chip placed at the bottom is a logic chip (semiconductor chip 1) and this logic chip 1 has thereon a stack of a plurality of memory chips (semiconductor chips 2). Here, a stack of four memory chips 2 is described as an example but the number of the memory chips 2 stacked is not limited to it. Sometimes, one memory chip 1 may be stacked over the logic chip 1. These memory chips 2 are each electrically coupled to the logic chip 1 and they are controlled by the logic chip 1. Thus, the BGA 6 has therein a logic chip 1 and two or more memory chips 2 so that it can be the so-called SIP (system in package) type semiconductor package.

The logic chip 1 placed at the bottom is flip chip packaged on the package substrate 3 via a plurality of copper (Cu) post bumps (first electrodes, copper pillar bumps, metal bumps, protruding electrodes made of a metal) 5 which are protruding electrodes. In other words, as shown in FIG. 20, the surface 1a of the logic chip 1 having thereon an element and also a plurality of copper post bumps 5 is placed so as to face to the upper surface (first main surface) 3a of the package substrate 3 and mounted on the upper surface 2a of the package substrate 3.

The logic chip 1 and some of the memory chips 2 stacked thereover have therein a plurality of through-electrodes (second electrodes) 1c and 2c. The through-electrodes 1c and 2c penetrate through a silicon base portion and at the same time, they are electrically coupled to electrodes formed on the surface and back surface of the chip.

Figure 20:
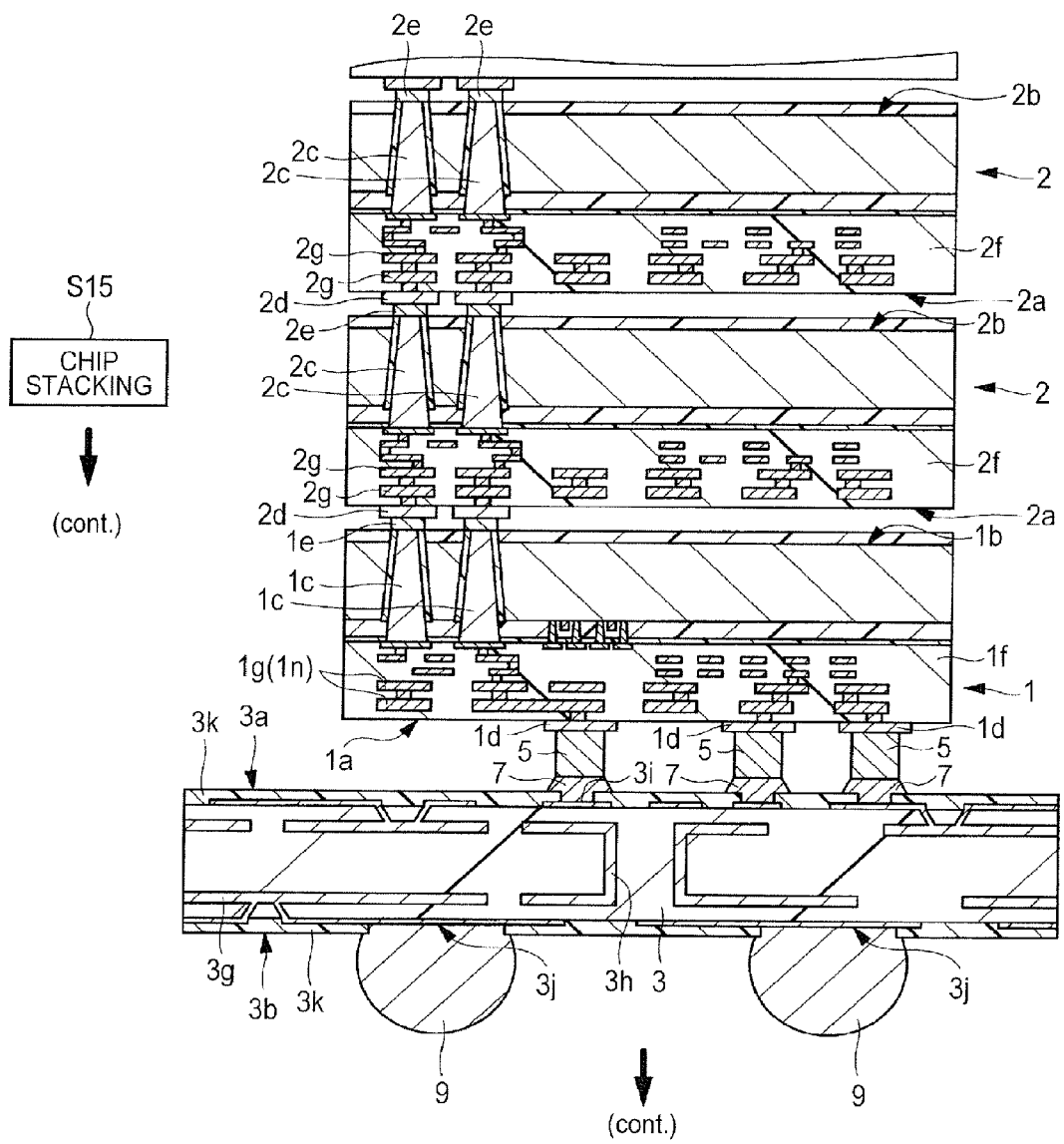
FIG. 20 is a partial cross-sectional view showing one example of the structure after chip stacking in the fabrication of the semiconductor device shown in FIG. 1.

Here, a description is made on FIG. 20. FIG. 20 is an enlarged cross-sectional view of a chip stacked portion of the semiconductor device shown in FIG. 1. As shown in FIG. 20, one of the ends of the through-electrode 1c of the logic chip 1 of the BGA 6 is, on the surface (element formation surface, lower surface) side of the logic chip 1, electrically coupled to one of the ends of a wiring portion 1g formed in an insulating layer of the surface layer. The other end of the wiring portion 1g is electrically coupled to a pad 1d formed on the surface of the logic chip 1. The pad 1d is electrically coupled to the copper post bump 5. The other end of the through-electrode 1c is electrically coupled to a bump 1e provided on the side of the back surface (upper surface) 1b, which is the side opposite to the surface of the logic chip 1. This means that the bump 1e provided on the back surface 1b of the logic chip 1 is electrically coupled to (through-electrode 1c)-(wiring portion 1g)-(pad 1d)-(copper post bump 5), extending from the back surface 1b to the surface 1a of the logic chip 1.

On the other hand, one of the ends of the through-electrode 2c in the memory chip 2 is, on the side of the surface (element formation surface, lower surface) of the memory chip 2, electrically coupled to one of the ends of a wiring portion 2g formed in an insulating layer 2f which is a surface layer. The other end of the wiring portion 2g is electrically coupled to a pad 2d formed on the surface 2a of the memory chip 2. The other end of the through-electrode 2c is electrically coupled to a bump 2e provided on the side of the back surface (upper surface) 2b opposite to the surface 2a of the memory chip 2. This means that the bump 2e provided on the back surface 2b of the memory chip 2 is electrically coupled to (through-electrode 2c)-(wiring portion 2g)-(pad 2d), extending from the back surface 2b to the surface 2a of the memory chip 2.

Further, as shown in FIG. 20, the bump 1e provided on the back surface 1b of the logic chip 1 is electrically coupled to a pad 2d provided on the surface 2a of the memory chip 2 so that the logic chip 1 and the memory chip 2 stacked on the back surface of the logic chip 1 are electrically coupled to each other. With regard to coupling between two-stage memory chips 2, that is, upper and lower ones, the bump 2e provided on the back surface 2b of the lower memory chip 2 is electrically coupled to the pad 2d provided on the surface 2a of the upper memory chip 2. The upper and lower memory chips 2 are therefore electrically coupled to each other.

It can be understood from the above description that the BGA 6 has such a structure that the through-electrode 1c of the logic chip 1 is connected straight to the through-electrode 2c of the memory chip 2, which has been stacked on the logic chip 1, in one-on-one relationship.

The BGA 6 makes use of this structure and supplies, via the logic chip 1, power supply/GND signals to the second or higher-level memory chips 2 from the package substrate 3 electrically coupled to the copper post bump 5 of the logic chip 1.

The wiring portion 1g of the insulating layer 1f which is the surface layer of the logic chip 1 includes a wiring branched from the side of the copper post bump 5 to the through-electrode 1c. This means that among the copper post bumps 5, there is a copper post bump 5 to be electrically coupled to two or more through-electrodes 1c.

As a result, the logic chip 1 has such a structure that compared with the number of the copper post bumps 5 on the side of the surface (lower surface) 1a, the number of the bumps 1e (terminals of the through-electrodes 1c) on the side of the back surface (upper surface) which is opposite to the surface is greater. Compared with the pitch (electrode pitch) between the copper post bumps 5, the pitch (electrode pitch) between the bumps 1e on the opposite side is therefore smaller. As one example, the pitch between the copper post bumps 5 is about 100 µm or less, while the pitch between the bumps 1e on the opposite side is about 40 µm or less. The electrode pitch between the copper post bumps 5 and the electrode pitch between the bumps 1e satisfy the following equation within the above-mentioned ranges: the former>the latter. In other words, the electrode pitch is smaller in a portion where chips are coupled to each other via the through-electrodes 1c and 2c than in a portion where the package substrate 3 and the logic chip are coupled via the copper post bumps 5. The number of the bumps 1e increases with an increase in the data bus width of the memory chip 2 from 512, 1024 to 2048 bits, which tends to narrow the pitch further.

Next, how to divide the electrode area of the surface and back surface of the logic chip 1 shown in FIGS. 2 and 3 will be described. As shown in FIG. 2, the logic chip 1 has, in the vicinity of the center portion on the surface (surface facing to the package substrate 3, the lower surface) 1a thereof, a copper post bump area 1h for memory chip. This copper post bump area 1h has, in the vicinity of the outside peripheral portion thereof, a copper post bump area 1i for logic chip.

On the other hand, as shown in FIG. 3, the logic chip 1 has, on the center of the back surface (surface facing to the memory chip 2, the upper surface) 1b thereof, an elongated bump area 1j for through-electrode. Further, this elongated bump area 1j has, on both sides thereof, bump area 1k for a through-electrode test.

The copper post bump 5 placed in the copper post bump area 1h in the vicinity of the center portion of the surface (lower surface) 1a of the logic chip 1 is electrically coupled to the through-electrode 1c shown in FIG. 1 which is placed so as to expose a portion of it from the elongated bump area 1j at the center of the back surface (upper surface) 1b.

Next, how to divide the electrode area of the upper and lower surfaces of the package substrate 3 shown in FIGS. 4 and 5 will be described. As shown in FIG. 4, the package substrate 3 has, at the center portion of the upper surface 3a thereof, a similar copper post bump area 3c corresponding to that of the lower surface of the logic chip 1 shown in FIG. 2 and further, this copper post bump area 3c has, on the outside thereof, a copper post pump area 3d corresponding to the copper post bump area 1i of the logic chip 1 shown in FIG. 2.

By the above-described structure, the package substrate 3 and the logic chip 1 are electrically coupled to each other via a plurality of the copper post bumps 5 provided in each area.

As shown in FIG. 5, on the other hand, the package substrate 3 has, in the vicinity of the center portion of the lower surface (second main surface) 3b thereof, a pad area 3e for memory chip test and the pad area has, outside thereof, a ball area 3f. The ball area 3f has a plurality of ball electrodes 9 as shown in FIG. 1 as external coupling terminals.

It is to be noted that as shown in FIG. 20, the package substrate 3 has, on the upper surface 3a thereof, a plurality of lands (first pad electrodes) 3i and a solder resist film (insulating film) 3k covering the outer peripheral portion of these lands 3i. The copper post bump 5 is electrically coupled to an exposed portion of each of the islands 3i, for example, via a solder 7 which is a conductive material.

On the other hand, the package substrate 3 has, on the lower surface 3b thereof, a plurality of lands (second pad electrodes) 3j and a solder resist film (insulating film) 3k covering the outer peripheral portion of these lands 3j. The ball electrode 9 serving as an external coupling terminal is electrically coupled to an exposed portion of each of the lands 3j.

The lands 3i on the upper surface 3a of the package substrate 3 and the lands 3j on the lower surface 3b are electrically coupled to each other via an internal wiring 3g or a through-hole wiring 3h.

As shown in FIG. 1, the logic chip 1 stacked on the package substrate 3 and a plurality of memory chips 2 are resin molded with a molding 4 made of, for example, an epoxy resin.

Next, a method of manufacturing the semiconductor device according to First Embodiment will be described.

Figure 6:
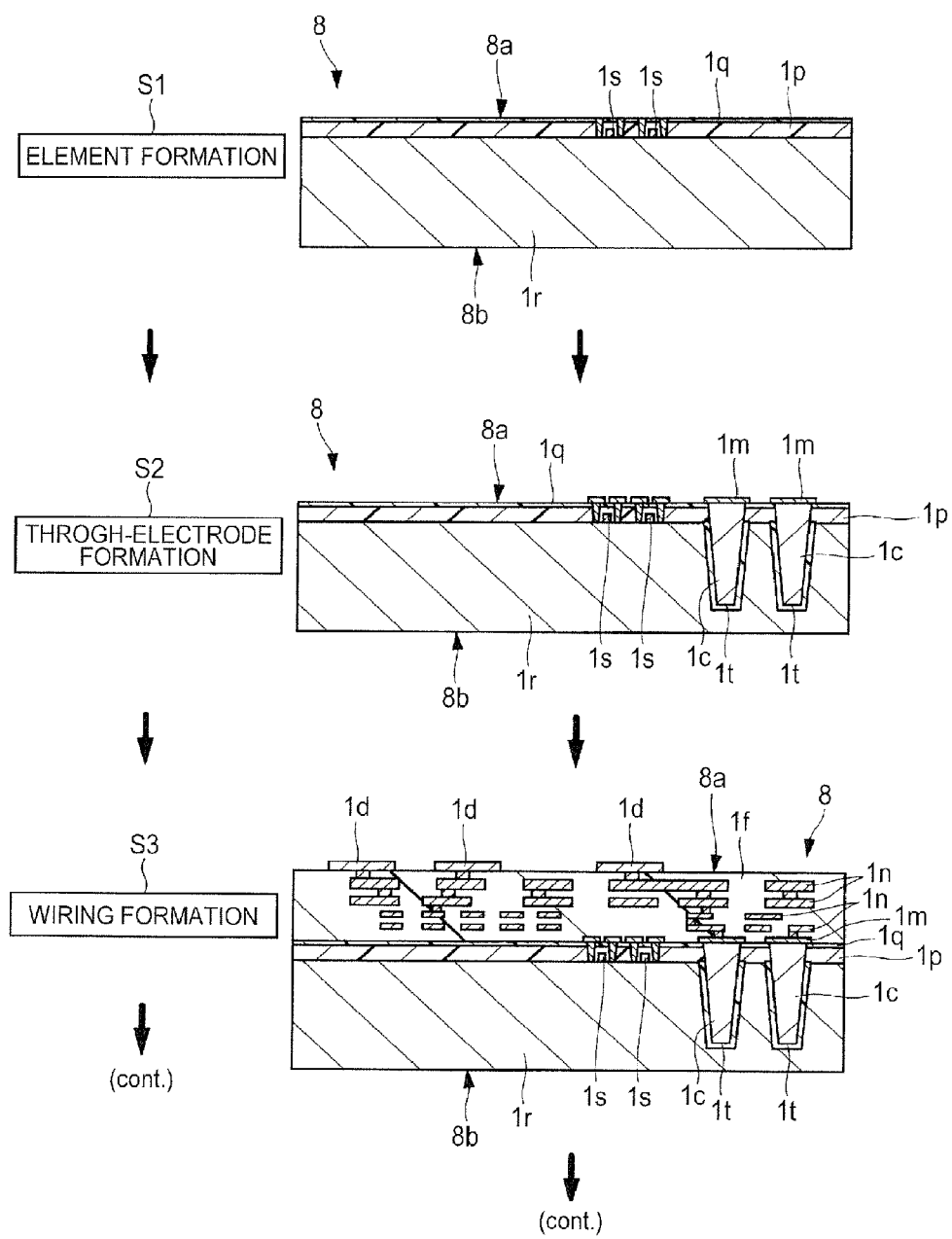
FIG. 6 includes partial cross-sectional views respectively showing examples of the structures from that after element formation to that after wiring formation in the fabrication of the semiconductor device shown in FIG. 1.
Figure 7:
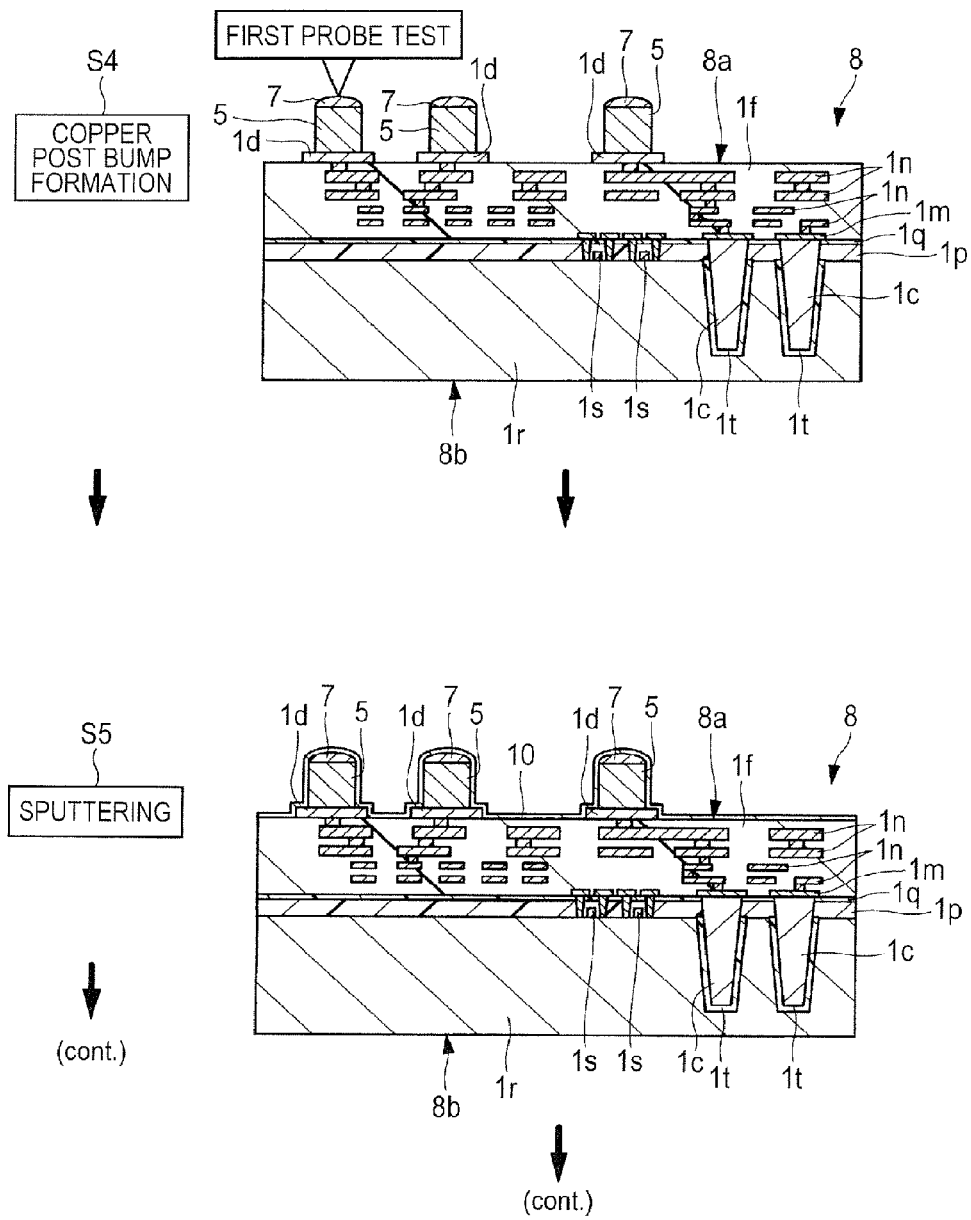
FIG. 7 includes partial cross-sectional views respectively showing examples of the structure after copper post bump formation and that after sputtering in the fabrication of the semiconductor device shown in FIG. 1.
Figure 8:
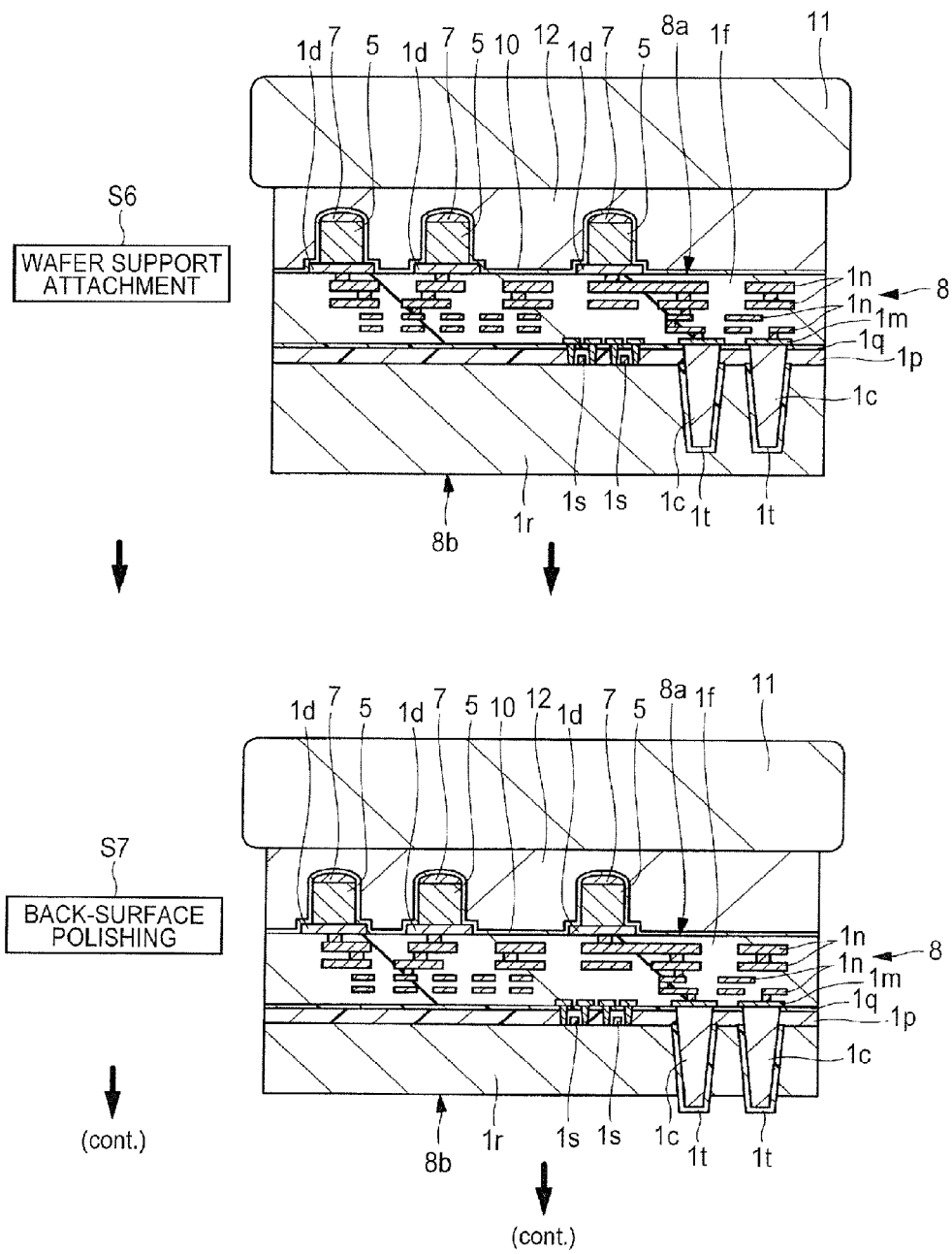
FIG. 8 includes partial cross-sectional views respectively showing examples of the structure after wafer support (carrier) attachment and that after back-surface polishing in the fabrication of the semiconductor device shown in FIG. 1.
Figure 9:
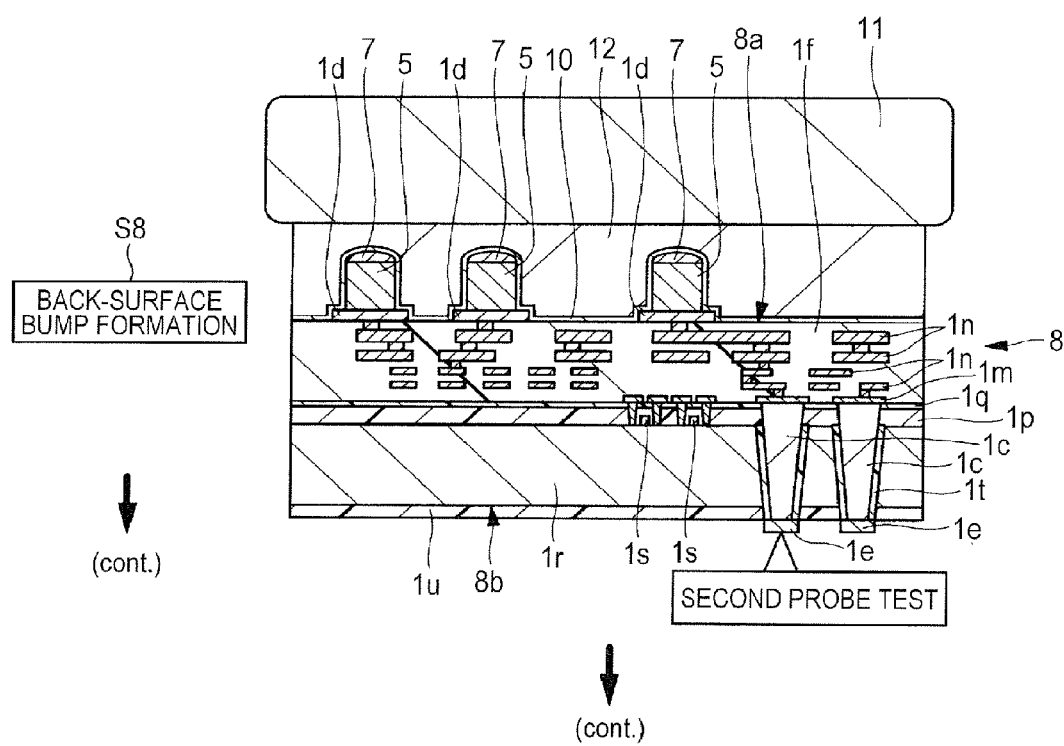
FIG. 9 is a partial cross-sectional view showing one example of the structure after back-surface bump formation in the fabrication of the semiconductor device shown in FIG. 1.
Figure 10:
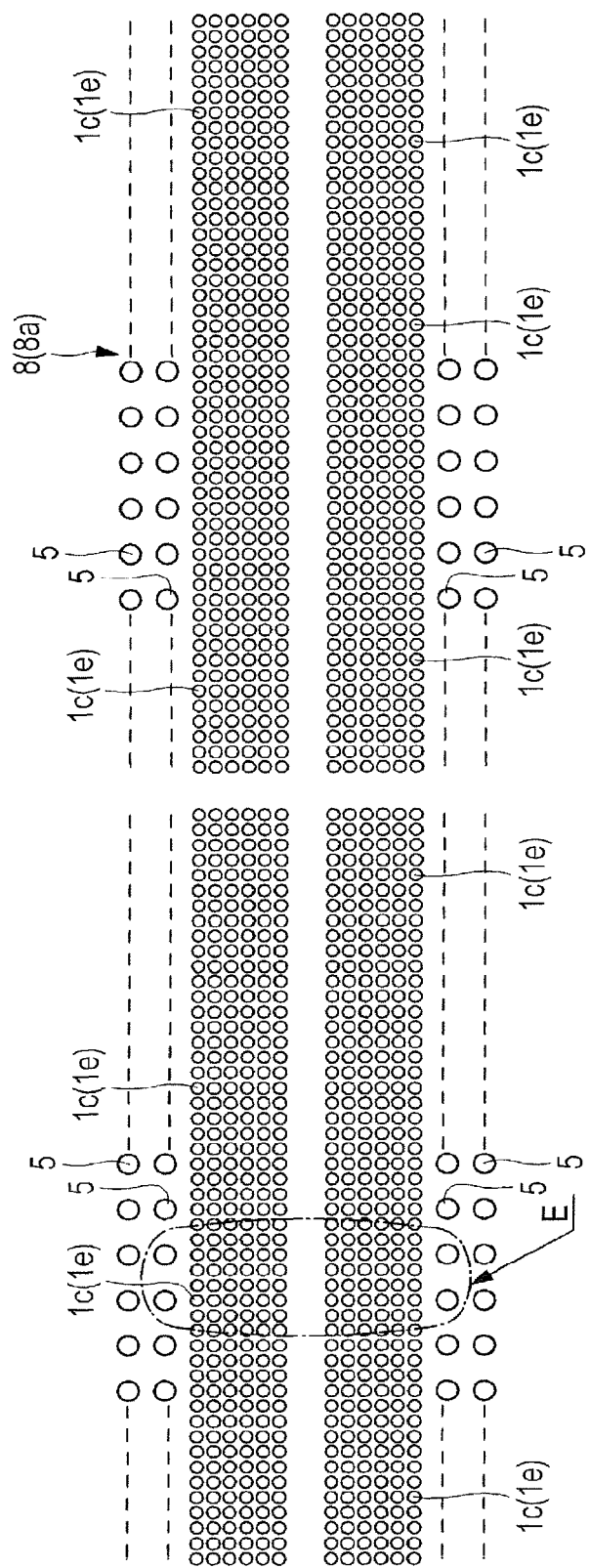
FIG. 10 is a plan view transparently showing one example of electrode arrangement inside a semiconductor substrate to be used for the fabrication of the semiconductor device shown in FIG. 1.
Figure 11:
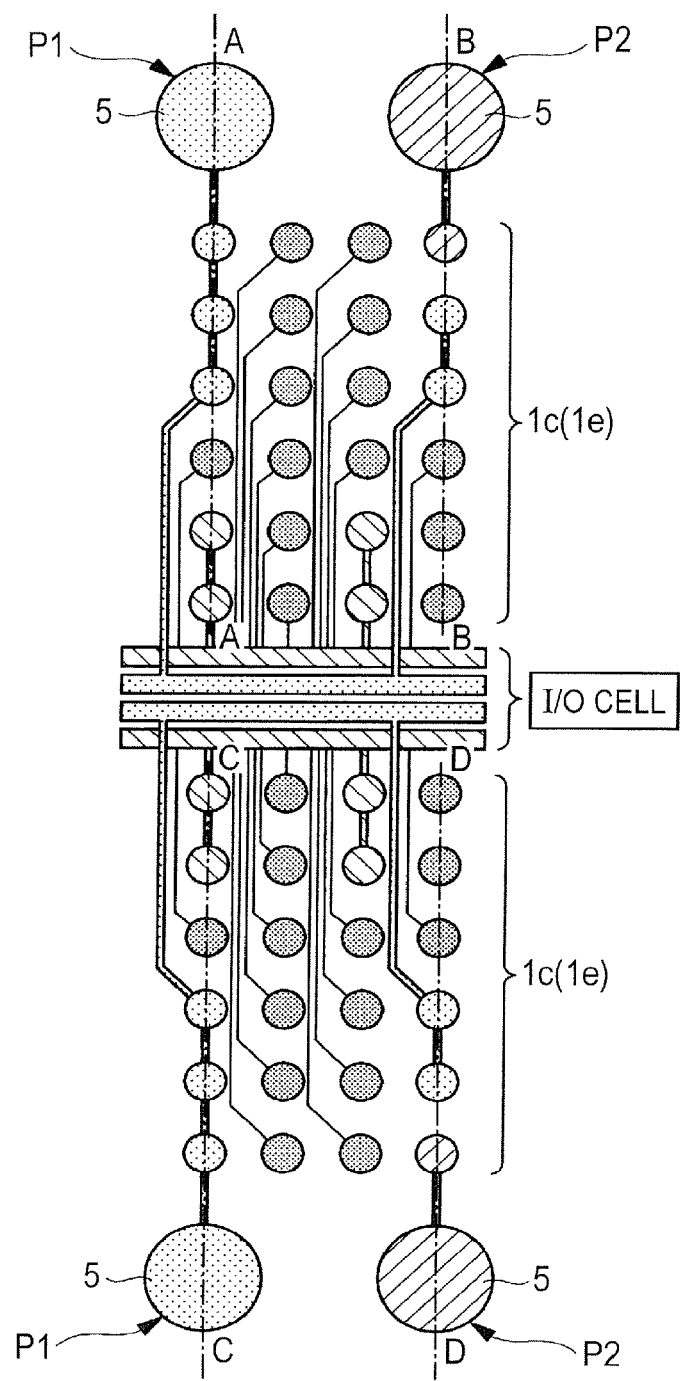
FIG. 11 is an enlarged partial plan view showing the structure of Portion E of FIG. 10.
Figure 12:
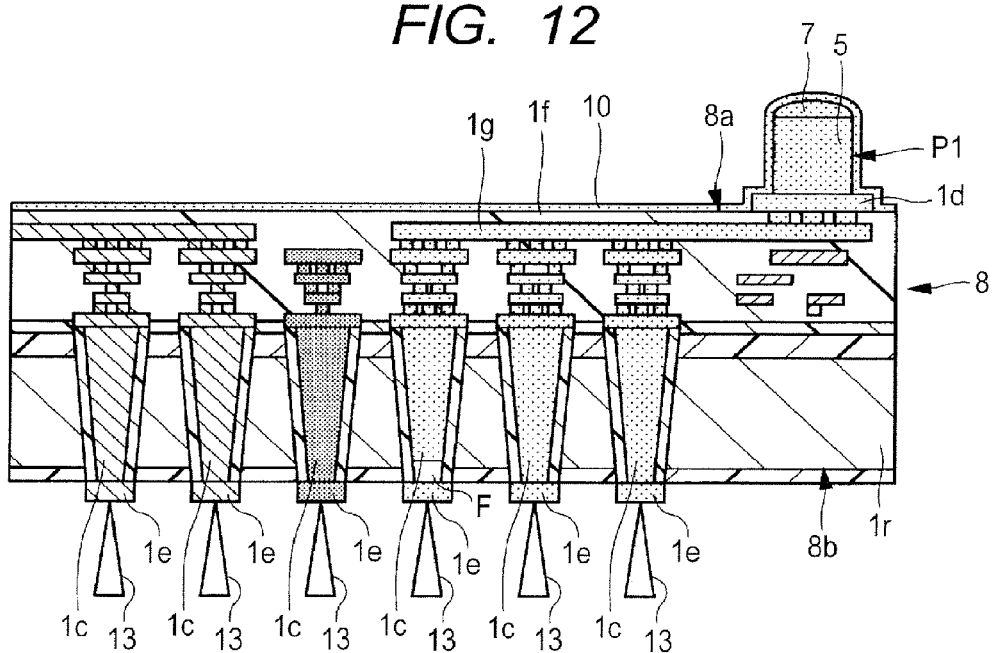
FIG. 12 is a cross-sectional view showing one example of the structure taken along a line A-A of FIG. 11.

FIG. 6 includes partial cross-sectional views respectively showing examples of the structures from that after element formation to that after wiring formation in the fabrication of the semiconductor device shown in FIG. 1; FIG. 7 includes partial cross-sectional views respectively showing examples of the structure after copper post bump formation and that after sputtering in the fabrication of the semiconductor device shown in FIG. 1; FIG. 8 includes partial cross-sectional views respectively showing examples of the structure after wafer support (carrier) attachment and that after back-surface polishing in the fabrication of the semiconductor device shown in FIG. 1; FIG. 9 is a partial cross-sectional view showing one example of the structure after back-surface bump formation in the fabrication of the semiconductor device shown in FIG. 1; FIG. 10 is a plan view transparently showing one example of electrode arrangement inside a semiconductor substrate to be used for the fabrication of the semiconductor device shown in FIG. 1; FIG. 11 is an enlarged partial plan view showing the structure of Portion E of FIG. 10; and FIG. 12 is a cross-sectional view showing one example of the structure taken along a line A-A of FIG. 11.

Figure 13:
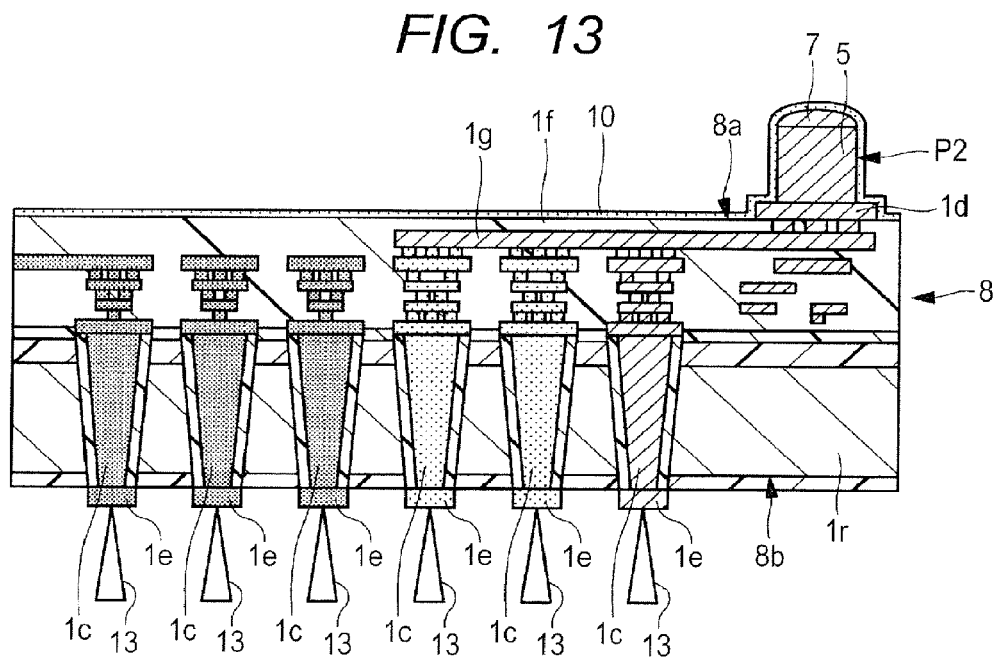
FIG. 13 is a cross-sectional view showing one example of the structure taken along a line B-B of FIG. 11.
Figure 14:
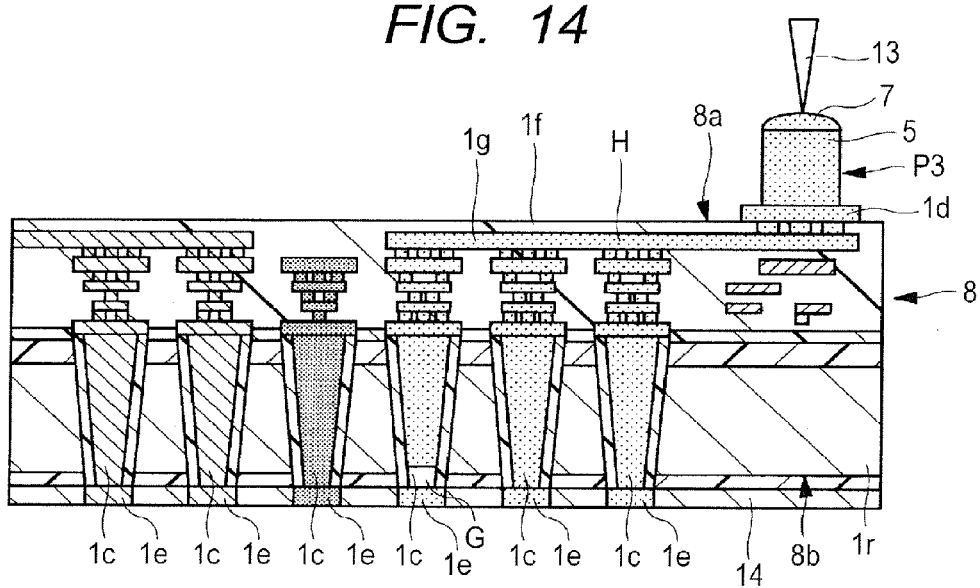
FIG. 14 is a cross-sectional view showing the structure of a comparative example taken along the same position as the line A-A of FIG. 11.
Figure 15:
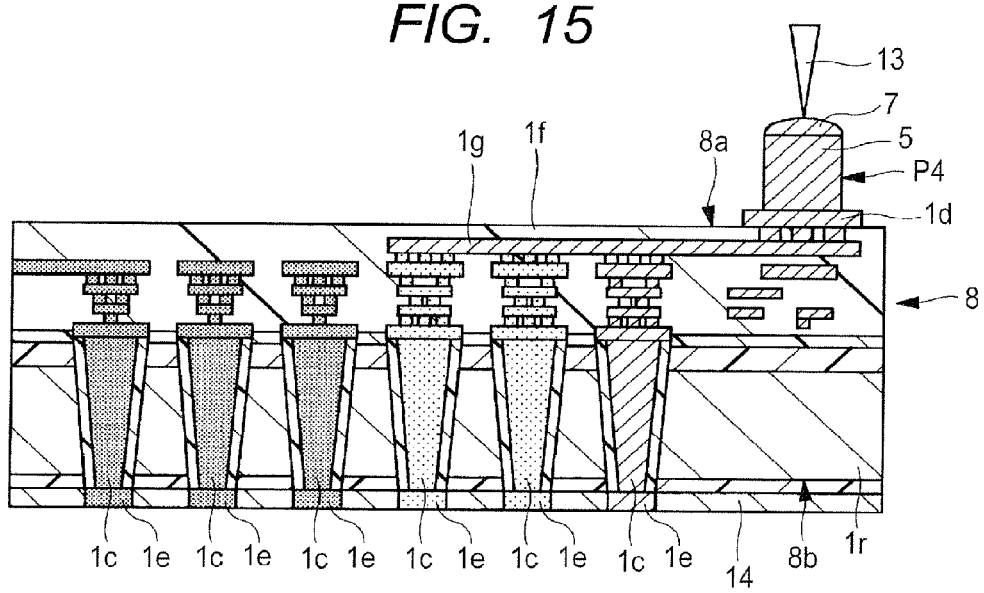
FIG. 15 is a cross-sectional view showing the structure of a comparative example taken along the same position as the line B-B of FIG. 11.

FIG. 13 is a cross-sectional view showing one example of the structure taken along a line B-B of FIG. 11; FIG. 14 is a cross-sectional view showing the structure of a comparative example taken along the same position as the line A-A of FIG. 11; FIG. 15 is a cross-sectional view showing the structure of a comparative example taken along the same position as the line B-B of FIG. 11; and FIG. 16 includes partial cross-sectional views respectively showing examples of the structure after tape attachment and that after wafer support (carrier) detachment in the fabrication of the semiconductor device shown in FIG. 1.

Figure 17:
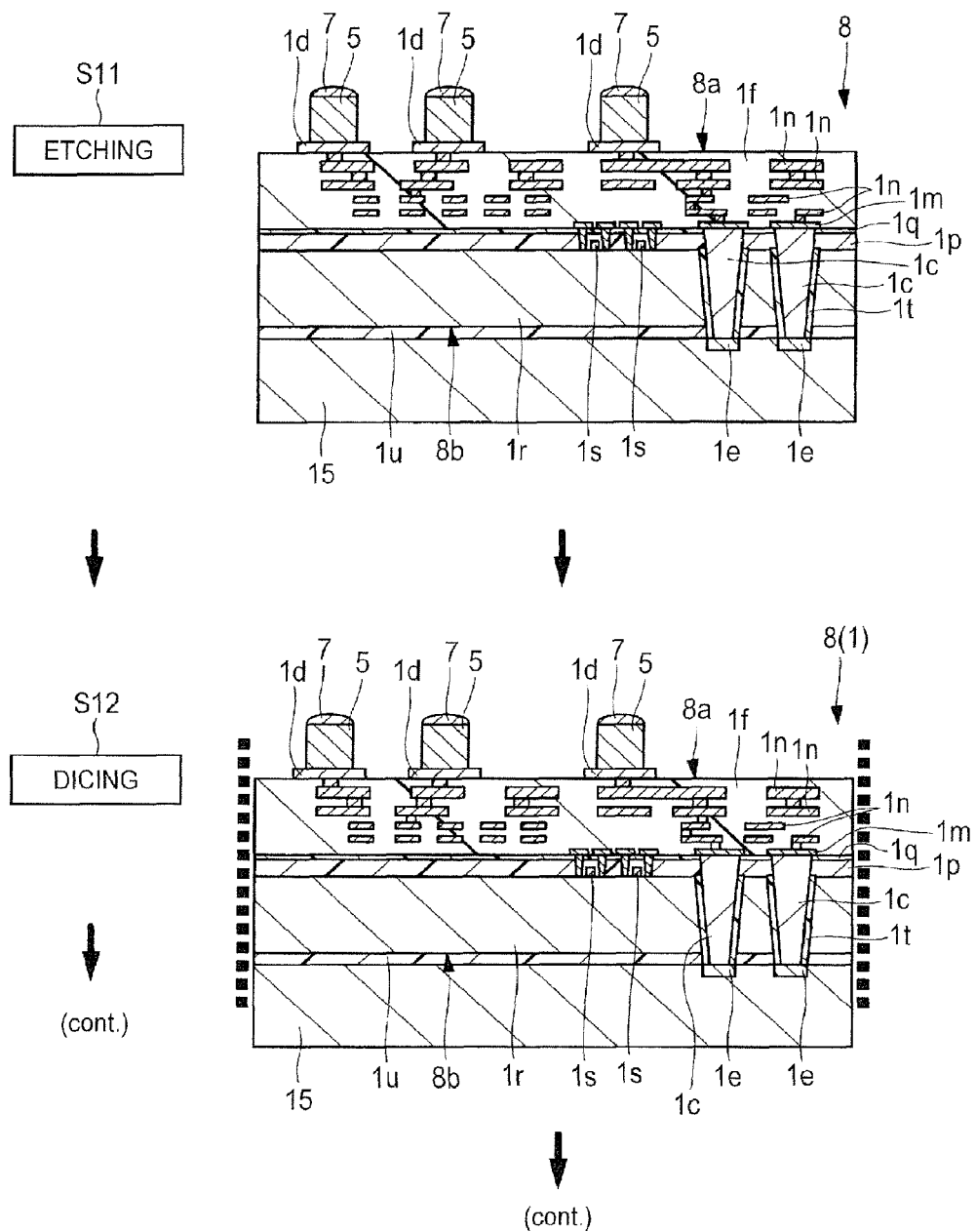
FIG. 17 includes partial cross-sectional views respectively showing examples of the structure after etching and that after dicing in the fabrication of the semiconductor device shown in FIG. 1.
Figure 18:
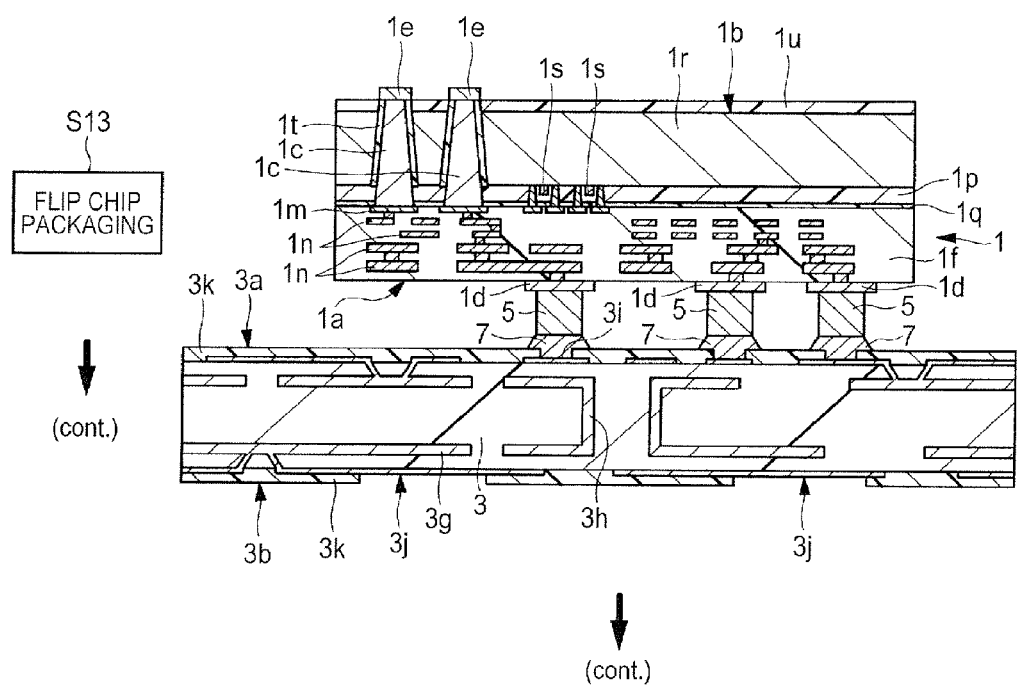
FIG. 18 is a partial cross-sectional view showing one example of the structure after flip chip packaging in the fabrication of the semiconductor device shown in FIG. 1.
Figure 19:
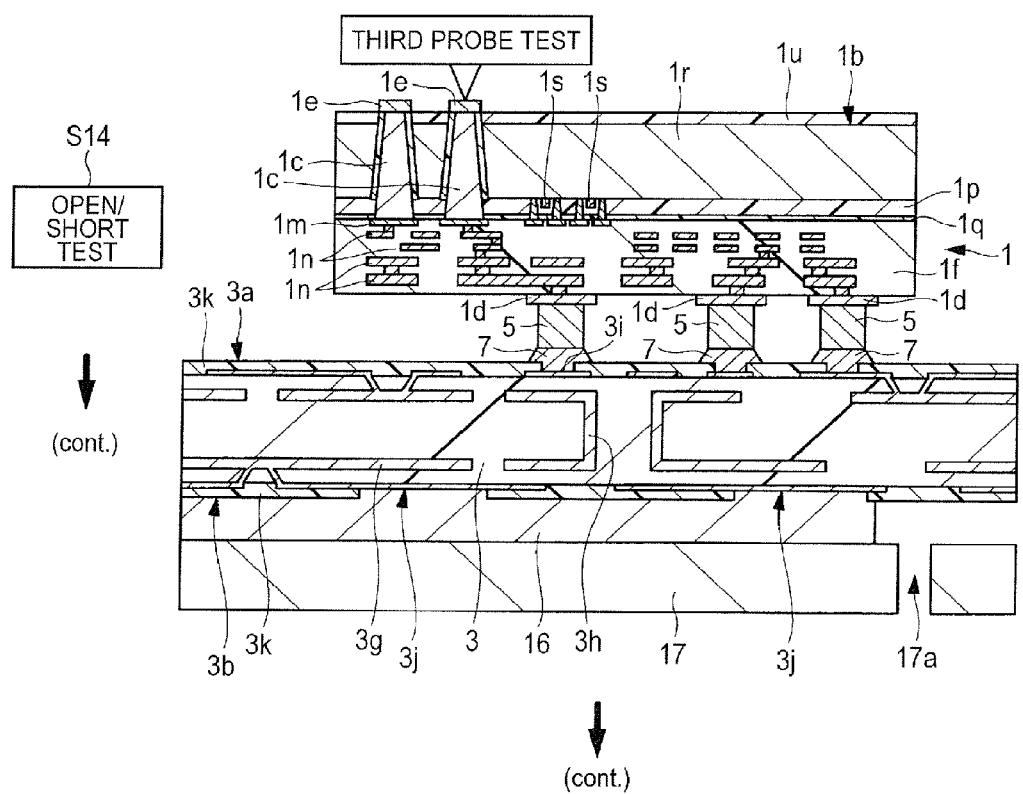
FIG. 19 is a partial cross-sectional view showing one example of the structure at the time of O/S test in the fabrication of the semiconductor device shown in FIG. 1.
Figure 21:
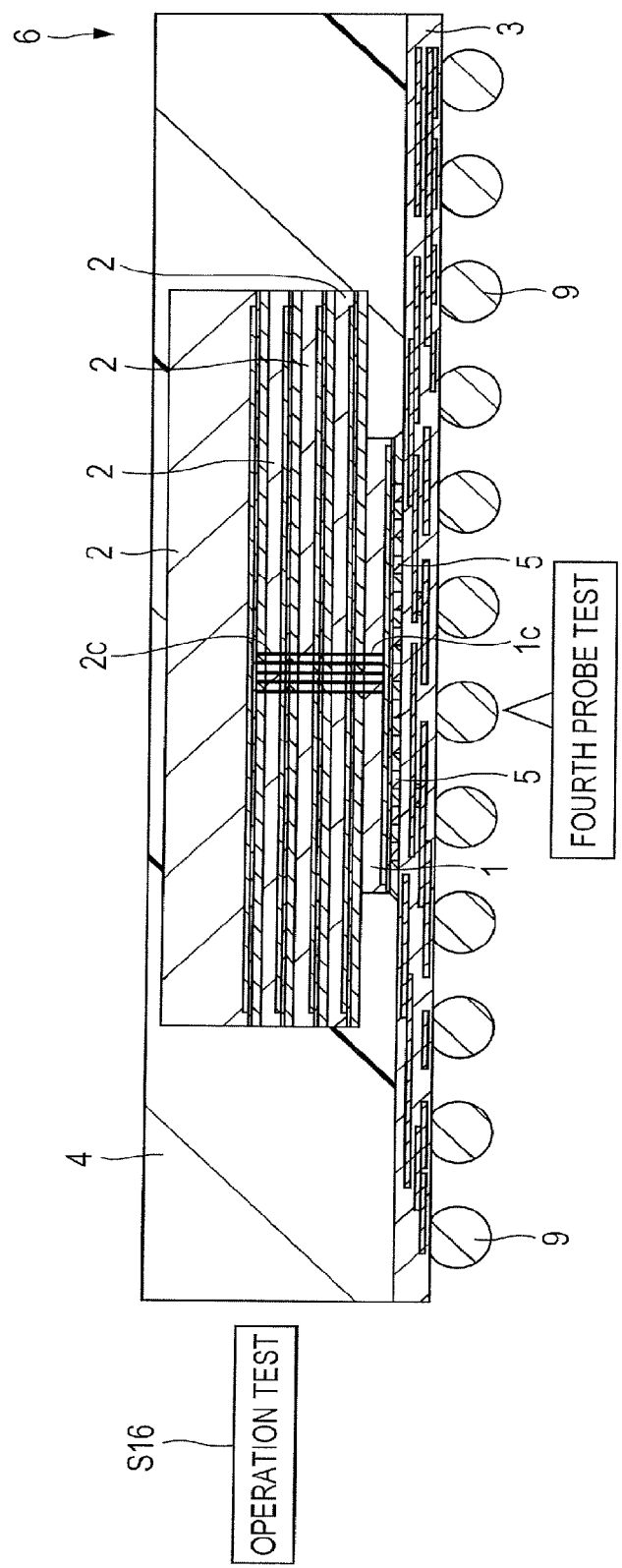
FIG. 21 is a partial cross-sectional view showing one example of the structure at the time of operation test in the fabrication of the semiconductor device shown in FIG. 1.

FIG. 17 includes partial cross-sectional views respectively showing examples of the structure after etching and that after dicing in the fabrication of the semiconductor device shown in FIG. 1; FIG. 18 is a partial cross-sectional view showing one example of the structure after flip chip packaging in the fabrication of the semiconductor device shown in FIG. 1; FIG. 19 is a partial cross-sectional view showing one example of the structure at the time of O/S test in the fabrication of the semiconductor device shown in FIG. 1; FIG. 20 is a partial cross-sectional view showing one example of the structure after chip stacking in the fabrication of the semiconductor device shown in FIG. 1; and FIG. 21 is a partial cross-sectional view showing one example of the structure at the time of operation test in the fabrication of the semiconductor device shown in FIG. 1.

First, element formation as shown in Step S1 of FIG. 6 is conducted. In this step, an element 1s is formed at a surface (first surface) 8a of a semiconductor wafer (which may hereinafter be called "wafer" simply) 8, which is a semiconductor substrate. More specifically, the element 1s such as transistor is formed in a surface layer comprised of an insulating layer 1p and a protecting film 1q on a base substrate 1r made of silicon.

Next, through-electrode formation in Step S2 is conducted. First, a metal layer (first circuit layer) 1m is formed on the surface 8a of the wafer 8 and then, a plurality of through-electrodes 1c electrically coupled to the metal layer 1m is formed in the wafer 8. The surface of each of the through-electrodes 1c is covered with an insulating film 1t such as $SiO_2$ (also including TiN) to prevent diffusion of the through-electrode 1c. The electrode pitch between the through-electrodes 1c is, for example, about 40 μm.

Next, wiring formation in Step S3 is conducted. First, a metal layer (second circuit layer) 1n is formed in an insulating layer 1f on the surface (first surface) 8a. This means that the metal layer 1n electrically coupled to the through-electrodes 1c is formed on the metal layer 1m. The metal layer 1n is comprised of a plurality of wiring layers and they have an interlayer insulating film therebetween.

A plurality of pads 1d electrically coupled to the metal layer 1n is formed on the insulating layer 1f. This pad 1d is a pad made of, for example, aluminum (Al).

Next, copper post bump formation of Step 4 shown in FIG. 7 is conducted. In this step, a plurality of copper post bumps (first electrodes) 5 which are protruding electrodes and electrically coupled to the metal layer 1n is formed on the metal layer 1n. This means that the copper post bumps 5 which are protruding electrodes are formed on a plurality of pads 1d formed on the insulating layer 1f and at the same time, electrically coupled to the metal layer 1n. The copper post bumps 5 each have thereon a solder 7. Here, the description is made with a post bump made of copper (Cu) as an example, but the material of the post bump is not limited to it. A post bump made of another metal can also be used.

These copper post bumps 5 are provided with a pitch of, for example, 100 μm or less. Since the number of the terminals of the through-electrode 1c necessary on the side of the memory chip is greater than the number of the copper post bumps to be coupled to the side of the package substrate, their electrode pitches satisfy the following relationship: (electrode pitch between the copper post bumps 5)>(electrode pitch between the through-electrodes 1c).

Next, a first probe test as shown in FIG. 7 is conducted. Described specifically, after formation of the copper post bumps 5, the first probe test which is an electrical test is conducted by probing (applying an unillustrated test probe to) the copper post bump 5. This first probe test is conducted to determine whether the logic chip 1 formed on the wafer is defective or non-defective and the test is conducted on a plurality of the logic chips 1 formed in a chip region of the wafer 8.

Next, sputtering of Step S5 is conducted. In this step, as shown in Step S5 of FIG. 7, a conductive film 10 (sputter film) is formed on the whole surface of the surface 8a of the wafer 8. The conductive film 10 is formed so as to cover the surface 1a (8a) of each of the logic chips 1 and the surface of each of the copper post bumps 5, the pads 1d exposed from the copper post bumps 5, and the solders 7 on the copper post bumps 5. The conductive film 10 is, for example, a chromium (Cr) film or a nickel (Ni) film.

The copper post bumps 5 formed on the surface 8a of the wafer 8 are therefore electrically coupled to each other via this conductive film 10.

Next, wafer support (carrier) attachment shown in Step S6 of FIG. 8 is conducted. The wafer 8, on the side of the surface (first surface) 8a, is bonded to a carrier (support member) 11 via an adhesive 12. The carrier 11 is, for example, a glass carrier made of quart glass. The adhesive 12 is, for example, an organic adhesive. The adhesive 12 is however not limited to an organic adhesive but a conductive adhesive or the like may be used.

Next, back-surface polishing (grinding, back grinding) shown in Step 7 of FIG. 8 is conducted. In this step, the back surface (second surface) 8b of the wafer 8 on the side opposite to the surface 8a is polished (ground) to expose the end (a portion, a portion corresponding to the other end described above) of the through-electrodes 1c formed in advance in Step S2. The polishing employed at this time is, for example, polishing, chemical etching, or the like.

Next, back-surface bump formation shown in Step S8 of FIG. 9 is conducted. First, in this step, an insulating film 1u is formed around the end of the through-electrodes 1c exposed from the back surface 8b of the wafer 8. This insulating film 1u is, for example, an $SiO_2$ (also including TiN) film. Then, bumps (second electrodes) 1e are formed, respectively, on the ends of the through-electrodes 1c exposed from the side of the back surface 8b. The bumps 1e are made, for example, by plating. In many cases, the bumps 1e are made of, for example, gold (Au).

Thus, a plurality of the bumps 1e is formed on the back surface 8b of the wafer 8. Since the bumps 1e are formed respectively on the ends of the through-electrodes 1c exposed from the back surface 8b of the wafer 8, the electrode pitch between the bumps 1e is equal to that between the through-electrodes 1c. On the surface and back surface of the wafer 8, the electrode pitch between the copper post bumps 5 and the electrode pitch between the bumps 1e (through-electrodes 1c) satisfy the following relationship: (the former)>(the latter).

Next, a second probe test shown in FIG. 9 is conducted. In this step, tested is an electrical coupling state (conduction state) between the copper post bumps 5 and the bumps 1e. In this second probe test, conduction between the bumps 1e (electrodes) is checked while supporting the wafer 8 with the carrier 11 being attached to the wafer 8 and at the same time, electrically short-circuiting between the copper post bumps 5 (electrodes).

In short, the second probe test is conducted to determine whether each of the through-electrodes 1c formed in the wafer 8 (chip) is defective or non-defective. In other words, the second probe test is conducted in order to determine whether the conduction of each (each one) of the through-electrodes 1c is secured or not or whether the through-electrodes 1c which should not essentially be electrically short-circuited are short-circuited or not.

First Embodiment is characterized in that the conductive film 10 is provided on the copper post bumps so that the copper post bumps 5 are electrically coupled to each other in the above-mentioned Step S5.

The purpose of this second probe will next be described.

The BGA 6 of First Embodiment has, as shown in FIG. 20, a structure in which power supply/GND signals are supplied to the second- or higher-level memory chip 2 from the package substrate 3, passing through the logic chip 1. Particularly in the power supply/GND, many wirings branch from the side of the copper post bumps 5 to the through-electrodes 1c and among the copper post bumps 5, any of the copper post bumps 5 is electrically coupled to two or more through-electrodes 1c.

The number of the copper post bumps 5 on the side of the lower surface of the logic chip 1 is therefore greater than the number of the bumps (through-electrodes 1c) 1e on the side of the upper surface. As a result, the electrode pitch between the bumps 1e is smaller than the electrode pitch between the copper post bump 5 (electrode pitch between the copper post bumps 5>the electrode pitch between the bumps 1e).

In the second probe test, as shown in FIG. 9, a wiring loop is formed by electrically short-circuiting any neighboring two of the copper post bumps 5 with the conductive film 10 on the side of the copper post bumps 5 having a wide electrode pitch. This makes it possible to conduct probing even on the side of the bumps 1e (through-electrodes 1c) having a smaller electrode pitch than that between the copper post bumps 5 and thereby determine whether each of the through-electrodes 1c (all the pins) is electrically defective or non-defective.

The advantage of the second probe test in First Embodiment will next be described referring to First Embodiment shown in FIGS. 10 to 13 and Comparative Example shown in FIGS. 14 and 15.

FIG. 10 transparently shows, from the side of the surface 8a, the arrangement of the through-electrodes 1c provided inside the wafer 8 and the copper post bumps 5 on the surface side. The enlarged view of it is shown in FIG. 11. For example, suppose that a filling failure occurs in a certain through-electrode 1c in Portion F of FIG. 12 which shows the cross-section A-A of FIG. 11, while in FIG. 13 which shows the cross-section B-B of FIG. 11, all the through-electrodes 1c are normally made conductive without causing a filling failure.

In the probe test using the respective structures of Comparative Examples shown in FIGS. 14 and 15, the test is conducted by applying a probe 13 to the side of the copper post bump 5 (copper post bump P3 or P4) while short-circuiting the side of the narrow-pitch bump electrodes 1e (through-electrode 1c) with a conductive film 14. In this case, even if there is a through-electrode 1c having an unfilled portion such as Portion G of FIG. 14, a filling failure at Portion G cannot be detected and the through-electrode 1c is determined non-defective because the through-electrodes 1c are electrically short-circuited via a wiring portion 1g in the chip (Portion H of FIG. 14). This suggests that all the bumps 1e (through-electrodes 1c) cannot be subjected to correct determination whether defective or non-defective in the probe test of Comparative Example.

On the other hand, in the structure of First Embodiment shown in FIGS. 12 and 13, the second probe test is conducted by applying the probe 13 to the side of the bumps 1e (through-electrodes 1c) having a narrow pitch while short-circuiting the side of the copper post bumps 5 with the conductive film 10 (the copper post bump P1 of FIG. 12 and the copper post bump P2 of FIG. 13 are made electrically conductive with the conductive film 10). In this case, even if the through-electrode 1c has therein a filling failure as shown in Portion F of FIG. 12, it is possible to determine whether each of the bumps 1e (through-electrodes 1c) is defective or non-defective without being influenced by the short-circuit of the wiring portion 1g in the chip, because the test is made via a wiring loop of the conductive film 10. In other words, the conductive film 10 can be regarded as a new bypass wiring provided outside the chip and due to this new bypass wiring, determination of each of the through-electrodes 1c whether it is defective or non-defective can be conducted without being influenced by the electrical short-circuit in the chip.

In short, among the characteristics described above, the main characteristic of the second probe test is that a probe needle is applied to the side of the bumps 1e (through-electrodes 1c) having a narrow electrode pitch while electrically short-circuiting the side of the copper post bumps 5 having a wide electrode pitch with the conductive film 10. In consideration of the working efficiency during applying a probe needle, it generally seems preferable to apply a probe needle to the side of the copper post bumps having a wide electrode pitch while electrically short-circuiting the side of the bumps 1e having a narrow electrode pitch with the conductive film 10. If so, however, due to an influence of short-circuiting in the chip, some of the through-electrodes 1c become electrically invisible. The second probe test therefore makes it possible to determine whether each of the through-electrodes 1c is defective or non-defective by daringly applying a probe needle to the side of the bumps 1e having a narrow electrode pitch while electrically short-circuiting the side of the copper post bumps 5 having a wide electrode pitch with the conductive film 10.

Another characteristic of the second probe test is that a probe needle is applied to the side of the bumps 1e while supporting (retaining) the wafer 8 with the carrier 11 being attached to the wafer 8. The logic chip 1 (the wafer 8) has, for example, a thickness as thin as about 50 µm so that it has many problems to be overcome such as damage to the chip during probing, handling difficulty of the chip, and the like. These problems however can be overcome by this second probe test because probing is conducted while supporting (retaining) the wafer 8 by the carrier 11 attached to the wafer 8 so that it does not impair the rigidity of the logic chip 1 (the wafer 8).

As described above, by employing the second probe test as described above in the manufacture of the semiconductor device according to First Embodiment, every through-electrode 1c (every pin) can be subjected to the test.

Figure 16:
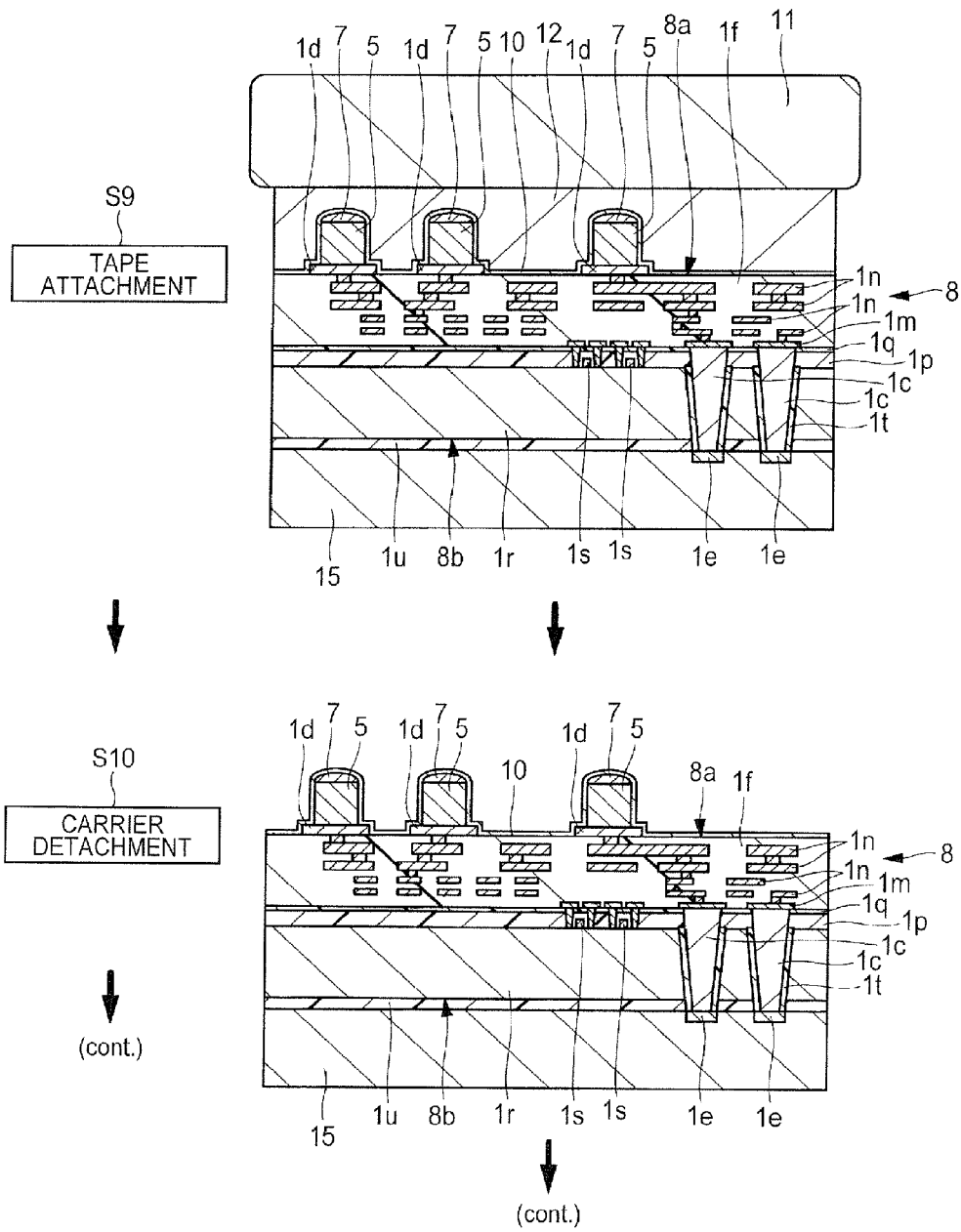
FIG. 16 includes partial cross-sectional views respectively showing examples of the structure after tape attachment and that after wafer support (carrier) detachment in the fabrication of the semiconductor device shown in FIG. 1.

After completion of the second probe test, tape attachment as shown in Step S9 of FIG. 16 is conducted. In this step, a dicing tape 15 is attached to the side of the back surface (second surface) 8b of the wafer 8 which has been finished the second probe test.

Next, wafer support (carrier) detachment as shown in Step S10 is conducted. In this step, the carrier (support member) 11 attached to the side of the surface 8a with the adhesive 12 is detached (removed) from the wafer 8 which has finished the second probe test and to which the dicing tape 15 has been attached.

Next, etching as shown in Step S11 of FIG. 17 is conducted. In this step, the conductive film 10 formed on the side of the surface 8a of the wafer 8 is removed by etching.

At this time, foreign matters derived from the adhesive 12 attached to the side of the surface 8a can also be removed by removing the conductive film 10 by etching. This is effective, for example, for preventing a packaging failure due to foreign matters attached to the solder 7 on the end of the copper post bumps 6.

Next, dicing as shown in Step S12 is conducted. In this step, the wafer 8 supported by the dicing tape 15 is diced into a plurality of non-defective semiconductor chips (meaning logic chips 1).

Next, flip chip packaging as shown in Step S13 of FIG. 18 is conducted. First, a package substrate (wiring substrate, multiple substrate) 3 is provided. The package substrate 3 has, on the upper surface (first main surface) 3a thereof, a plurality of lands (first pad electrodes) 3i to be coupled to a plurality of the copper post pumps 5 of the logic chip 1 and has, on the lower surface (second main surface) 3b of the package substrate 3 opposite to the upper surface 3a, a plurality of lands (second pad electrodes) 3j electrically coupled to the lands 3i.

In addition, the package substrate 3 has, on the surface layer of the upper and lower surfaces thereof, a solder resist film 3k and a portion of each of the lands 3i and 3j is exposed therefrom.

After the package substrate 3 is provided, as shown in FIG. 18, the logic chip 1 determined to be non-defective in the first and second probe test steps is mounted on the upper surface 3a of the package substrate 3 to electrically couple the package substrate 3 and the copper post bumps 5 to each other.

At this time, the logic chip 1 determined to be non-defective as a result of the first and second probe tests is heated and pressurized to couple each of the copper post bumps 5 to the lands 3i of the package substrate 3 via the solder 7.

Next, an open/short test as shown in Step 14 of FIG. 19 is conducted. In this step, conduction between the electrodes of the bumps (second electrodes) 1e on the side of the back surface (upper surface) 1b of the logic chip 1 is checked while electrically short-circuiting between the lands 3j on the side of the lower surface 2b of the package substrate 3. For example, as shown in FIG. 19, the lands 3j on the side of the lower surface 3b of the package substrate 3 are short-circuited with a conductive sheet 16 and by supporting the resulting package substrate 3 with a probe carrier 17 and at the same time, conducting evacuation via a vacuum suction hole 1 provided in the probe carrier 17, the package substrate 3 is supported. Moreover, under such a state, a third probe test is conducted by probing to the bumps 1e of the logic chip 1.

By this third probe test, whether the electrical coupling state between the logic chip 1 and the package substrate 3 is good or bad is determined. More specifically, the coupling state between each of the copper post bumps 5 of the logic chip 1 and each of the lands 3i of the package substrate 3 is checked.

The importance of this third probe test will next be described. After this third probe test, the memory chips 2 are mounted on the logic chip 1 as described later. When the coupling state of the logic chip 1 and the package substrate 3 is insufficient (in the case of a coupling failure), all the memory chips 2 mounted on them become useless. When the third probe test is conducted, on the other hand, the memory chips 2 are mounted only on the logic chip 1 and the package substrate 3 which have been coupled to each other completely (non-defective product), making it possible to avoid wasting the memory chips 2.

It is to be noted that the third probe test is not essential. In mass production, when a coupling yield between the logic chip 1 and the package substrate 3 is stable, the third probe test is not always necessary. Omission of the third probe test leads to reduction in the number of steps.

Next, chip stacking as shown in Step S15 of FIG. 20 is conducted. In this step, one or more memory chips 2 are stacked on the logic chip 1 mounted on the package substrate 3.

Then, resin molding is conducted to form a molding 4 as shown in FIG. 21. At the same time, a ball electrode 9 serving as an external coupling terminal is mounted. The package substrate 3 is then separated into individual pieces and the fabrication of the BGA 6 is completed.

As a final step, a fourth probe test, which is an operation test as shown in Step S16 of FIG. 21, is conducted. In this fourth probe test, probing to the ball electrode 9 is conducted to make an operation test of the BGA 6. Since the BGA 6 package is a typical outer shape, a conventional test socket can be used for the operation test. It is possible to reduce the production cost of the semiconductor device by using the existing infrastructure and suppressing new investment.

Figure 22:
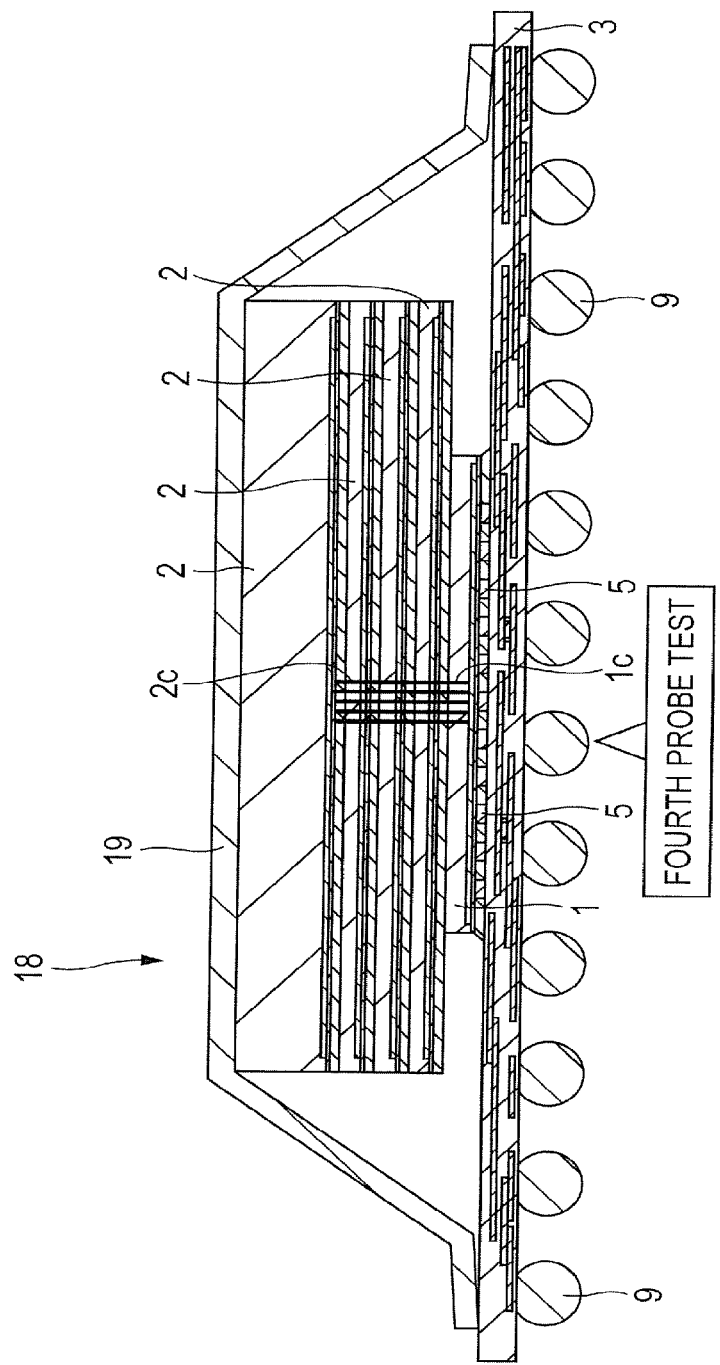
FIG. 22 is a partial cross-sectional view showing the structure at the time of operation test of a semiconductor device according to a modification example of First Embodiment.

FIG. 22 shows a BGA (semiconductor device) 18 according to Modification Example of First Embodiment and it is a semiconductor device not molded with a resin but molded with a case 19. The case 19 is made of, for example, a metal. It is attached to the back surface of the uppermost-level memory chip 2 and therefore useful for chip protection and as a heat radiator fin. Also in this BGA 18, an operation test in the fourth probe test is conducted by probing to the ball electrode 9.

Second Embodiment

Figure 23:
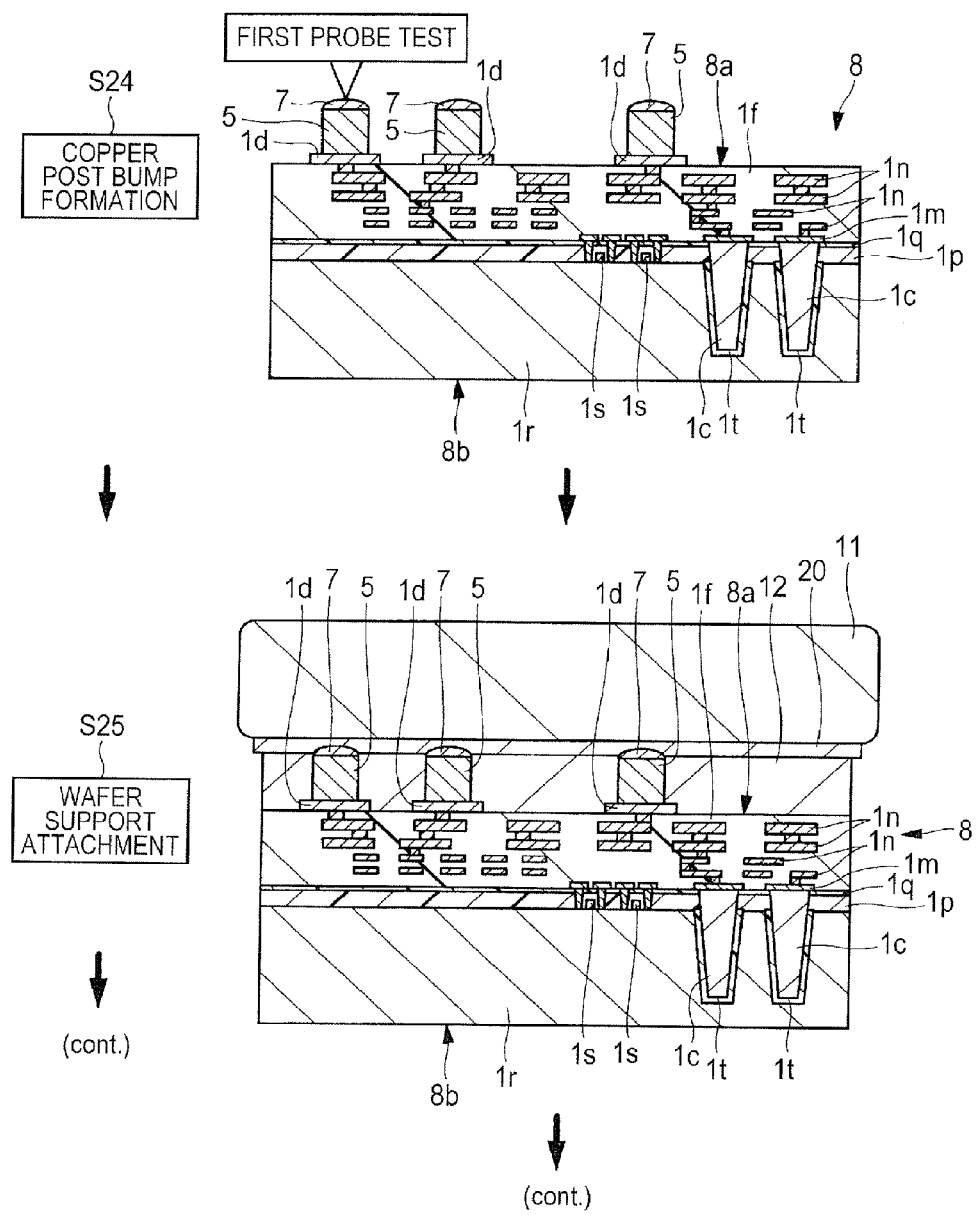
FIG. 23 includes partial cross-sectional views respectively showing examples of the structure after copper post bump formation and that after wafer support (carrier) attachment in the fabrication of a semiconductor device of Second Embodiment.
Figure 24:
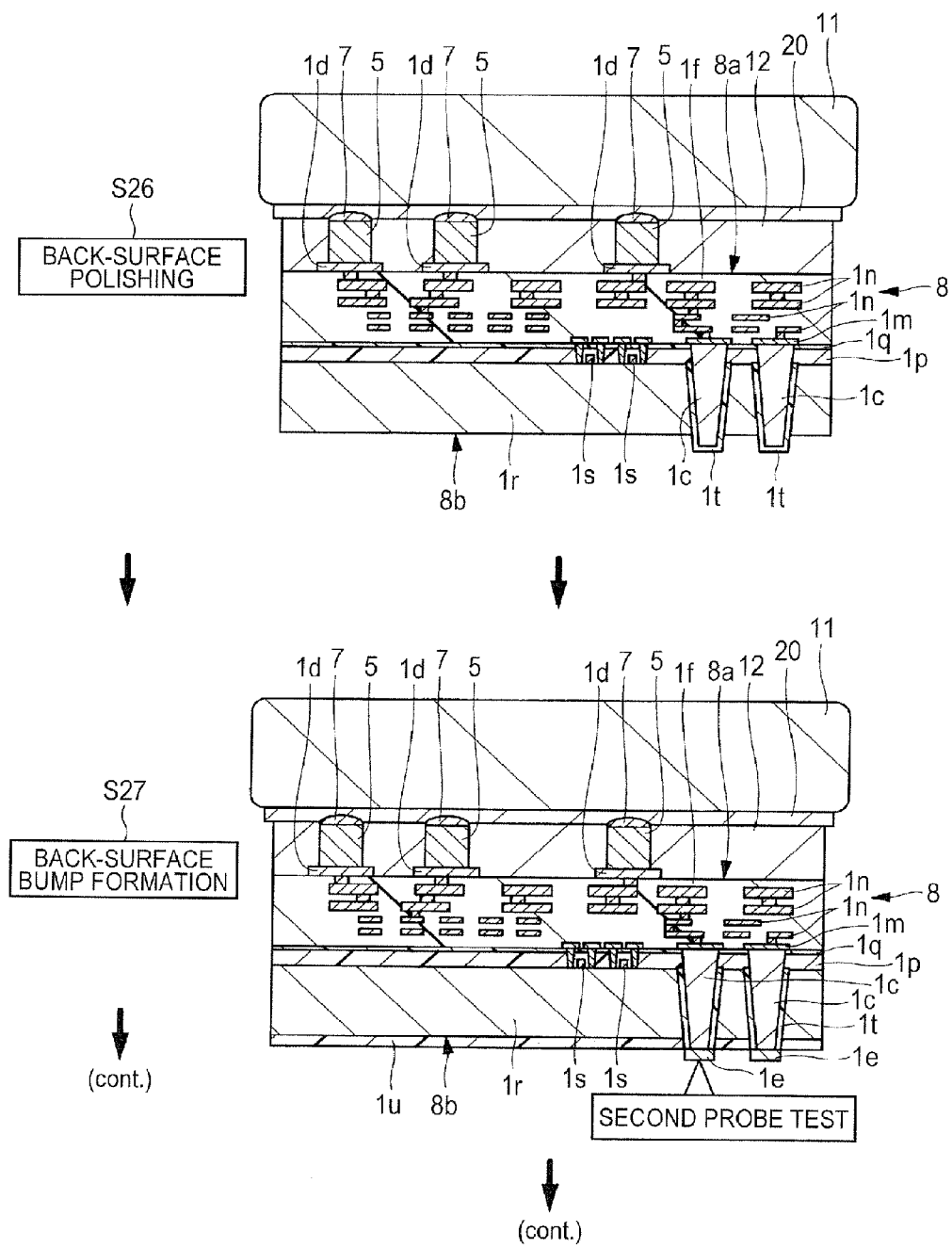
FIG. 24 includes partial cross-sectional views respectively showing examples of the structure after back-surface polishing and that after back-surface bump formation in the fabrication of the semiconductor device of Second Embodiment.

FIG. 23 includes partial cross-sectional views respectively showing examples of the structure after copper post bump formation and that after wafer support (carrier) attachment in the fabrication of a semiconductor device of Second Embodiment; FIG. 24 includes partial cross-sectional views respectively showing examples of the structure after back-surface polishing and that after back-surface bump formation in the fabrication of the semiconductor device of Second Embodiment; and FIG. 25 includes partial cross-sectional views respectively showing examples of the structure after tape attachment and that after wafer support (carrier) detachment in the fabrication of the semiconductor device of Second Embodiment.

The semiconductor device of Second Embodiment is a BGA 6 similar to that of First Embodiment. This means that the BGA 6 of Second Embodiment is a chip stacked type semiconductor device obtained by stacking a plurality of semiconductor chips on a package substrate 3.

Since the structure of the BGA 6 of Second Embodiment is similar to that of the BGA 6 of First Embodiment, the overlapping description of it is omitted.

Next, a method of manufacturing the semiconductor device according to Second Embodiment will be described.

The main characteristic of the semiconductor device according to Second Embodiment is that a second probe test is conducted while electrically short-circuiting between copper post bumps with a conductive member attached to a carrier.

Step S21 (element formation) to Step S24 (copper post bump formation) in the method of manufacturing the semiconductor device according to Second embodiment are similar to Step S1 (element formation) to Step S4 (copper post bump formation) in First Embodiment so that the overlapping description of them is omitted.

First, Step S21 to Step S23 are conducted. Then, copper post bumps 5 as shown in Step S24 of FIG. 23 are formed and the first probe test is conducted.

Next, wafer support (carrier) attachment as shown in Step S25 of FIG. 23 is conducted. In this step, the side of the surface (first surface) 8a of the wafer 8 is attached to a carrier (support member) 11. At this time, a conductive film member 20 has already been formed on the surface of the carrier 11 facing to the side of the surface 8a of the wafer 8. The carrier 11 is attached to the surface 8a of the wafer 8 by attaching the side of the surface 8a of the wafer 8 to the carrier 11 via an adhesive 12 so as to bring the conductive film member 20 into contact with each of the copper post bumps 5.

This makes it possible to electrically couple (short-circuit between) the copper post bumps 5 formed on the surface 8a of the wafer 8 to each other via the conductive film member 2.

The carrier 11 is, for example, a glass carrier made of quartz glass. The adhesive 12 is, for example, an organic adhesive. The adhesive 12 is however not limited to an organic adhesive but it may be a conductive adhesive or the like.

Next, back-surface polishing (grinding, back grinding) as shown in Step S26 of FIG. 24 is conducted. In this step, the back surface (second surface) 8b of the wafer 8 on the side opposite to the surface 8a is polished (ground) while attaching the side of the surface 8a of the wafer 8 to the carrier 11 and the end (a portion) of the through-electrodes 1c formed in advance in Step S2 is exposed. The polishing employed at this time is, for example, polishing, chemical etching, or the like.

Next, back-surface bump formation as shown in Step S27 shown in FIG. 24 is conducted. First, in this step, an insulating film 1u is formed around the end of the through-electrodes 1c exposed from the back surface 8b of the wafer 8. This insulating film 1u is, for example, an $SiO_2$ (also including TiN) film. Then, bumps (second electrodes) 1e are formed, respectively, on the ends of the through-electrodes 1c exposed from the side of the back surface 8b. The bumps 1e are made, for example, by plating. In many cases, the bumps 1e are made of, for example, gold (Au).

Thus, a plurality of the bumps 1e is formed on the back surface 8b of the wafer 8. Since the bumps 1e are formed on the ends of the through-electrodes 1c exposed from the back surface 8b of the wafer 8, respectively, the electrode pitch between the bumps 1e is equal to that between the through-electrodes 1c.

On the surface and back surface of the wafer 8, the electrode pitch between the copper post bumps 5 and the electrode pitch between the bumps 1e (through silicon electrodes 1c) satisfy the following relationship: (the former electrode pitch)>(the latter electrode pitch).

Next, a second probe test as shown in FIG. 24 (Step S27) is conducted. In this step, tested is an electrical coupling state between the copper post bumps 5 and the bumps 1e. In this second probe test, conduction between the bumps 1e (electrodes) is checked while supporting the wafer 8 with the carrier 11 being attached to the wafer 8 and at the same time, electrically short-circuiting between the copper post bumps 5 (electrodes).

In short, the second probe test is conducted to determine whether each of the through-electrodes 1c formed in the wafer 8 (chip) is defective or non-defective. In other words, the second probe test is conducted in order to determine whether the conduction of each (each one) of the through-electrodes 1c is secured or not or whether the through-electrodes 1c which should not essentially be electrically short-circuited are short-circuited or not.

The copper post bumps 5 are short-circuited by bringing the conductive film member 20 into contact with the copper post bumps 5 so as to electrically couple any two of the copper post bumps to each other.

The purpose of the second probe test is similar to that described in First Embodiment so that description of it is omitted.

Figure 25:
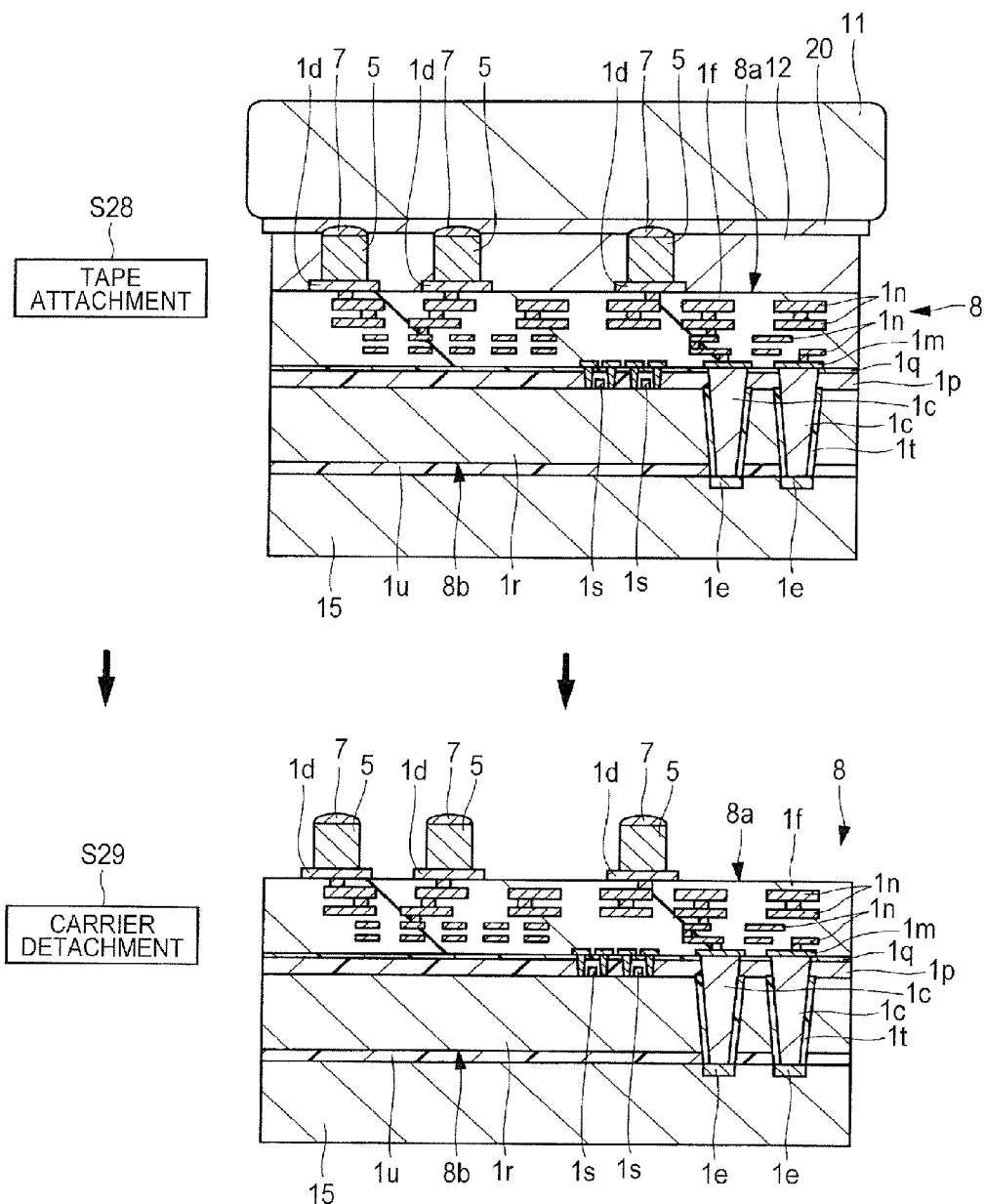
FIG. 25 includes partial cross-sectional view respectively showing examples of the structure after tape attachment and that after wafer support (carrier) detachment in the fabrication of the semiconductor device of Second Embodiment.

After completion of the second probe test, tape attachment as shown in Step S28 of FIG. 25 is conducted. In this step, the back surface (second surface) 8b of the wafer 8 subjected to the second probe test is attached to a dicing tape 15.

Next, wafer support (carrier) detachment as shown in Step S29 is conducted. In this step, the carrier (support member 11) attached to the side of the surface 8a of the wafer 8 is detached (removed) from the wafer 8 which has finished the second probe test and to which the dicing tape 15 has been attached. The adhesive 12 is also removed together with the carrier 11.

Next, dicing is conducted. Steps from dicing to completion of the fabrication of the semiconductor device in Second Embodiment are similar to steps from dicing of Step S12 (FIG. 17) to operation test of Step S16 (FIG. 21) in First Embodiment so that the overlapping description of them is omitted.

Among some characteristics of Second Embodiment, the main one is that the second probe test is conducted while short-circuiting between the copper post bumps 5 with the conductive film member 20 attached to the carrier 11.

This makes it possible to omit the step of First Embodiment, that is, a step of sputtering for forming the conductive film 10 as shown in FIG. 7. In addition, since the conductive film 10 is not formed, the removing step of the sputter film (conductive film 10) becomes unnecessary. In short, the formation step and the removal step of the conductive film 10 can be omitted so that manufacturing steps of the semiconductor device can be reduced. Moreover, the possibility of causing problems such as remnant of the sputter film and etching damage to the copper post bump in the removal step can be excluded. As a result, the semiconductor device thus manufacture has a stable quality.

Modification Example 1

Figure 26:
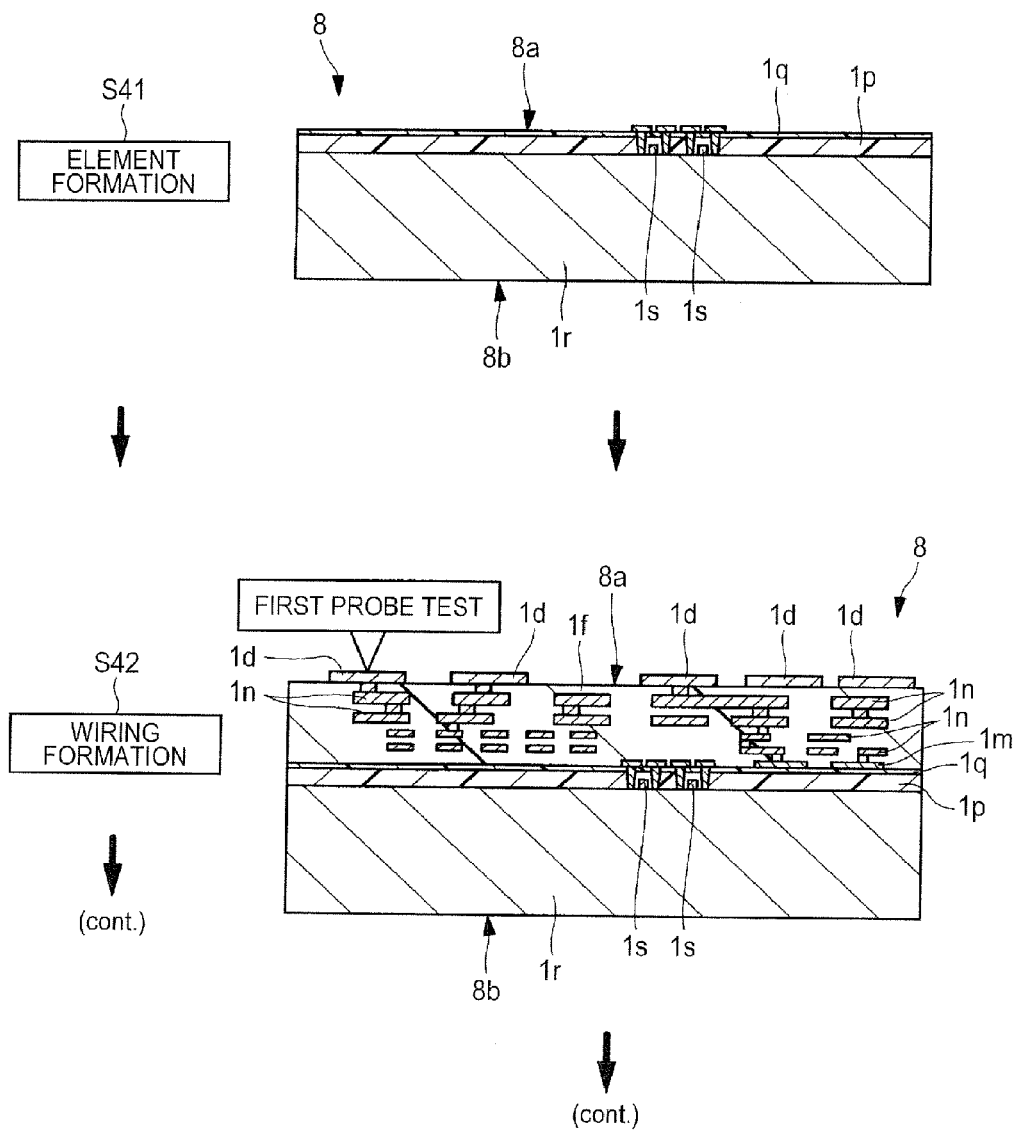
FIG. 26 includes partial cross-sectional views respectively showing the structure after element formation and that after wiring formation in the fabrication of a semiconductor device according to Modification Example 1 of Second Embodiment.
Figure 27:
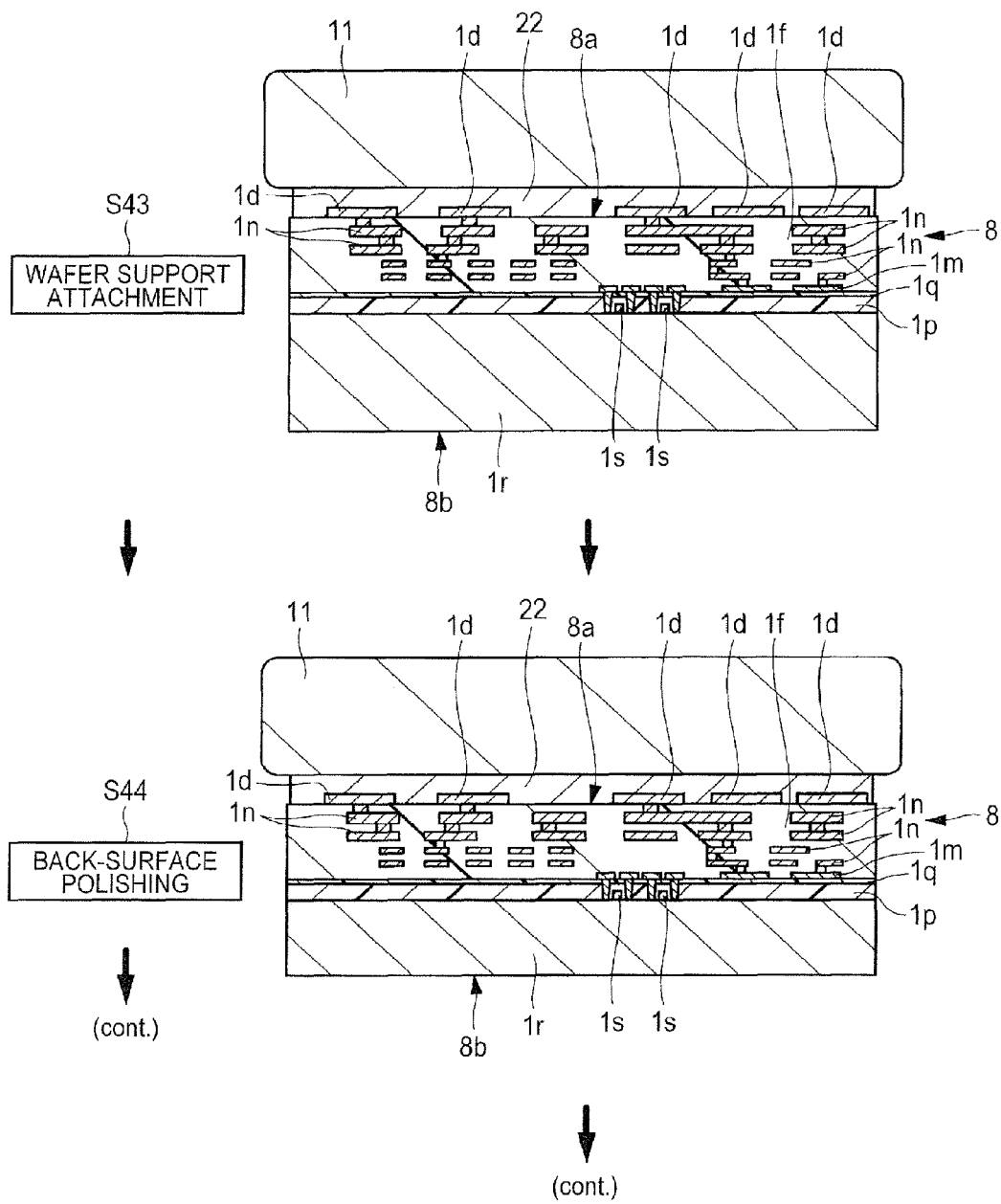
FIG. 27 includes partial cross-sectional views respectively showing the structure after wafer support (carrier) attachment and that after back-surface polishing in the fabrication of the semiconductor device according to Modification Example 1 of Second Embodiment.
Figure 28:
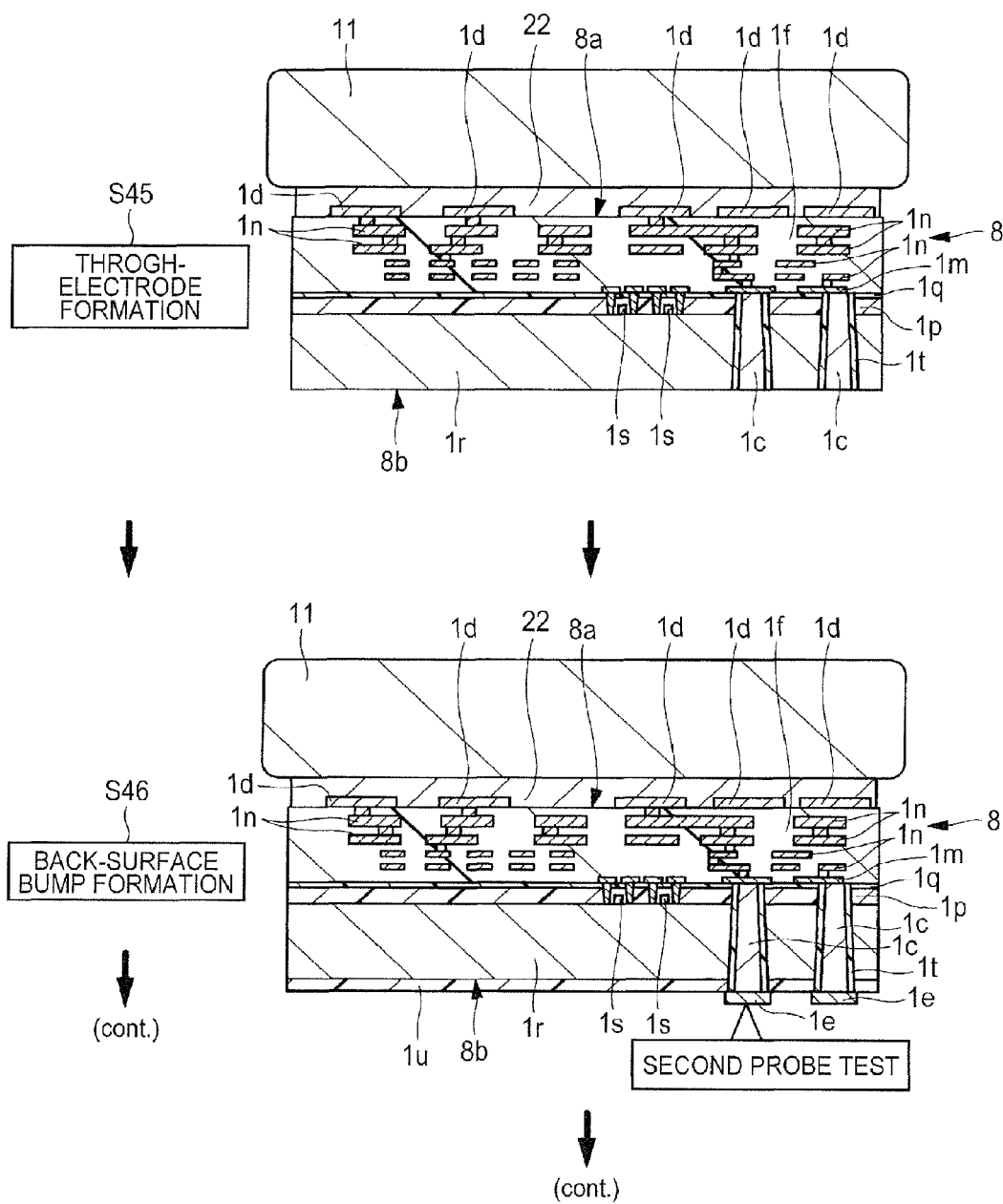
FIG. 28 includes partial cross-sectional views respectively showing the structure after through-electrode formation and that after back-surface bump formation in the fabrication of the semiconductor device according to Modification Example 1 of Second Embodiment.

FIG. 26 includes partial cross-sectional views respectively showing the structure after element formation and that after wiring formation in the fabrication of a semiconductor device according to Modification Example 1 of Second Embodiment; and FIG. 27 includes partial cross-sectional views respectively showing the structure after wafer support (carrier) attachment and that after back-surface polishing in the fabrication of the semiconductor device according to Modification Example 1 of Second Embodiment. FIG. 28 includes partial cross-sectional views respectively showing the structure after through-electrode formation and that after back-surface bump formation in the fabrication of the semiconductor device according to Modification Example 1 of Second Embodiment; and FIG. 29 includes partial cross-sectional views respectively showing the structure after tape attachment and that after copper post bump formation in the fabrication of the semiconductor device according to Modification Example 1 of Second Embodiment.

The semiconductor device according to Modification Example 1 of Second Embodiment is a BGA 6 similar to that of First Embodiment. This means that the BGA 6 according to Modification Example 1 of Second Embodiment is a chip stacked type semiconductor device obtained by stacking a plurality of semiconductor chips on the package substrate 3.

The structure of the BGA 6 according to Modification Example 1 of Second Embodiment is similar to that of the BGA 6 according to First Embodiment so that the overlapping description of it is omitted.

Next, a method of manufacturing the semiconductor device according to Modification Example 1 of Second Embodiment will be described.

The main characteristic of the method of manufacturing the semiconductor device according to Modification Example 1 of Second Embodiment is that a plurality of copper post bumps is formed after a second probe test and the second probe test is conducted, before formation of the copper post bumps, while short-circuiting between pads with a conductive adhesive applied to a carrier.

First, element formation as shown in Step S41 of FIG. 26 is conducted. In this step, an element 1s is formed in the surface (first surface) 8a of a wafer 8 which is a semiconductor substrate. More specifically, the element 1s such as transistor is formed in the surface layer comprised of an insulating layer 1p and a protecting film 1q on a base substrate 1r made of silicon.

Next, wiring formation as shown in Step S42 is conducted. In this step, a metal layer (second circuit layer) 1n is formed in an insulating layer 1f on the surface 8a. This means that a plurality of metal layers 1n is formed on the metal layer 1m. The metal layer 1n is comprised of a plurality of wiring layers and these wiring layers have therebetween an interlayer insulating film.

A plurality of pads 1d electrically coupled to the metal layer 1n is formed on the insulating layer 1f. The pad 1d is, for example, a pad made of aluminum (Al).

Next, a first probe test as shown in FIG. 26 (Step S42) is conducted. Described specifically, after formation of a plurality of pads 1d, probing is conducted to these pads 1d (by applying an unillustrated test probe thereto) to conduct the first probe test which is an electrical test. This first probe test is conducted to determine whether the logic chip 1 formed on the wafer is defective or non-defective and this test is conducted on a plurality of the logic chips 1 formed in a chip region of the wafer 8.

Next, wafer support (carrier) attachment as shown in Step S43 of FIG. 27 is conducted. In this step, the side of the surface (first surface) 8a of the wafer 8 is attached to a carrier (support member) 11. This attachment of the surface 8a of the wafer 8 to the carrier 11 is conducted by attaching the wafer 8 to the carrier 11 via a conductive adhesive 22. At this time, the side of the surface 8a of the wafer 8 is attached to the carrier 11 via the conductive adhesive 22 so as to bring the conductive adhesive 22 into contact with each of the pads 1d.

The pads 1d formed on the surface 8a of the wafer 8 are therefore electrically coupled (short-circuited) to each other via the conductive adhesive 22.

The carrier 11 is, for example, a glass carrier made of quartz glass.

Next, back-surface polishing (grinding, back grinding) as shown in Step S44 of FIG. 27 is conducted. In this step, the back surface (second surface) 8b of the wafer 8 opposite to the surface 8a is polished (ground) while attaching the side of the surface 8a of the wafer 8 to the carrier 11, and the wafer 8 is therefore ground into a desired thickness. Polishing conducted at this time is, for example, polishing, chemical etching, or the like.

Next, through-electrode formation of Step S45 of FIG. 28 is conducted. In this step, a plurality of through-electrodes 1c is formed in the wafer 8 so that one end of each of the through electrodes 1c is coupled to a metal layer 1m. The surface of each of the through-electrodes 1c is covered with an insulating film it such as $SiO_2$ (also including TiN) in order to prevent diffusion of the through-electrode 1c. The electrode pitch between these through-electrodes 1c is, for example, about 40 μm.

Next, back-surface bump formation as shown in Step S46 of FIG. 28 is conducted. First, in this step, an insulating film 1u is formed around the end of the through-electrodes 1c exposed from the back surface 8b of the wafer 8. This insulating film 1u is, for example, an $SiO_2$ (also including TiN) film. Then, bumps (second electrodes) 1e are formed, respectively, on the ends of the through-electrodes 1c exposed from the side of the back surface 8b. The bumps 1e are made, for example, by plating. In many cases, the bumps 1e are made of, for example, gold (Au).

Thus, a plurality of the bumps 1e is formed on the back surface 8b of the wafer 8. Since the bumps 1e are formed on the ends of the through-electrodes 1c exposed from the back surface 8b of the wafer 8, respectively, the electrode pitch between the bumps 1e is equal to that of the through-electrodes 1c. On the surface and back surface of the wafer 8, the electrode pitch between the pads 1d and the electrode pitch between the bumps 1e satisfy the following relationship: (former electrode pitch)>(latter electrode pitch).

Next, a second probe test as shown in FIG. 28 (Step S46) is conducted. In this step, tested is an electrical coupling state (conduction state) between the pads 1d and the bumps 1e. In this second probe test, electrode conduction between the bumps 1e is checked while supporting the wafer 8 by the carrier 11 attached to the wafer 8 and at the same time, electrically short-circuiting between the pads 1d (electrodes).

In short, the second probe test is conducted to determine whether each of the through-electrodes 1c formed in the wafer 8 (chip) is defective or non-defective. In other words, the second probe test is conducted in order to determine whether the conduction of each (each one) of the through-electrodes 1c is secured or not or whether the through-electrodes 1c which should not essentially be electrically short-circuited are short-circuited or not.

Second Embodiment is characterized in that prior to formation of the copper post bumps 5, the second probe test is conducted while electrically short-circuiting between the pads with the conductive adhesive 22.

The purpose of the second probe test is similar to that described in First Embodiment so that description of it is omitted.

Figure 29:
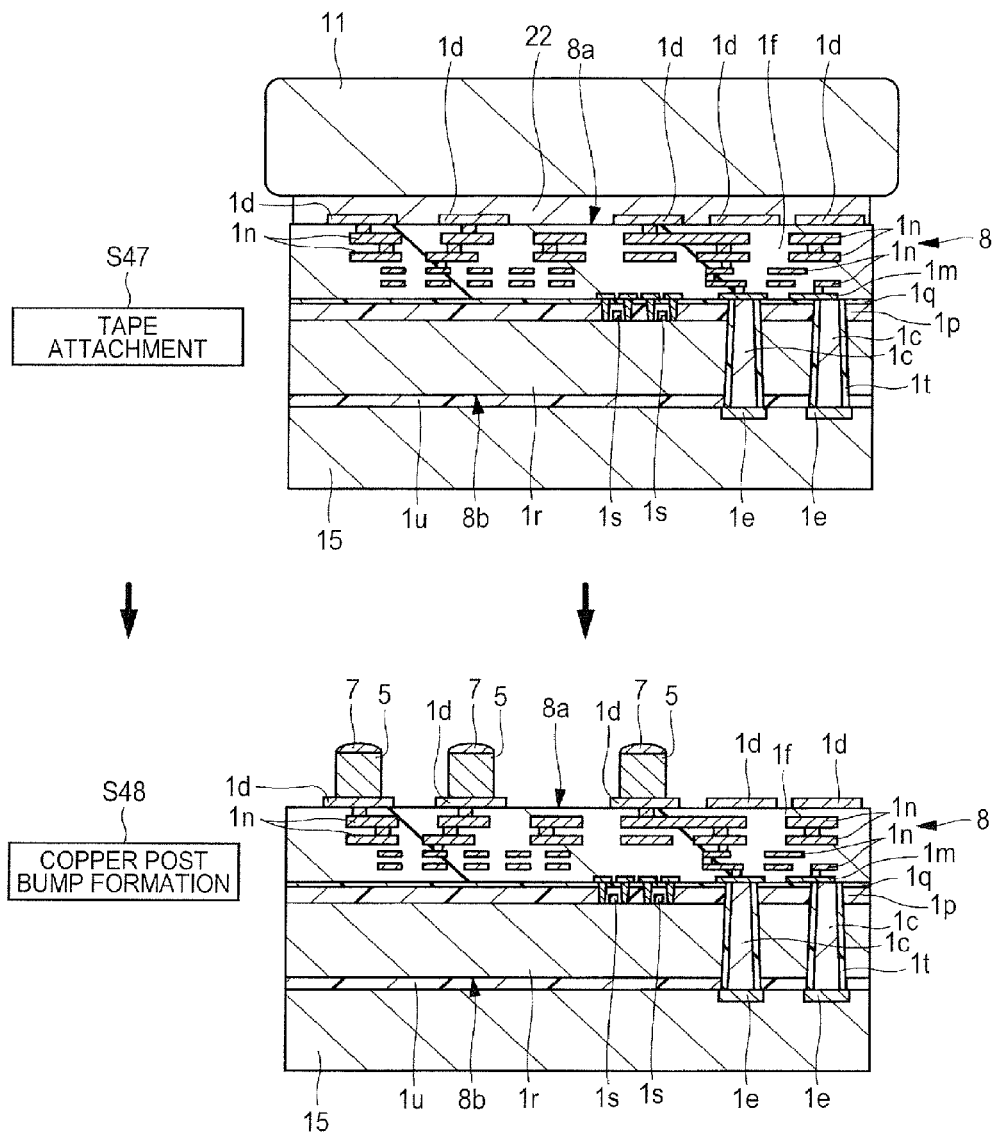
FIG. 29 includes partial cross-sectional views respectively showing the structure after tape attachment and that after copper post bump formation in the fabrication of the semiconductor device according to Modification Example 1 of Second Embodiment.

After completion of the second probe test, tape attachment as shown in Step S47 of FIG. 29 is conducted. In this step, the side of the back surface (second surface) 8b of the wafer 8 subjected to the second probe test is attached to a dicing tape 15.

Next, detachment of the carrier 11 is conducted. Described specifically, the carrier (support member 11) attached via the conductive adhesive 22 to the side of the surface 8a of the wafer 8 which has finished the second probe test and to which the dicing tape 15 has been attached is detached (removed) from the wafer 8 before dicing. The conductive adhesive 22 is also removed together with the carrier 11.

Next, copper post bump formation shown in Step S48 of FIG. 29 is conducted. In this step, a plurality of copper post bumps (first electrodes) 5 which are protruding electrodes and electrically coupled to the pad 1d is formed. Described specifically, copper post bumps 5 which are protruding electrodes are formed on the pads 1 formed on the insulating layer 1f. The copper post bumps 5 are post-shaped electrodes each made of Cu. The copper post bumps 5 have thereon solders 7, respectively.

The copper post bumps 5 are provided, for example, at a pitch of 100 μm or less. This means that the number of terminals of the through-electrodes 1c necessary on the side of the memory chip is greater than the number of the copper post bumps 5 to be coupled to the side of the package substrate.

Next dicing is conducted. Steps from dicing to completion of the fabrication of the semiconductor device according to Modification Example 1 of Second Embodiment are similar to steps from dicing of Step S12 (FIG. 17) to operation test of Step S16 (FIG. 21) according to First Embodiment so that the overlapping description of them is omitted.

Among some characteristics of Modification Example 1 of Second Embodiment, the main one is that the second probe test is conducted while short-circuiting between the pads 1d with the conductive adhesive 22 and after completion of the second probe test, copper post bumps 5 are formed on the pads 1d, respectively.

Compared with Second Embodiment, it is therefore possible to prevent breaking (crushing) or loss of the copper post bumps at the time of wafer support (carrier) attachment in Step S43 because the copper post bumps 5 are formed after completion of the second probe test.

Moreover, at the time of attachment of the wafer support, since the copper post bumps 5 have not been formed yet, the adhesion thickness of the conductive adhesive 22 can be made smaller compared with that when the copper post bumps 5 are formed before attachment. The adhesion thickness of the conductive adhesive 22 is preferably as small as possible in consideration of the wafer back-surface polishing step of Step S44 conducted subsequently. This means that if a plurality of copper post bumps 5 has already been formed, the conductive adhesive 22 should have an adhesion thickness great enough to absorb the variation in bump height of the copper post bumps. As the adhesion thickness of the conductive adhesive 22 becomes greater, the variation in adhesion thickness tends to increase. The variation in adhesion thickness should be reduced because it has an influence on the finish of the wafer back-surface polishing step in Step S44, that is, the wafer thickness. The thickness of the logic chip 1 is desirably as thin as 50 μm so that in this sense, the adhesion thickness should be decreased. The adhesion thickness of the conductive adhesive 22 is therefore preferably as thin as possible.

Moreover, bringing a probe needle into contact with not the copper post bumps 5 but the pads 1d is also advantageous. The copper post bumps 5 have, on the end thereof, a solder 7 and when the probe needle is brought into contact with the copper post bumps 5, a scraped portion of the solder 7 deposits on the end of the probe needle and is oxidized. This tends to lead to an increase in contact resistance. It is therefore possible to prevent an increase in contact resistance, which will otherwise be caused by the solder 7, by bringing the probe needle into contact with the pads 1d.

Moreover, the pads 1d are each made of aluminum (Al) so that popularly used ones such as cantilever type probe needles or pogo pin type probe needles having a crown-shaped tip can be used. This means that there is no need of specially providing probe needles exclusively used for the copper post bumps.

Modification Example 2

Figure 30:
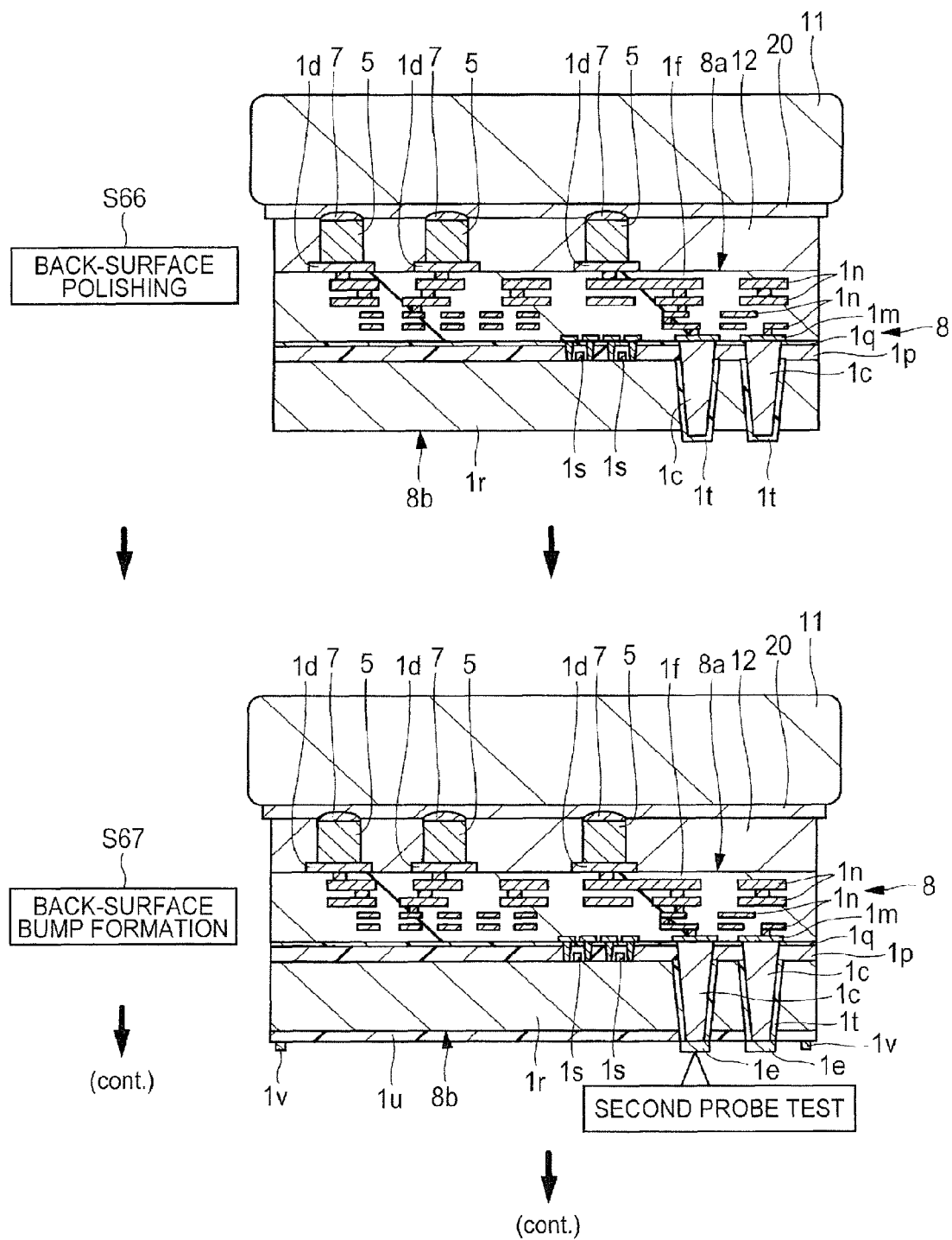
FIG. 30 includes partial cross-sectional views respectively showing the structure after back-surface polishing and that after back-surface bump formation in the fabrication of a semiconductor device according to Modification Example 2 of Second Embodiment.
Figure 31:
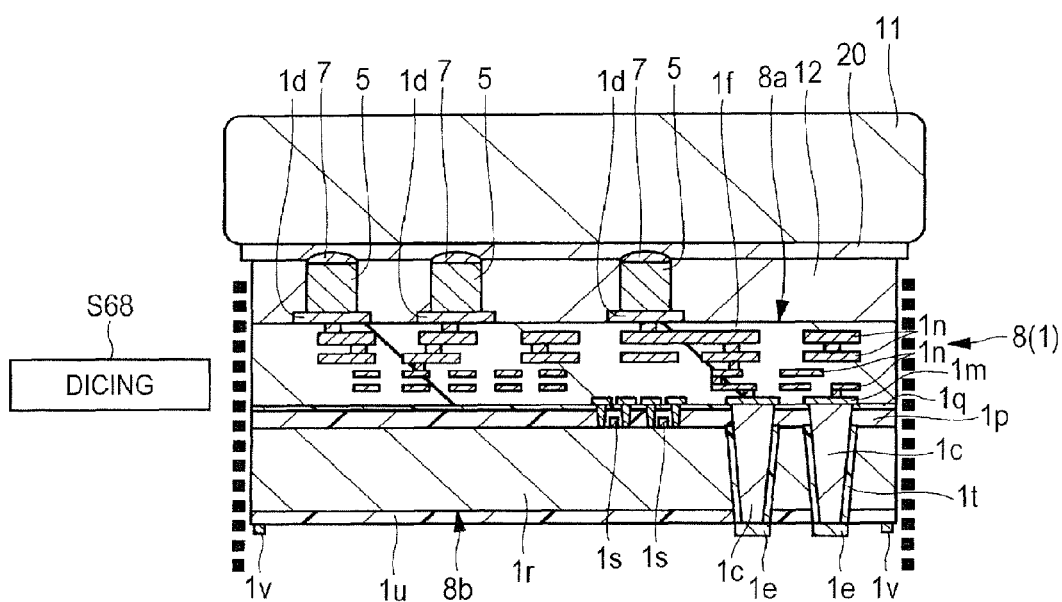
FIG. 31 is a partial cross-sectional view showing the structure after dicing in the fabrication of the semiconductor device according to Modification Example 2 of Second Embodiment.

FIG. 30 includes partial cross-sectional views respectively showing the structure after back-surface polishing and that after back-surface bump formation in the fabrication of a semiconductor device according to Modification Example 2 of Second Embodiment; and FIG. 31 is a partial cross-sectional view showing the structure after dicing in the fabrication of the semiconductor device according to Modification Example 2 of Second Embodiment.

The semiconductor device according to Modification Example 2 of Second Embodiment is a BGA 6 similar to that of First Embodiment. This means that also the BGA 6 according to Modification Example 2 of Second Embodiment is a chip stacked type semiconductor device obtained by stacking semiconductor chips on the package substrate 3.

The structure of the BGA 6 according to Modification Example 2 of Second Embodiment is similar to that of the BGA 6 of First Embodiment so that the overlapping description of it is omitted.

A method of manufacturing the semiconductor device according to Modification Example 2 of Second Embodiment will next be described.

The main characteristic of the semiconductor device according to Modification Example 2 of Second Embodiment is that dicing (forming individual chips) after the second probe test is conducted while supporting the wafer with a carrier without using a dicing tape.

The steps from Step S61 (element formation) to Step S66 (back-surface polishing) in the method of manufacturing the semiconductor device according to Modification Example 2 of Second Embodiment are similar to the steps from Step S21 (element formation) to Step S26 (back-surface polishing) in Second Embodiment so that the overlapping description of them is omitted.

First, the steps from Step S61 to Step S66 are conducted, followed by back-surface bump formation as shown in Step S67 of FIG. 30. In this step, an insulating film 1u is formed around the end of the through-electrodes 1c exposed from the back surface 8b of the wafer 8. This insulating film 1u is, for example, an $SiO_2$ (also including TiN) film. Then, bumps (second electrodes) 1e are formed, respectively, on the ends of the through-electrodes 1c exposed from the side of the back surface 8b. The bumps 1e are made, for example, by plating. In many cases, the bumps 1e are made of, for example, gold (Au).

Thus, a plurality of the bumps 1e is formed on the back surface 8b of the wafer 8. Since the bumps 1e are formed on the ends of the through-electrodes 1c exposed from the back surface 8b of the wafer 8, respectively, the electrode pitch between the bumps 1e is equal to that between the through-electrodes 1c. On the surface and back surface of the wafer 8, the electrode pitch between the copper post bumps 5 and the electrode pitch between the bumps 1e satisfy the following relationship: (the former electrode pitch)>(the latter electrode pitch).

In Modification Example 2 of Second Embodiment, simultaneously with formation of the bumps 1e, a dicing pattern 1v corresponding to each chip region is formed on the back surface 8b of the wafer 8.

Next, a second probe test as shown in FIG. 30 (Step 67) is conducted. In this step, tested is an electrical coupling state (conduction state) between the copper post bumps 5 and the bumps 1e. In this second probe test, conduction between the bumps 1e (electrodes) is checked while supporting the wafer 8 with the carrier 11 being attached to the wafer 8 and at the same time, electrically short-circuiting between the copper post bumps 5 (electrodes).

In short, the second probe test is conducted to determine whether each of the through-electrodes 1c formed in the wafer 8 (chip) is defective or non-defective. In other words, the second probe test is conducted in order to determine whether the conduction of each (each one) of the through-electrodes 1c is secured or not or whether the through-electrodes 1c which should not essentially be electrically short-circuited are short-circuited or not.

Short-circuiting between the copper post bumps 5 is achieved by bringing the conductive film member 20 into contact with the copper post bumps 5 so as to electrically couple the copper post bumps 5 to each other.

The purpose of the second probe test is similar to that described in First Embodiment so that description of it is omitted.

After completion of the second probe test, dicing as shown in Step S68 of FIG. 31 is conducted. In this step, a plurality of non-defective semiconductor chips (meaning logic chips 1) is obtained by dicing the wafer 8 supported by the carrier 11 from the side of the back surface 8 without using a dicing tape. In other words, without using a dicing tape, dicing is conducted from the side of the back surface 8b of the wafer 8 while supporting the wafer by the carrier 11. At the time of dicing, dicing is conducted from the side of the back surface 8b (from the side of the end of the through-electrode 1c) with the dicing pattern 1v formed on the back surface 8b as a mark.

In this step, the carrier 11 is used instead of the dicing tape. Since the carrier 11 supporting the wafer is not replaced with the dicing tape, the damage of the wafer 8 which will otherwise occur by this replacement can be prevented or reduced. Moreover, no replacement work with the dicing tape is necessary prior to dicing so that the working time can be reduced.

Next, the wafer 8 is removed from the carrier 11 and at the same time, the adhesive 12 is removed from the surface 8a of the wafer 8 to obtain a non-defective semiconductor chip.

Next, flip chip packaging is conducted. Steps of Modification Example 2 of Second Embodiment from the flip chip packaging to the completion of the semiconductor device are similar to the steps of First Embodiment from the flip chip packaging (FIG. 18) in Step 13 to the operation test (FIG. 21) of Step S16 so that the overlapping description of them is omitted.

In Modification Example 2 of Second Embodiment, since dicing is conducted while supporting the wafer with the carrier 11 without using the dicing tape which is, on the other hand, used in Second Embodiment, the replacement work of the carrier 11 of the wafer 8 with the dicing tape can be omitted. As a result, damage of the wafer 8 which will otherwise be caused by the replacement can be prevented or reduced. Moreover, the replacement work with the dicing tape prior to dicing is not necessary so that the working time can be reduced.

Third Embodiment

Figure 32:
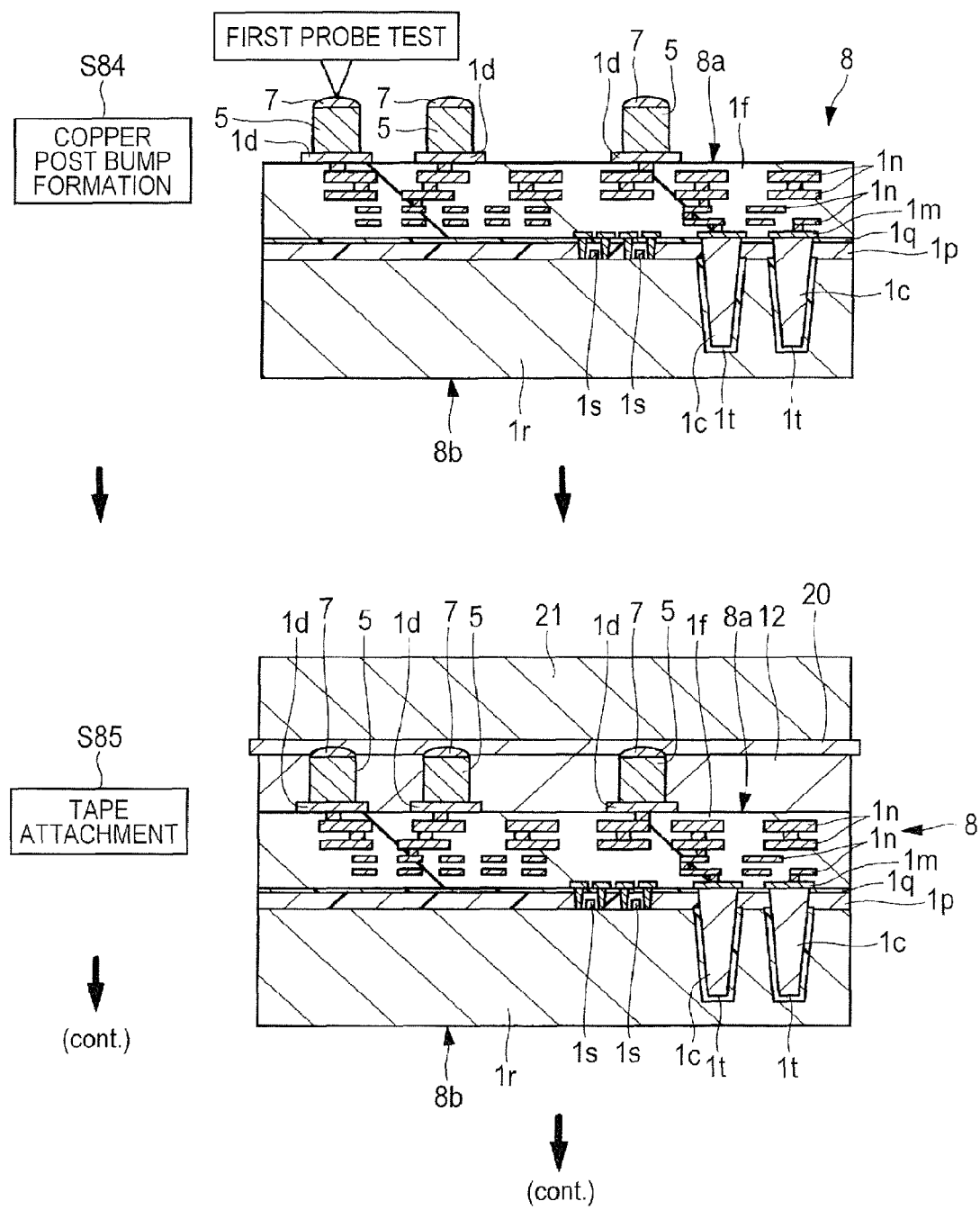
FIG. 32 includes partial cross-sectional views respectively showing examples of the structure after copper post bump formation and that after tape attachment in the fabrication of a semiconductor device according to Third Embodiment.
Figure 33:
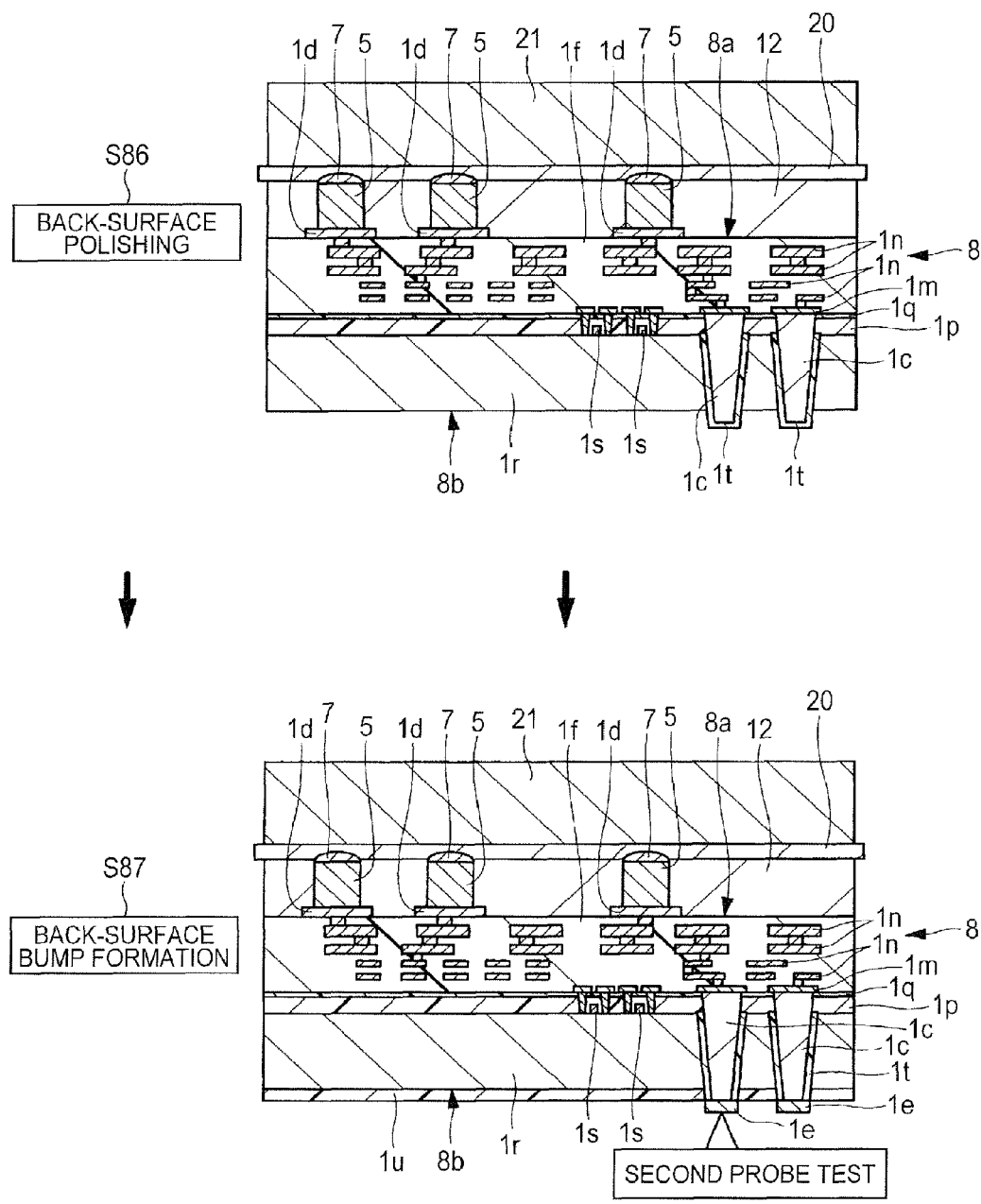
FIG. 33 includes partial cross-sectional views respectively showing examples of the structure after back-surface polishing and that after back-surface bump formation in the fabrication of the semiconductor device according to Third Embodiment.

FIG. 32 includes partial cross-sectional views respectively showing examples of the structure after copper post bump formation and that after tape attachment in the fabrication of a semiconductor device according to Third Embodiment; and FIG. 33 includes partial cross-sectional views respectively showing examples of the structure after back-surface polishing and that after back-surface bump formation in the fabrication of the semiconductor device according to Third Embodiment.

The semiconductor device of Third Embodiment is a BGA 6 similar to that of First Embodiment. This means that the BGA 6 of Third Embodiment is a chip stacked type semiconductor device obtained by stacking a plurality of semiconductor chips on the package substrate 3.

The structure of the BGA 6 of Third Embodiment is similar to that of BGA 6 of First Embodiment so that the overlapping description of it is omitted.

Next, a method of manufacturing the semiconductor device of Third Embodiment will be described.

The main characteristic of the method of manufacturing the semiconductor device of Third Embodiment is that a BGA tape is used instead of a carrier and the second probe test is conducted while supporting a wafer with the BG tape.

Steps from Step S81 (element formation) to Step S84 (copper post bump formation) in the method of manufacturing the semiconductor device of Third Embodiment are similar to steps of First Embodiment from Step S1 (element formation) to Step S4 (copper post bump formation) so that the overlapping descriptions of them is omitted.

First, the above-mentioned steps from Step S81 to Step S84 (FIG. 32) are conducted, followed by tape attachment as shown in Step S85 of FIG. 32. In this step, the side of the surface (first surface) 8a of the wafer 8 is attached to a BG (back grinding) tape 21. This means that in Third Embodiment, the BG tape 21 is used as a support member. The BG tape 21 has, on one of the surfaces, a conductive film member 20 attached so that attachment of the surface 8a of the wafer 8 to the BG tape 21 is conducted by attaching the side of the surface 8a of the wafer 8 to the BG tape 21 with an adhesive 12 so as to bring the conductive film member 20 into contact with each of the copper post bumps 5.

By this step, the copper post bumps 5 formed on the surface 8a of the wafer 8 are electrically coupled to each other (electrically short-circuited) via the conductive film member 20.

The adhesive 12 used here is, for example, an organic adhesive. The adhesive is not limited to it and a conductive adhesive or the like may be used.

Next, back-surface polishing (grinding, back grinding) as shown in Step S86 of FIG. 33 is conducted. At this time, the back surface (second surface) 8b of the wafer 8 opposite to the surface 8a is polished (ground, back ground) while attaching the side of the surface 8a of the wafer 8 to the BG tape 21, to expose an end (a portion) of each of through-electrodes 1c formed in advance. Polishing used here is, for example, polishing, chemical etching, or the like.

Next, back-surface bump formation as shown in Step S87 is conducted. First, in this step, an insulating film $1u$ is formed around the end of the through-electrodes $1c$ exposed from the back surface $8b$ of the wafer 8. This insulating film $1u$ is, for example, an $SiO_2$ (also including TiN) film. Then, bumps (second electrodes) $1e$ are formed, respectively, on the ends of the through-electrodes $1c$ exposed from the side of the back surface $8b$. The bumps $1e$ are made, for example, by plating. In many cases, the bumps $1e$ are made of, for example, gold (Au).

Thus, a plurality of the bumps $1e$ is formed on the back surface $8b$ of the wafer 8. Since the bumps $1e$ are formed on the ends of the through-electrodes $1c$ exposed from the back surface $8b$ of the wafer 8, respectively, the electrode pitch between the bumps $1e$ is equal to that between the through-electrodes $1c$. On the surface and back surface of the wafer 8, the electrode pitch between the copper post bumps 5 and the electrode pitch between the bumps $1e$ (through-electrodes $1c$) satisfy the following relationship: (the former electrode pitch)>(the latter electrode pitch).

Next, a second probe test as shown in FIG. 33 (Step S87) is conducted. In this step, tested is an electrical coupling state (conduction state) between the copper post bumps 5 and the bumps $1e$. In this second probe test, conduction between the bumps $1e$ (electrodes) is checked while supporting the wafer 8 with the BG tape 21 being attached to the wafer 8 and at the same time, electrically short-circuiting between the copper post bumps 5 (electrodes) with the conductive film member 20.

In short, the second probe test is conducted to determine whether each of the through-electrodes $1c$ formed in the wafer 8 (chip) is defective or non-defective. In other words, the second probe test is conducted in order to determine whether the conduction of each (each one) of the through-electrodes $1c$ is secured or not or whether the through-electrodes $1c$ which should not essentially be electrically short-circuited are short-circuited or not.

Electrical short-circuiting between the copper post bumps 5 is achieved by bringing the conductive film member 20 into contact with the copper post bumps 5 so as to electrically couple the copper post bumps 5 to each other.

The purpose of the second probe test is similar to that described in First Embodiment so that description of it is omitted.

Next, dicing is conducted. Steps of Embodiment 3 from dicing to completion of the fabrication of the semiconductor device are similar to the steps of First Embodiment from dicing (FIG. 17) of Step S12 to operation test (FIG. 21) of Step S16 so that the overlapping description of them is omitted.

Compared with First and Second Embodiments, the method of manufacturing the semiconductor device according to Third Embodiment facilitates attachment and detachment of the BG tape 21 used instead of the carrier. This means that attachment and detachment work of a support member (BG tape 21) can be simplified.

Modification Example 1

Figure 34:
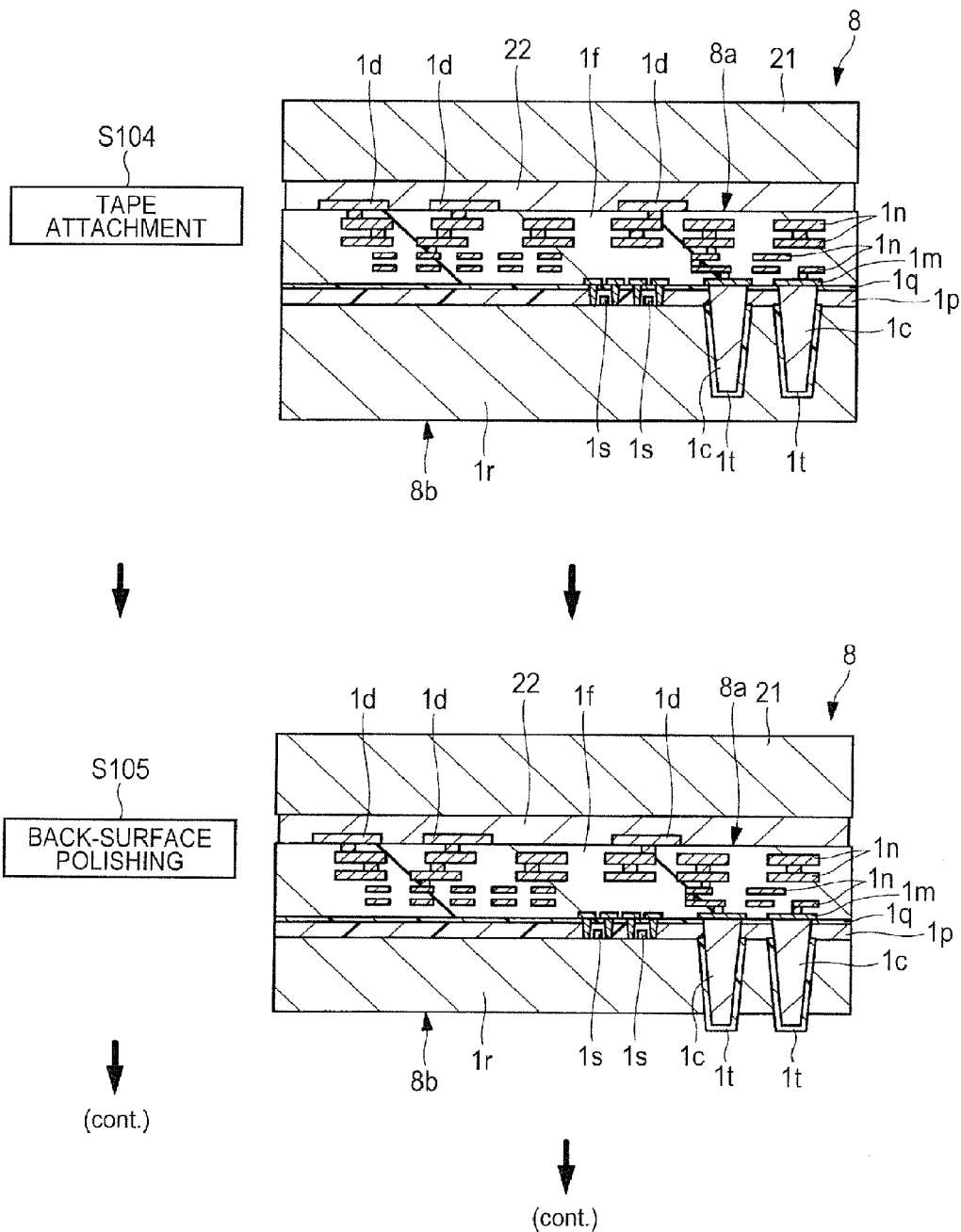
FIG. 34 includes partial cross-sectional views respectively showing the structure after tape attachment and that after back-surface polishing in the fabrication of a semiconductor device according to Modification Example 1 of Third Embodiment.
Figure 35:
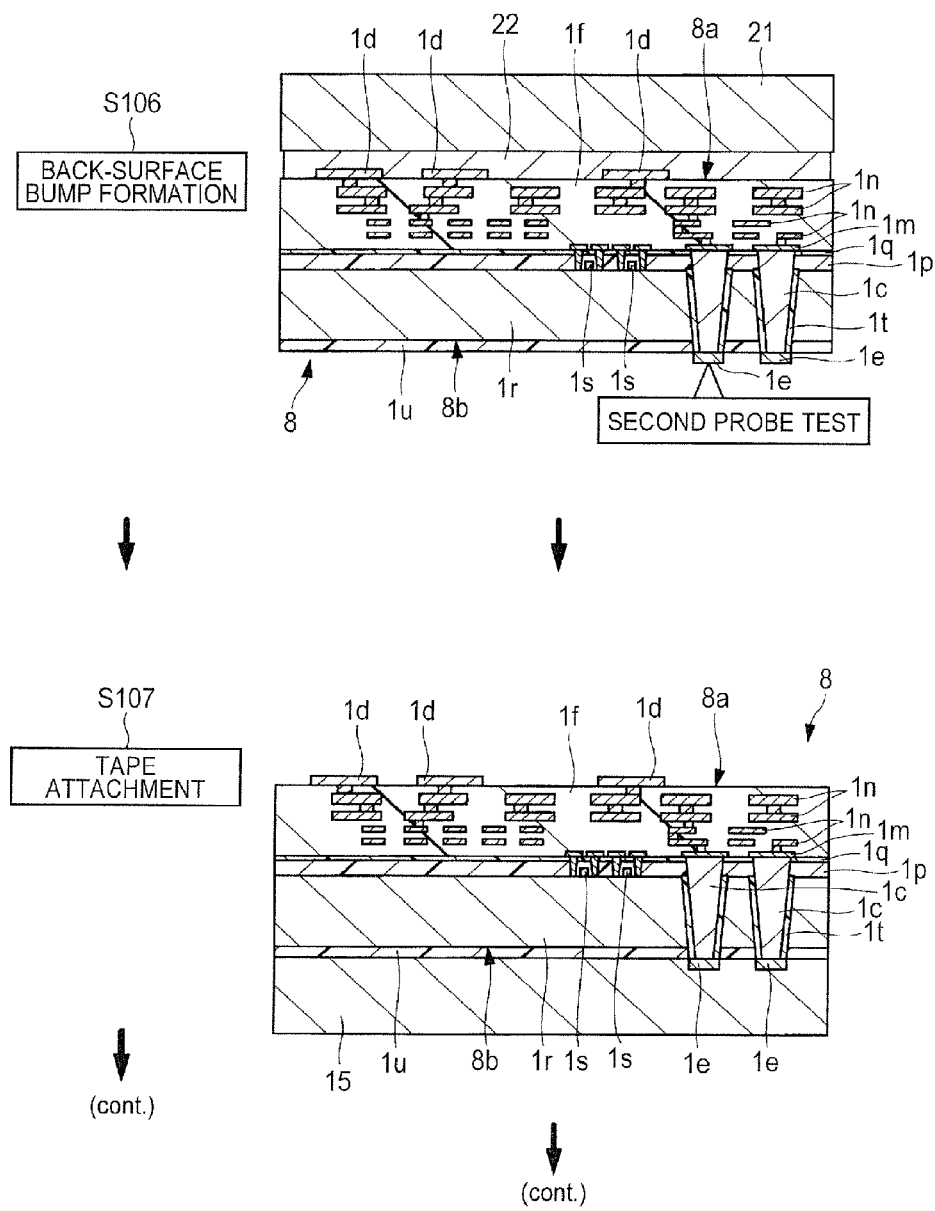
FIG. 35 includes partial cross-sectional views respectively showing the structure after back-surface bump formation and after tape attachment in the fabrication of the semiconductor device according to Modification Example 1 of Third Embodiment.

FIG. 34 includes partial cross-sectional views respectively showing the structure after tape attachment and that after back-surface polishing in the fabrication of a semiconductor device according to Modification Example 1 of Third Embodiment; FIG. 35 includes partial cross-sectional views respectively showing the structure after back-surface bump formation and after tape attachment in the fabrication of the semiconductor device according to Modification Example 1 of Third Embodiment; and FIG. 36 includes partial cross-sectional views respectively showing the structure after copper post bump formation and that after dicing in the fabrication of the semiconductor device according to Modification Example 1 of Third Embodiment.

The structure of a BGA 6 according to Modification Example 1 of Third Embodiment is similar to the BGA 6 of First Embodiment so that the overlapping description of it is omitted.

Next, a method of manufacturing the semiconductor device according to Modification Example 1 of Third Embodiment will be described.

The main characteristic of the method of manufacturing the semiconductor device according to Modification Example 1 of Third Embodiment is that after the second probe test, a plurality of copper post bumps is formed and a BG tape is used instead of the carrier; and that prior to the formation of the copper post bumps, the second probe test is conducted while supporting the wafer with the BG tape.

Steps from Step S101 (element formation) to Step S103 (wiring formation) in the method of manufacturing the semiconductor device according to Modification Example 1 of Third Embodiment are substantially similar to the steps of First Embodiment from Step S1 (element formation) to Step S3 (wiring formation) except that in Step S3 (wiring formation), the pad $1d$ is subjected to the first probe test after wiring formation. The former steps are similar to the latter steps except for it so that the overlapping description of them is omitted.

First, the above-mentioned steps from Step S101 to Step S103 are conducted, followed by tape attachment as shown in Step S104 of FIG. 34. In this step, the side of the surface (first surface) $8a$ of the wafer 8 is attached to a BG tape (support member) 21. At this time, attachment of the surface $8a$ of the wafer 8 to the BG tape 21 is conducted by attaching the wafer 8 to the BG tape 21 via a conductive adhesive 22. At this time, the side of the surface $8a$ of the wafer 8 is attached to the BG tape 21 via the conductive adhesive 22 so as to bring the conductive adhesive 22 and each of the pads $1d$ into contact with each other.

By this step, the pads $1d$ formed on the surface $8a$ of the wafer 8 are electrically coupled to each other (electrically short-circuited) via the conductive adhesive 22.

Next, back-surface polishing (grinding, back grinding) as shown in Step S105 of FIG. 34 is conducted. In this step, the back surface (second surface) $8b$ of the wafer 8 opposite to the surface $8a$ is polished (ground, back ground) while attaching the side of the surface $8a$ of the wafer 8 to the BG tape 21 to expose the end (portion) of each of the through-electrodes $1c$ formed in advance. Polishing at this time is, for example, polishing, chemical etching, or the like.

Then, back-surface bump formation as shown in Step S106 is conducted. First, in this step, an insulating film $1u$ is formed around the end of the through-electrodes $1c$ exposed from the back surface $8b$ of the wafer 8. This insulating film $1u$ is, for example, an $SiO_2$ (also including TiN) film. Then, bumps (second electrodes) $1e$ are formed, respectively, on the ends of the through-electrodes $1c$ exposed from the side of the back surface $8b$. The bumps $1e$ are made, for example, by plating. In many cases, the bumps $1e$ are made of, for example, gold (Au).

Thus, a plurality of the bumps $1e$ is formed on the back surface $8b$ of the wafer 8. Since the bumps $1e$ are formed on the ends of the through-electrodes $1c$ exposed from the back surface $8b$ of the wafer 8, respectively, the electrode pitch between the bumps 1e is equal to that between the through-electrodes 1c. On the surface and back surface of the wafer 8, the electrode pitch between the copper post bumps 5 and the electrode pitch between the bumps 1e (through-electrodes 1c) satisfy the following relationship: (the former electrode pitch)>(the latter electrode pitch).

Next, a second probe test shown in FIG. 35 (Step S106) is conducted. In this step, tested is an electrical coupling state (conduction state) between the copper post bumps 5 and the bumps 1e. In this second probe test, conduction between the bumps 1e (electrodes) is checked while supporting the wafer 8 with the BG tape 21 being attached to the wafer 8 and at the same time, electrically short-circuiting between the copper post bumps 5 (electrodes) with the conductive film member 20.

In short, the second probe test is conducted to determine whether each of the through-electrodes 1c formed in the wafer 8 (chip) is defective or non-defective. In other words, the second probe test is conducted in order to determine whether the conduction of each (each one) of the through-electrodes 1c is secured or not or whether the through-electrodes 1c which should not essentially be electrically short-circuited are short-circuited or not.

Electrical short-circuiting between the pads 1d is achieved by bringing a conductive adhesive 22 into contact with the pads 1d so as to electrically couple the pads to each other.

The purpose of the second probe test is similar to that described above in First Embodiment so that description of it is omitted.

Next, tape attachment as shown in Step S107 of FIG. 35 is conducted. In this step, the BG tape 21 on the side of the surface 8a of the wafer 8 is detached and at the same time, the conductive adhesive 22 is removed. Then, dicing tape 15 is attached to the back surface 8b of the wafer 8. In other words, the BG tape 21 attached via the conductive adhesive 22 to the side of the surface 8a of the wafer 8 which has finished the second probe test is detached from the wafer 8 prior to dicing. At this time, the conductive adhesive 22 is removed together with the BG tape 21. Then the dicing tape 15 is attached to the wafer 8.

Figure 36:
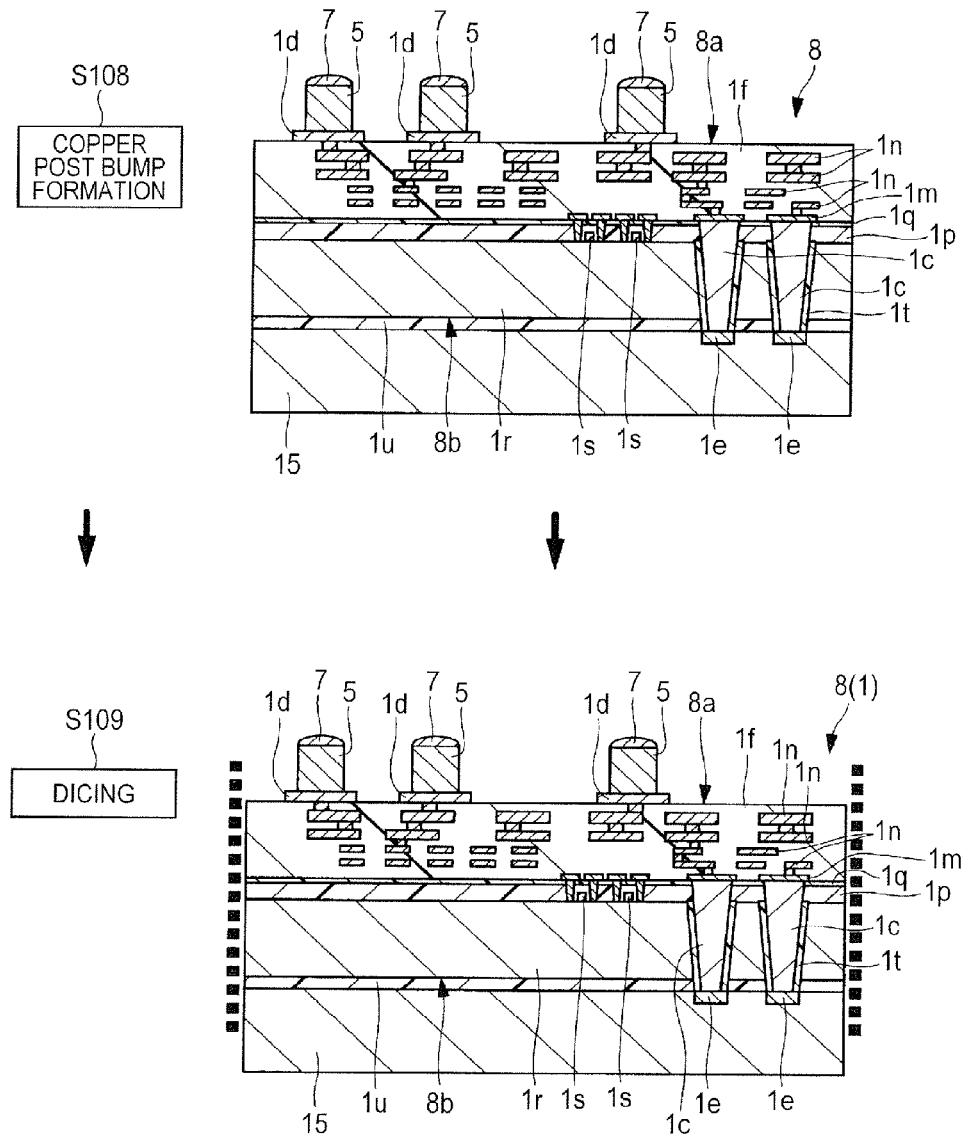
FIG. 36 includes partial cross-sectional views respectively showing the structure after copper post bump formation and that after dicing in the fabrication of the semiconductor device according to Modification Example 1 of Third Embodiment.

Next, copper post bump formation is conducted as shown in Step S108 of FIG. 36 is conducted. In this step, a plurality of copper post bumps (first electrodes) 5, which are protruding electrodes, electrically coupled to the pads 1d is formed. This means that copper post bumps 5 which are protruding electrodes are formed on the pads 1d formed on the insulating layer 1f. The copper post bumps 5 are post-shaped electrodes each made of Cu. The copper post bumps 5 each have thereon a solder 7.

These copper post bumps 5 are provided, for example, at a pitch of 100 μm or less. This means that the number of the terminals of the through-electrodes 1c necessary for the memory chip side is greater than the number of the copper post bumps 5 to be coupled to the package substrate side.

Next, dicing as shown in Step S109 of FIG. 36 is conducted. In this step, the wafer 8 supported with the dicing tape 15 is diced into a plurality of non-defective semiconductor chips (logic chips 1).

Next, flip chip packaging is conducted. Steps from this flip chip packaging to completion of fabrication of the semiconductor device in Modification Example of Third Embodiment are similar to the steps from flip chip packaging (FIG. 18) of Step S13 to operation test (FIG. 21) of Step S16 in First Embodiment so that the overlapping description of them is omitted.

According to the method of manufacturing the semiconductor device according to Modification Example 1 of Third Embodiment in which the BG tape 21 is used instead of the carrier, attachment and detachment works can be carried out more easily compared with the above-described methods of First and Third Embodiments which need attachment/detachment of the carrier. This means that the attachment and detachment works of a support member (BG tape 21) can be simplified in this modification example.

In addition, an advantage similar to that of Modification Example 1 of Second Embodiment can be obtained in Modification Example 1 of Third Embodiment by forming a plurality of the copper post bumps 5 after the second probe test.

Modification Example 2

Figure 37:
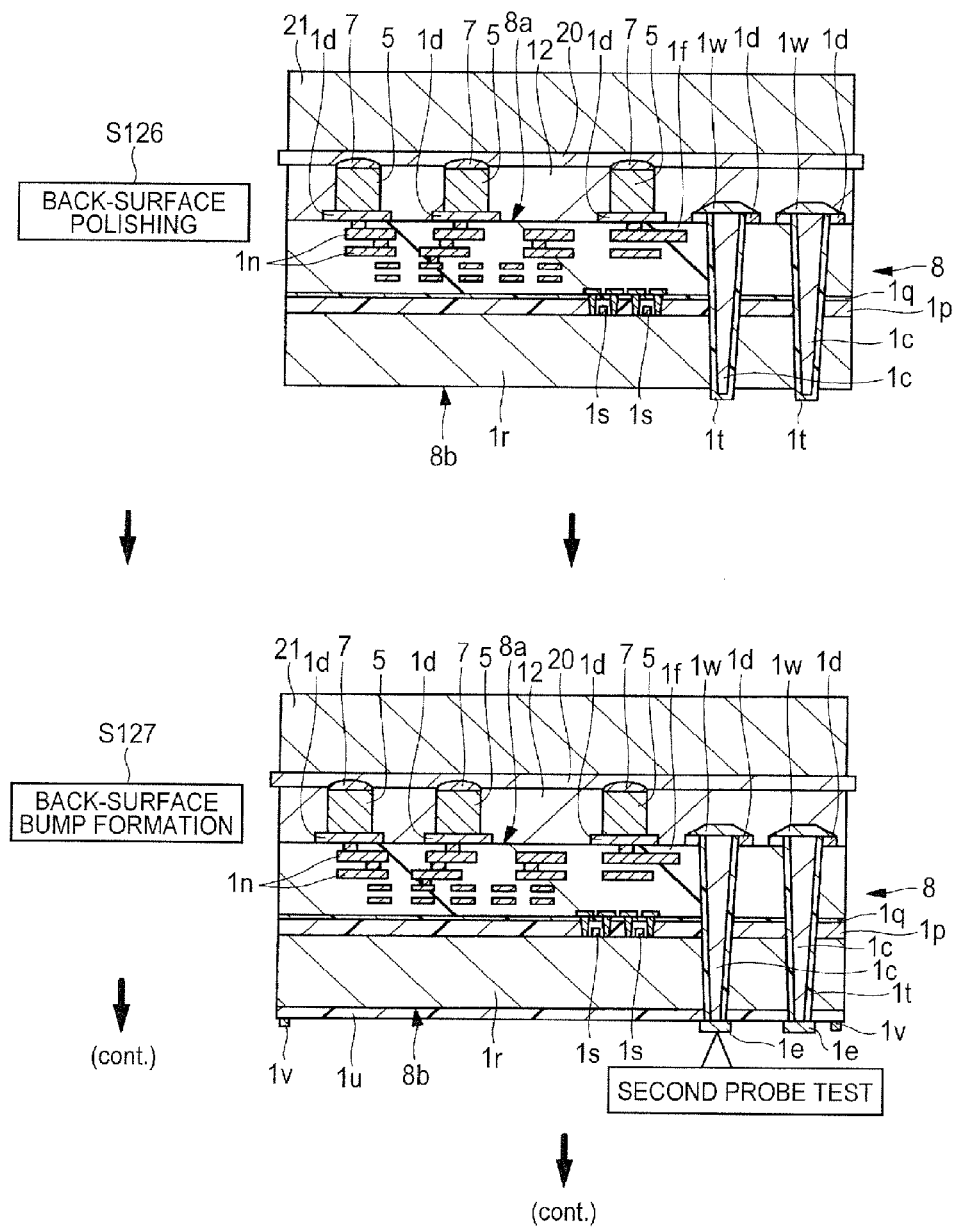
FIG. 37 includes partial cross-sectional views respectively showing the structure after back-surface polishing and that after back-surface bump formation in the fabrication of a semiconductor device according to Modification Example 2 of Third Embodiment.
Figure 38:
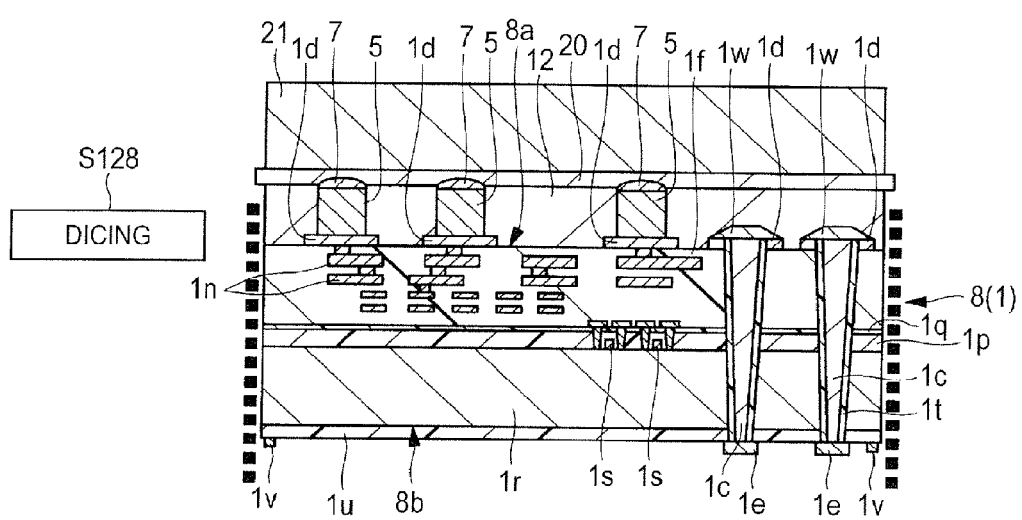
FIG. 38 is a partial cross-sectional view showing the structure after dicing in the fabrication of the semiconductor device according to Modification Example 2 of Third Embodiment.

FIG. 37 includes partial cross-sectional views respectively showing the structures after back-surface polishing and after back-surface bump formation in the fabrication of a semiconductor device according to Modification Example 2 of Third Embodiment; and FIG. 38 is a partial cross-sectional view showing the structure after dicing in the fabrication of the semiconductor device according to Modification Example 2 of Third Embodiment.

The structure of a BGA 6 according to Modification Example 2 of Third Embodiment is similar to that of the BGA 6 according to First Embodiment so that the overlapping description of it is omitted.

Next, a method of manufacturing the semiconductor device according to Modification Example 2 of Third Embodiment will be described.

The main characteristic of the method of manufacturing the semiconductor device according to Modification Example 2 of Third Embodiment is that a BG tape is used instead of a carrier and the second probe test is conducted while supporting the wafer with the BG tape and at the same time, dicing is conducted by using this BG tape instead of a dicing tape.

Steps from Step S121 (element formation) to Step S125 (tape attachment) in the method of manufacturing the semiconductor device according to Modification Example 2 of Third Embodiment are similar to the steps of Third Embodiment from Step S81 (element formation) to Step S85 (tape attachment in FIG. 32) so that the overlapping description of them is omitted.

First, steps from Step S121 to Step S125 are conducted to create a state in which the side of the surface 8a of the wafer 8 has been attached to the BG tape 21 via an adhesive 12 so as to bring the conductive film member 20 and each of the copper post bumps 5 into contact with each other via the solder 7 as shown in FIG. 37.

By this step, the copper post bumps 5 formed on the surface 8a of the wafer 8 are electrically coupled to each other (electrically short-circuited) via the conductive film member 20.

The adhesive 12 used here is, for example, an organic adhesive. The adhesive is not limited to it and a conductive adhesive or the like may be used instead.

Next, back-surface polishing (grinding, back grinding) as shown in Step S126 of FIG. 37 is conducted. In this step, the back surface (second surface) 8b of the wafer 8 on the side opposite to the surface 8a is polished (ground, back ground) to expose the end (a portion) of the through-electrodes 1c formed in advance, while attaching the BG tape 21 to the side of the surface 8a of the wafer 8. The polishing employed at this time is, for example, polishing, chemical etching, or the like.

Next, back-surface bump formation as shown in Step S127 is conducted. First, in this step, an insulating film 1u is formed around the end of the through-electrodes 1c exposed from the back surface 8b of the wafer 8. This insulating film 1u is, for example, an $SiO_2$ (also including TiN) film. Then, bumps (second electrodes) 1e are formed, respectively, on the ends of the through-electrodes 1c exposed from the side of the back surface 8b. The bumps 1e are made, for example, by plating. In many cases, the bumps 1e are made of, for example, gold (Au).

Thus, a plurality of the bumps 1e is formed on the back surface 8b of the wafer 8. Since the bumps 1e are formed on the ends of the through-electrodes 1c exposed from the back surface 8b of the wafer 8, respectively, the electrode pitch between the bumps 1e is equal to that of the through-electrodes 1c. On the surface and back surface of the wafer 8, the electrode pitch between the copper post bumps 5 and the electrode pitch between the bumps 1e (through-electrodes 1c) satisfy the following relationship: (the former electrode pitch)>(the latter electrode pitch).

In Modification Example 2 of Third Embodiment, simultaneously with the formation of the bumps 1e, a dicing pattern 1v corresponding to each chip region is formed on the back surface 8b of the wafer.

Next, a second probe test shown in FIG. 37 (Step S127) is conducted. In this step, tested is an electrical coupling state (conduction state) between the copper post bumps 5 and the bumps 1e. In this second probe test, conduction between the bumps 1e (electrodes) is checked while supporting the wafer 8 with the BG tape 21 attached to the wafer 8 and at the same time, electrically short-circuiting between the copper post bumps 5 (electrodes) with the conductive film member 20.

In short, the second probe test is conducted to determine whether each of the through-electrodes 1c formed in the wafer 8 (chip) is defective or non-defective. In other words, the second probe test is conducted in order to determine whether the conduction of each of the through-electrodes 1c is secured or not or whether the through-electrodes 1c which should not essentially be electrically short-circuited are short-circuited or not.

Short-circuiting between the copper post bumps 5 is achieved by bringing the conductive film member 20 into contact with the copper post bumps 5 so as to electrically couple the copper post bumps 5 to each other.

The purpose of the second probe test is similar to that described in First Embodiment so that description of it is omitted.

Next, dicing as shown in Step S128 of FIG. 38 is conducted. In this step, a plurality of non-defective semiconductor chips (meaning logic chips 1) is obtained by dicing the wafer 8 supported by the BG tape 21 from the side of the back surface 8 without using a dicing tape. In other words, dicing is conducted from the side of the back surface 8b of the wafer 8 while supporting the wafer by the BG tape 21 without using a dicing tape. Dicing is conducted from the side of the back surface 8b (from the side of the end of the through-electrode 1c) with the dicing pattern 1v formed on the back surface 8b as a mark.

By using the BG tape 21 instead of the dicing tape, it becomes unnecessary to replace the BG tape 21, which has been attached to the wafer 8, with the dicing tape so that damage of the wafer 8 which will otherwise be caused by the replacement can be prevented or reduced. Moreover, the replacement work with the dicing tape prior to dicing is not necessary so that the working time can be reduced.

Next, flip chip packaging is conducted. Steps of Modification Example 2 of Third Embodiment from the flip chip packaging to the completion of the fabrication of the semiconductor device are similar to the steps of First Embodiment from the flip chip packaging (FIG. 18) in Step 13 to the operation test of Step S16 (FIG. 21) so that the overlapping description of them is omitted.

The method of manufacturing the semiconductor device according to Modification Example 2 of Third Embodiment makes it possible to prevent or reduce the damage of the wafer 8 at the time of replacement since the replacement of the BG tape 21, which has been attached to the wafer, with the dicing tape becomes unnecessary by using the BG tape 21 instead of the dicing tape. Moreover, the replacement work with the dicing tape prior to dicing is not necessary so that the working time can be reduced.

In addition, using the BG tape 21 instead of the carrier facilitates the attachment or detachment work and can simplify it compared with the attachment or detachment work of the carrier.

Fourth Embodiment

Figure 39:
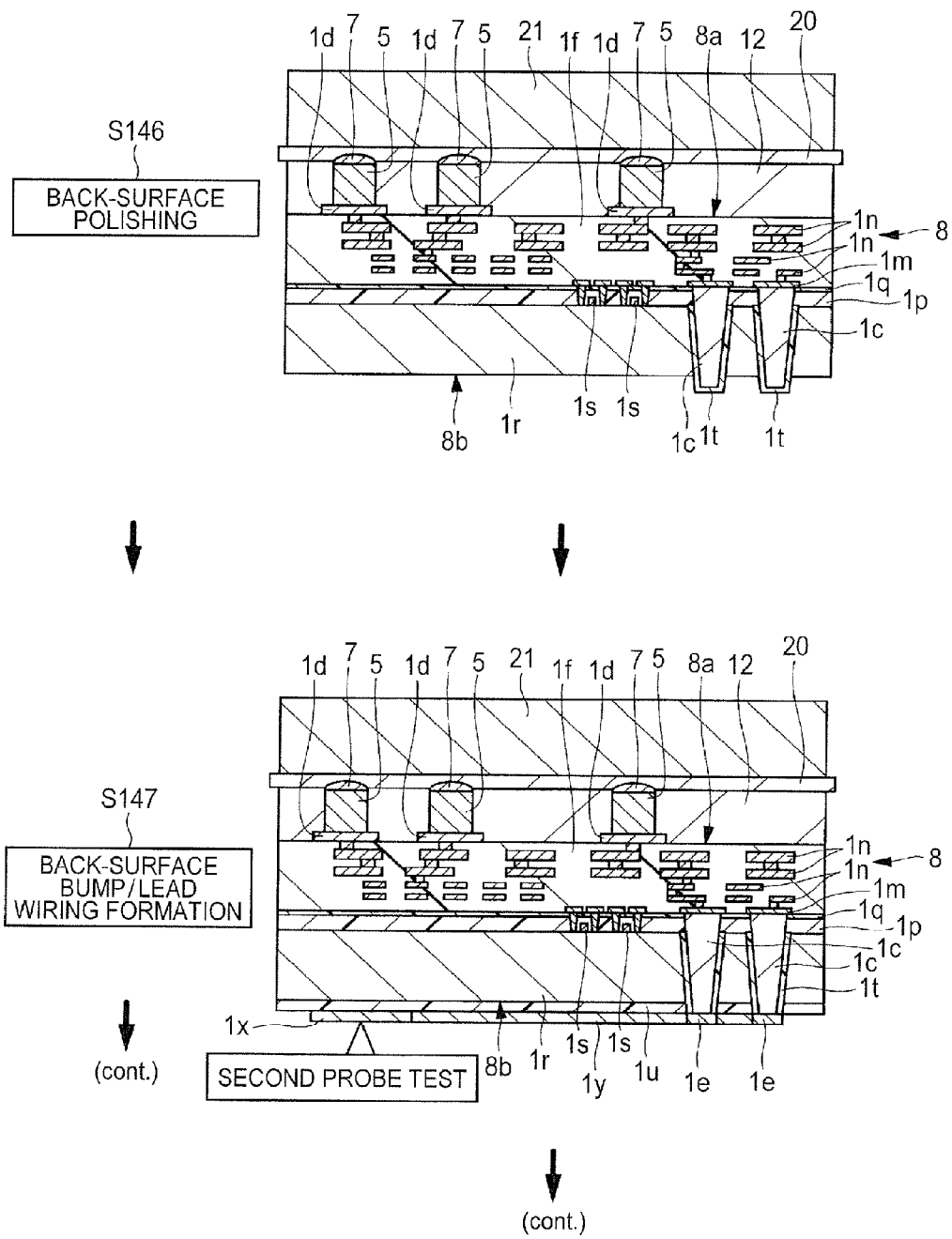
FIG. 39 includes partial cross-sectional views respectively showing examples of the structure after back-surface polishing and that after back-surface bump/lead wiring formation in the fabrication of a semiconductor device according to Fourth Embodiment.
Figure 40:
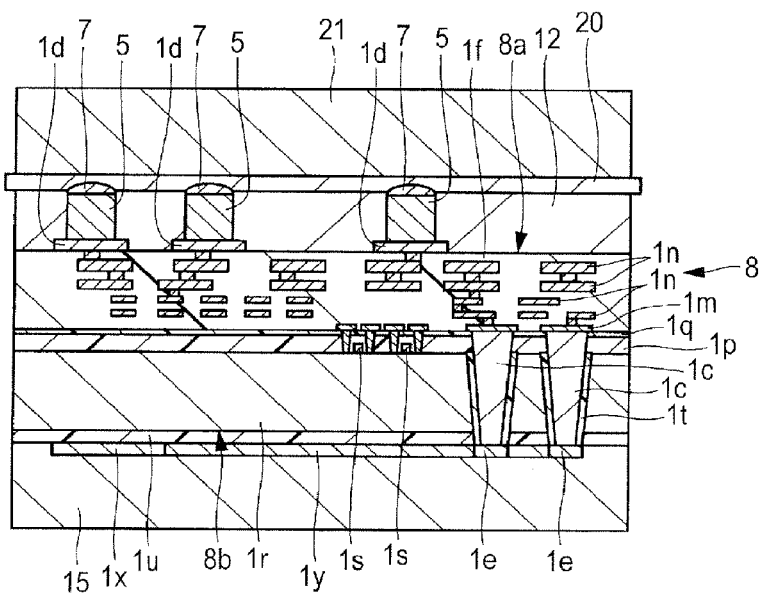
FIG. 40 is a partial cross-sectional view showing one example of the structure after tape attachment in the fabrication of the semiconductor device according to Fourth Embodiment.
Figure 41:
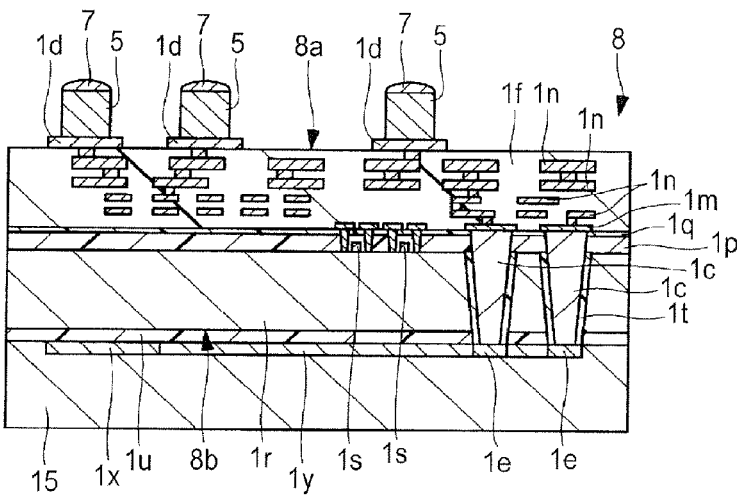
FIG. 41 is a partial cross-sectional view showing one example of the structure after BG tape detachment in the fabrication of the semiconductor device according to Fourth Embodiment.
Figure 42:
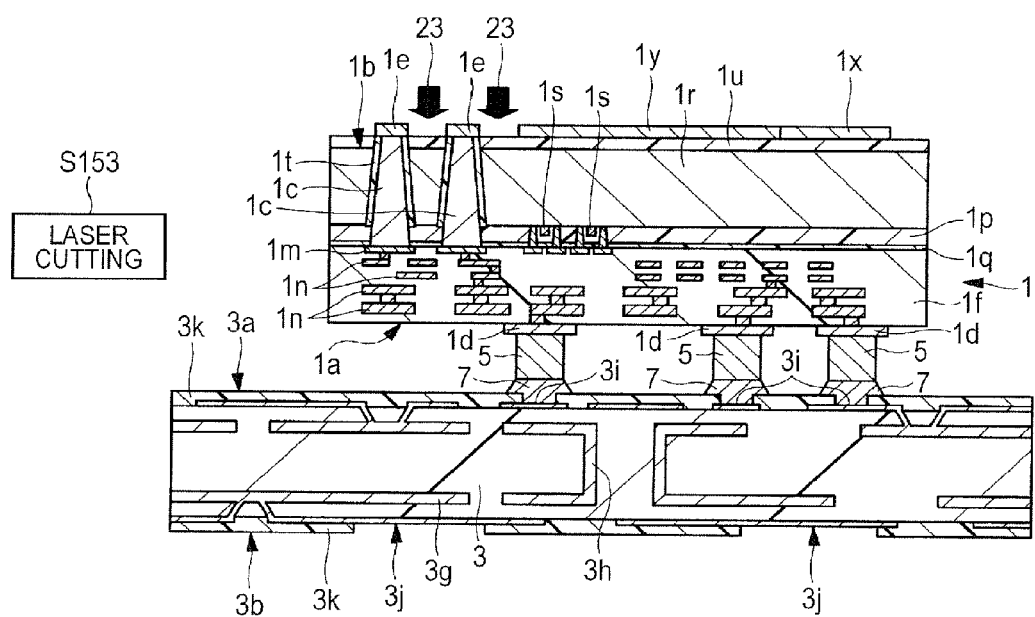
FIG. 42 is a partial cross-sectional view showing one example of the structure after laser cutting in the fabrication of the semiconductor device according to Fourth Embodiment.
Figure 43:
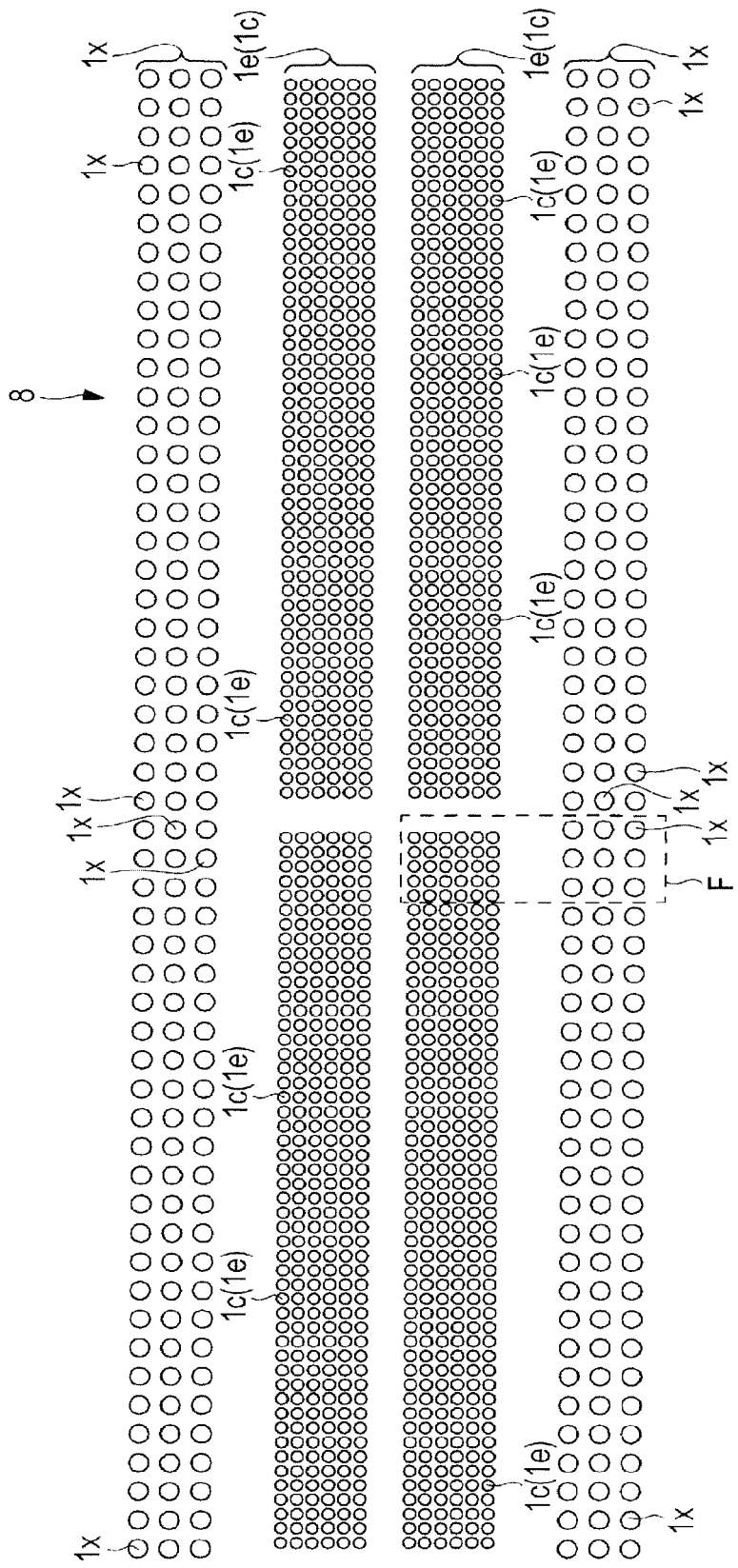
FIG. 43 is a plan view showing one example of electrode arrangement on the back surface of a semiconductor substrate to be used for the fabrication of the semiconductor device according to Fourth Embodiment.
Figure 44:
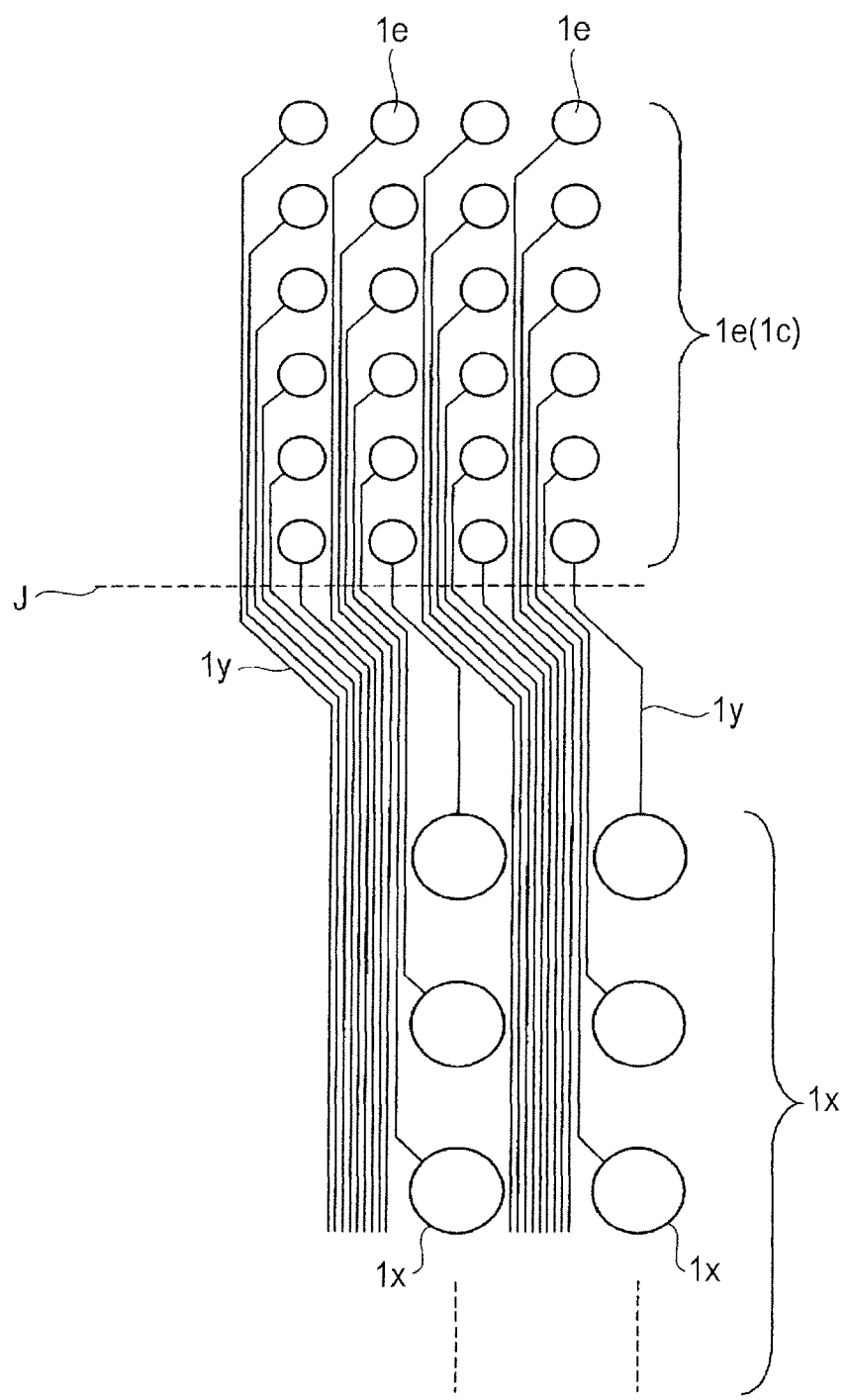
FIG. 44 is an enlarged partial plan view showing a laser cut position in Portion F of FIG. 43 in Modification Example 1.
Figure 45:
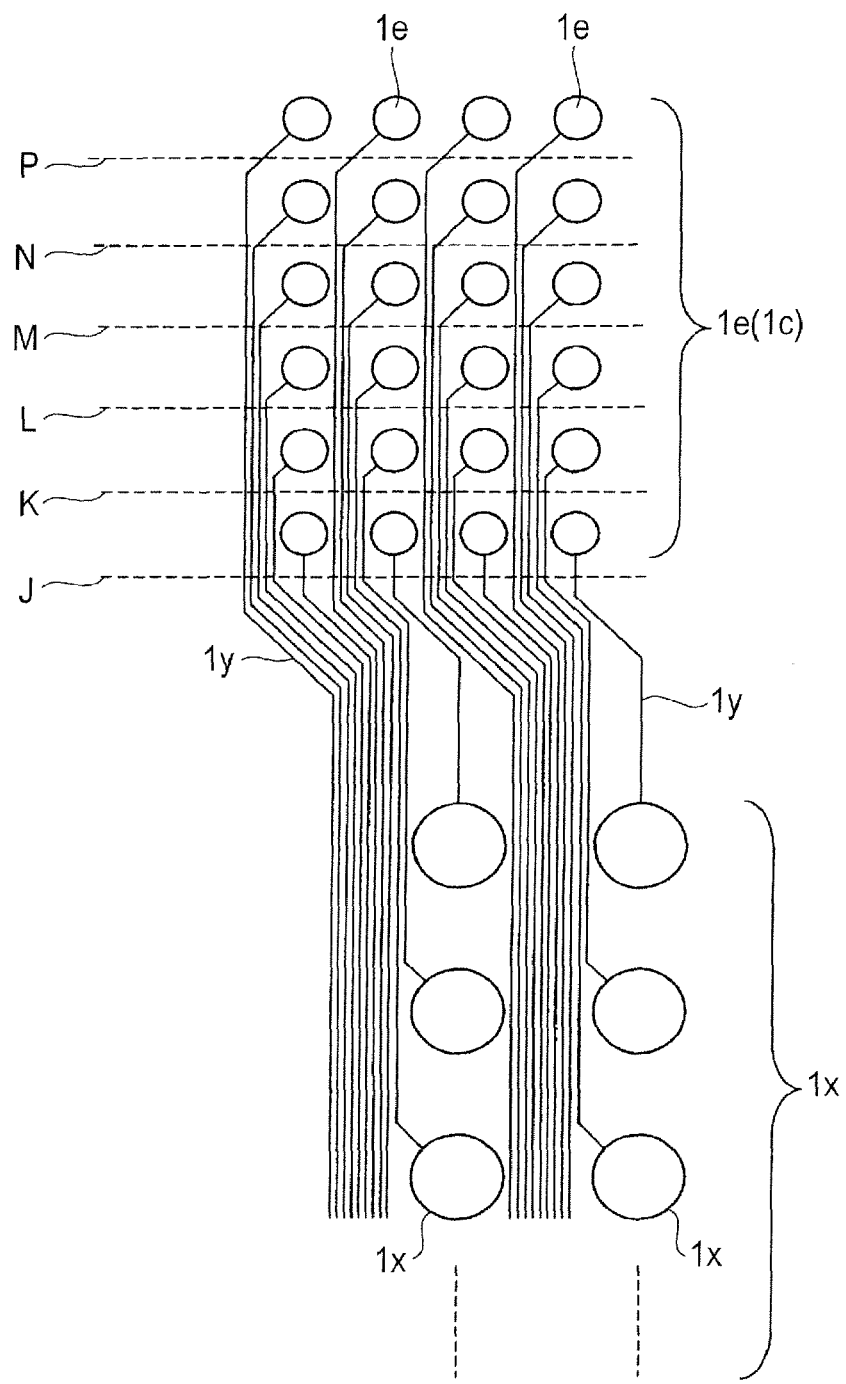
FIG. 45 is an enlarged partial plan view showing a laser cut position in Portion F of FIG. 43 in Modification Example 2.

FIG. 39 includes partial cross-sectional views respectively showing examples of the structure after back-surface polishing and that after back-surface bump/lead wiring formation in the fabrication of a semiconductor device according to Fourth Embodiment; FIG. 40 is a partial cross-sectional view showing one example of the structure after tape attachment in the fabrication of the semiconductor device according to Fourth Embodiment; and FIG. 41 is a partial cross-sectional view showing one example of the structure after BG tape detachment in the fabrication of the semiconductor device according to Fourth Embodiment. FIG. 42 is a partial cross-sectional view showing one example of the structure after laser cutting in the fabrication of the semiconductor device according to Fourth Embodiment; FIG. 43 is a plan view showing one example of electrode arrangement on the back surface of a semiconductor substrate to be used for the fabrication of the semiconductor device of Fourth Embodiment; FIG. 44 is an enlarged partial plan view showing a laser cut position in Portion F of FIG. 43 in Modification Example 1; and FIG. 45 is an enlarged partial plan view showing a laser cut position in Portion F of FIG. 43 in Modification Example 2.

The semiconductor device of Fourth Embodiment is a BGA 6 similar to that of First Embodiment. This means that the EGA 6 of Fourth Embodiment is a chip stacked type semiconductor device obtained by stacking a plurality of semiconductor chips on the package substrate 3.

The structure of the BGA 6 of Fourth Embodiment is similar to the BGA 6 of First Embodiment so that the overlapping description of it is omitted.

Next, a method of manufacturing the semiconductor device according to Fourth Embodiment will be described.

The main characteristic of the method of manufacturing the semiconductor device according to Fourth Embodiment is that the second probe test is conducted by using a BG tape instead of a carrier while supporting the wafer with the BG tape and at the same time, the second probe test is conducted by bringing a probe into contact with a test pad which is formed, at the time of forming a back-surface bump, on the back surface of the wafer so as to electrically couple it to the bump.

Steps from Step S141 (element formation) to Step S145 (tape attachment) in the method of manufacturing the semiconductor device according to Fourth Embodiment are similar to the steps of Third Embodiment from Step S81 (element formation) to Step S85 (tape attachment in FIG. 32) so that the overlapping description of them is omitted.

First, the steps from Step S141 to Step S145 are conducted to create a state in which the side of the surface 8a of the wafer 8 has been attached to the BG tape 21 via an adhesive 12 so as to bring the conductive film member 20 and each of the copper post bumps 5 into contact with each other via the solder 7 as shown in FIG. 39.

By this step, the copper post bumps 5 formed on the surface 8a of the wafer 8 are electrically coupled to each other (electrically short-circuited) via the conductive film member 20.

The adhesive 12 used here is, for example, an organic adhesive. The adhesive is not limited to it and a conductive adhesive or the like may be used instead.

Next, back-surface polishing (grinding, back grinding) as shown in Step S146 of FIG. 39 is conducted. In this step, the back surface (second surface) 8b of the wafer 8 on the side opposite to the surface 8a is polished (ground, back ground) to expose the end (a portion) of the through-electrodes 1c formed in advance, while attaching the BG tape 21 to the side of the surface 8a of the wafer 8. The polishing employed at this time is, for example, polishing, chemical etching, or the like.

Next, back-surface bump/lead wiring formation as shown in Step S147 is conducted. First, in this step, an insulating film 1u is formed around the end of the through-electrodes 1c exposed from the back surface 8b of the wafer 8. This insulating film 1u is, for example, an $SiO_2$ (also including TiN) film. Then, bumps (second electrodes) 1e are formed, respectively, on, the ends of the through-electrodes 1c exposed from the side of the back surface 8b. The bumps 1e are made, for example, by plating. In many cases, the bumps 1e are made of, for example, gold (Au).

Thus, a plurality of the bumps 1e is formed on the back surface 8b of the wafer 8. Since the bumps 1e are formed on the ends of the through-electrodes 1c exposed from the back surface 8b of the wafer 8, the electrode pitch between the bumps 1e is equal to that between the through-electrodes 1c. On the surface and back surface of the wafer 8, therefore, the electrode pitch between the copper post bumps 5 and the electrode pitch between the bumps 1e (through-electrodes 1c) satisfy the following relationship: (the former electrode pitch)>(the latter electrode pitch).

Further, simultaneously with the formation of the respectively bumps (second electrodes) 1e on the ends of the through-electrodes 1c exposed from the back surface 8b of the wafer 8, a plurality of test pads (third electrodes) 1x electrically coupled to the through-electrodes 1c via these bumps 1e, respectively, and having an electrode pitch greater than that of the electrode pitch between the through-electrodes 1c is formed. A plurality of lead wirings (rewirings) 1y which couple the bumps 1e and the test pads 1x to each other are also formed.

This means that on the back surface 8b of the wafer 8, the test pads 1x are electrically coupled to the bumps 1e via a plurality of the lead wirings 1y. The bumps 1e, the test pads 1x, and the leads wirings 1y are formed, for example, by photolithographic processing.

As a result, the wafer 8 has, on the back surface 8b thereof, a plurality of the bumps 1e and a plurality of the test pads 1x to be electrically coupled to these bumps 1e via the lead wirings 1y. The test pads 1x are electrodes led from each of the bumps 1e via the lead wiring 1y and having therefore a widened electrode pitch. The electrode pitch between the test pads 1x is therefore greater than the electrode pitch between the bumps 1e (through-electrodes 1c).

As a result, even if the electrode pitch between the bumps 1e is narrow and probing to the bump 1e is therefore difficult, it is possible to easily conduct an electrical test (meaning the second probe test) by probing to the test pad 1x having a widened electrode pitch.

In addition, since the second probe test is conducted not by probing to the bump 1e but by probing to the test pad 1x, it is possible to prevent the bumps 1e from being damaged by probing. In other words, it is preferred not to damage the bumps 1e on the through-electrodes 1c because the logic chip 1 is electrically coupled to the memory chip 2 via the bumps 1e during chip stacking. Probing to the test pad 1x can therefore enhance the reliability of electrical coupling to the memory chip 2 via the bumps 1e.

The bumps 1e are each formed on the ends of the through-electrodes 1c exposed from the back surface 8b of the wafer 8 so that the electrode pitch between the bumps 1e is equal to the pitch between the through-electrodes 1c.

Next, the second probe test as shown in FIG. 39 (Step S147) is conducted. In Fourth Embodiment, as described above, the bumps 1e and the test pads 1x are electrically coupled to each other via the lead wirings 1y. In the second probe test, therefore, an electrical coupling state (conduction state) between the copper post bumps 5 and the bumps 1e is tested by probing to each of the test pads 1x (electrodes).

The purpose of the second probe test is similar to that described above in First Embodiment so that the overlapping description of it is omitted.

Next, tape attachment as shown in Step S148 of FIG. 40 is conducted. In this step, the side of the back surface (second surface) 8b of the wafer 8 which has finished the second probe test is attached to a dicing tape 15.

Next, detachment of the BG tape as shown in Step S149 of FIG. 41 is conducted. In this step, on the side of the surface 8a of the wafer 8, the BG tape 21 is detached and removed and at the same time, the adhesive 12 is removed.

Next, dicing is conducted. The steps of Fourth Embodiment from dicing to flip chip packaging are similar to the steps of First Embodiment from dicing (FIG. 17) of Step S12 to flip chip packaging (FIG. 18) in Step S13 so that the overlapping description of them is omitted.

Next, an open/short test is conducted in a similar manner to that as shown in Step 14 (FIG. 19) of First Embodiment. In this step, as shown in FIG. 19, conduction between the bumps (second electrodes) 1e on the side of the back surface (upper surface) 1b of the logic chip 1 is checked while electrically short-circuiting between the lands 3j on the side of the lower surface 3b of the package substrate 3. For example, the lands 3j on the side of the lower surface 3b of the package substrate 3 are short-circuited by a conductive sheet 16 and by supporting the resulting package substrate 3 with a probe carrier 17 and at the same time, conducting evacuation via a vacuum adsorption hole 17a provided in the probe carrier 17, the package substrate 3 is supported. Further, in Fourth Embodiment, a third probe test is conducted under such a state by probing to the test pads 1x as shown in FIG. 41 formed on the back surface 1b of the logic chip 1.

By this third probe test, whether the electrical coupling state between the logic chip 1 and the package substrate 3 is good or bad is determined. More specifically, the coupling state between each of the copper post bumps 5 of the logic chip 1 and each of the lands 3i of the package substrate 3 is checked.

The importance of the third probe test is similar to that described in First Embodiment so that the description of it is omitted.

The third probe test is not essential. When the coupling yield between the logic chip 1 and the package substrate 3 is stable, it is not always necessary to conduct the third probe test.

Next, laser cutting as shown in Step S153 of FIG. 42 is conducted. In this step, the bumps 1e (through-electrodes 1c)

are electrically separated from the test pads 1x corresponding thereto by exposing them to laser 23 to cut the wirings (lead wirings 1y).

The cutting position on the wiring when the wirings (lead wirings 1y) are cut using the laser 23 will next be described.

FIG. 43 shows electrode arrangement on the back surface side of the wafer 8 in which a plurality of the bumps 1e and a plurality of the test pads 1x are arranged in lattice form at respectively different pitches. FIG. 44 shows Modification Example 1 in which Portion F of FIG. 43 is enlarged to show a cutting position of the wirings on the back surface side of the wafer 8. In Modification Example 1 of FIG. 44, the bumps 1e (through-electrodes 1c) and the test pads 1x are electrically coupled to each other with the lead wirings 1y. These lead wirings 1y are cut with laser collectively at a position of Dotted line J.

Described specifically, in a region between a group of the bumps 1e and a group of the test pads 1x each arranged in lattice form, at a position (position of Dotted line J) closer to the group of the bumps 1e than the group of the test pads 1x, the lead wirings 1y are cut collectively substantially along a row of the bumps of a direction crossing the extending direction of the lead wirings y.

Modification example 1 of FIG. 44 makes it possible to decrease the time dedicated to the cutting treatment of the lead wirings 1y and simplify the cutting step of the lead wirings 1y by cutting the lead wirings 1y collectively with laser.

FIG. 45, on the other hand, shows Modification Example 2 in which Portion F of FIG. 43 is enlarged to show the cutting position of the wirings on the back surface side of the wafer 8. In this example, the bumps 1e are divided into small groups, for example, by rows and laser cutting is conducted for each of the small groups (laser cutting is conducted at respective positions of Dotted lines J, K, L, M, N, and P).

Described specifically, in the bumps 1e arranged in lattice form, at positions between two rows of the bumps adjacent to each other (at positions of Dotted lines K, L, M, N, and P), the lead wirings 1y are cut substantially along the rows of the bumps so as to divide them into individual rows of the bumps of a direction crossing the extending direction of the lead wirings 1y. At this time, among these rows of the bumps, with regard to the row of the bumps closest to the group of the test pads 1x, a plurality of the lead wirings 1y is cut in a region between the row of the bumps and the row of the test pads 1x adjacent thereto at a position closer to the group of the bumps 1e than the group of the test pads 1x (at the position of Dotted line J) substantially along the row of the bumps of the direction crossing the extending direction of the lead wirings 1y. In short, in Modification Example of FIG. 45, each row is cut at a position closer to the bumps 1e (through-electrodes 1c) than the test pads 1x on the lead wirings 1y.

By cutting the lead wirings 1y at a position closer to the bumps 1e (through-electrodes 1c) than the test pads 1x in such a manner, deterioration in electrical properties due to an increase in wiring capacitance can be prevented. Moreover, it is possible to prevent the wirings which have been still coupled to the bumps 1e from serving as an antenna to easily pick up noises.

Step S154 (chip stacking) and Step S155 (operation test) in the method of manufacturing the semiconductor device according to Fourth Embodiment are similar to Step S15 (chip stacking) and Step S16 (operation test) in First Embodiment so that the overlapping description of them is omitted.

The method of manufacturing the semiconductor device according to Fourth Embodiment facilitates probing to the test pads 1x because the electrode pitch between the test pads 1x is greater than the electrode pitch between the bumps 1e. As a result, electrical tests (second and third probe tests) can be conducted readily. Moreover, since the electrical tests are conducted not by probing to the bumps 1e but by probing to the test pads, it is possible to prevent the bump 1e from being damaged or the bumps 1e from being broken due to probing. As described above, the logic chip 1 and the memory chip 2 are electrically coupled to each other via the bumps 1e at the time of chip stacking so that it is preferred not to damage the bumps 1e on the through-electrode 1c. Accordingly, probing not to the bumps 1e but to the test pads 1x as in Fourth Embodiment can enhance the reliability of electrical coupling with the memory chip 2 via the bump 1e. Further, it can improve the packaging reliability in chip stacking.

The invention made by the present inventors has been described specifically based on some embodiments. It should however be borne in mind that the invention is not limited to or by these embodiments. It is needless to say that the invention can be changed in various ways without departing from the gist of the invention.

For example, in any of Embodiments and Modification Examples, the step of forming through-electrodes in each wafer may be conducted prior to element formation, after element formation and prior to wiring formation step, or after element formation and wiring formation.

In any of Embodiments and Modification Examples, a support member of a wafer may be either a carrier or a BG tape.

In any of Embodiments and Modification Examples, short-circuiting between copper post bumps or between pads at the time of the second probe test may be achieved using a conductive film by sputtering, a conductive film member provided on a carrier or BG tape, or a conductive adhesive.

Main characteristics, among characteristics described so far in First to Fourth Embodiments (including Modification Examples), can be used in combination.

In First to Fourth Embodiments (including Modification Examples), description was made with the BGA as an example of a semiconductor device, but the semiconductor device may be not only BGA but also, for example, LGA (land grid array) insofar as it has a structure obtained by stacking a plurality of semiconductor chips on a wiring substrate.

What is claimed is:

1. A method of manufacturing a semiconductor device, comprising the steps of:
   (a) providing a semiconductor wafer, the semiconductor wafer having a first surface over which a first pad and a second pad are formed and a second surface over which a first terminal, a second terminal and a third terminal are formed opposite the first surface,
   (b) testing an electrically coupling state between the pads and the terminals,
   (c) dicing the semiconductor wafer,
   (d) mounting a semiconductor chip formed by step (c) over a wiring substrate,
   wherein the first pad is electrically connected with each of the first and second terminals via each of first and second through-electrodes in the semiconductor chip,
   wherein the second pad is electrically connected with the third terminal via a third through-electrode in the semiconductor chip, and
   wherein in the step (b), conduction between the terminals is checked while short-circuiting between the pads.

2. The method of manufacturing a semiconductor device according to claim 1, wherein the wiring substrate has the first main surface over which a plurality of first lands are formed, and wherein in the step (d), the semiconductor chip is mounted over the wiring substrate such that the first surface of the semiconductor chip faces the first main surface of the wiring substrate and such that the pads of the semiconductor chip are electrically connected with the first lands of the wiring substrate, respectively.

3. The method of manufacturing a semiconductor device according to claim 1, wherein a pitch between the first pad and the second pad is wider than a pitch between the first terminal and second terminal.

4. The method of manufacturing a semiconductor device according to claim 2, wherein the wiring substrate has a second main surface, opposite the first main surface, over which a plurality of second lands are formed, wherein the first lands of the wiring substrate are electrically connected with the second lands of the wiring substrate, respectively, and wherein after the step (d), conduction between the terminals is checked while electrically short-circuiting between the second lands of the wiring substrate.

5. The method of manufacturing a semiconductor device according to claim 3, wherein short-circuiting between the pads is achieved by providing a conductive film over the pads so as to electrically connect the pads to each other.

6. The method of manufacturing a semiconductor device according to claim 5, wherein the conductive film is a sputter film.

7. The method of manufacturing a semiconductor device according to claim 6, wherein the step (b) is conducted while attaching a support member to the semiconductor wafer.

8. The method of manufacturing a semiconductor device according to claim 7, wherein after the step (b) but before the step (c), the support member is removed from the semiconductor wafer.

9. The method of manufacturing a semiconductor device according to claim 8, wherein the support member is a glass carrier.

10. The method of manufacturing a semiconductor device according to claim 8, wherein the support member is a BG tape.

* * * * *